(12) United States Patent
Fujii et al.

(10) Patent No.: US 7,646,015 B2
(45) Date of Patent: Jan. 12, 2010

(54) MANUFACTURING METHOD OF SEMICONDUCTOR DEVICE AND SEMICONDUCTOR DEVICE

(75) Inventors: Gen Fujii, Kanagawa (JP); Erika Takahashi, Kanagawa (JP)

(73) Assignee: Semiconductor Energy Laboratory Co., Ltd., Atsugi-shi, Kanagawa-Ken (JP)

( * ) Notice: Subject to any disclaimer, the term of this patent is extended or adjusted under 35 U.S.C. 154(b) by 173 days.

(21) Appl. No.: 11/923,349

(22) Filed: Oct. 24, 2007

(65) Prior Publication Data

US 2008/0099759 A1 May 1, 2008

(30) Foreign Application Priority Data

Oct. 31, 2006 (JP) ............................. 2006-295423

(51) Int. Cl.
*H01L 51/40* (2006.01)
(52) U.S. Cl. ............................. 257/40; 257/260; 438/82
(58) Field of Classification Search ................. 257/291, 257/290, 40; 438/160, 99
See application file for complete search history.

(56) References Cited

U.S. PATENT DOCUMENTS

| | | | |
|---|---|---|---|
| 5,696,011 A | 12/1997 | Yamazaki et al. | |
| 5,852,488 A * | 12/1998 | Takemura | ................... 349/187 |
| 6,337,731 B1 | 1/2002 | Takemura | |
| 6,399,257 B1 | 6/2002 | Shirota et al. | |
| 2003/0038912 A1* | 2/2003 | Broer et al. | ................. 349/122 |
| 2005/0196710 A1 | 9/2005 | Shiroguchi | |
| 2005/0221203 A1 | 10/2005 | Fujii | |

FOREIGN PATENT DOCUMENTS

JP          2000-133636          5/2000

* cited by examiner

*Primary Examiner*—Brook Kebede
*Assistant Examiner*—Mark A Laurenzi, III
(74) *Attorney, Agent, or Firm*—Nixon Peabody, LLP; Jeffrey L. Costellia

(57) ABSTRACT

A method of manufacturing a semiconductor device includes steps of forming a gate electrode over a light-transmitting substrate, forming a gate insulating layer containing an inorganic material over the gate electrode and the substrate, forming an organic layer containing a photopolymerizable reactive group over the gate insulating layer, polymerizing selectively the organic layer by irradiating the organic layer with light from back side of the substrate, using the gate electrode as a mask, forming an organic polymer layer by removing a residue of the organic layer, being other than polymerized, forming an organosilane film including a hydrolytic group over the gate insulating layer in a region other than a region in which the organic polymer layer is formed, forming source and drain electrodes by applying a composition containing a conductive material over the organic polymer layer, and forming a semiconductor layer over the gate electrode, the source and drain electrodes.

7 Claims, 32 Drawing Sheets

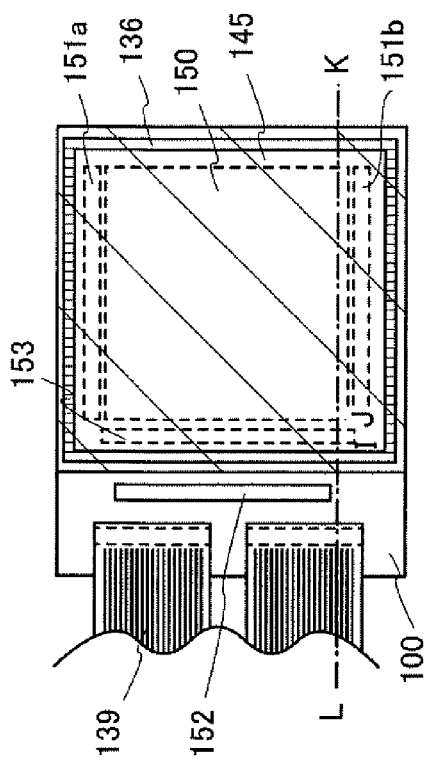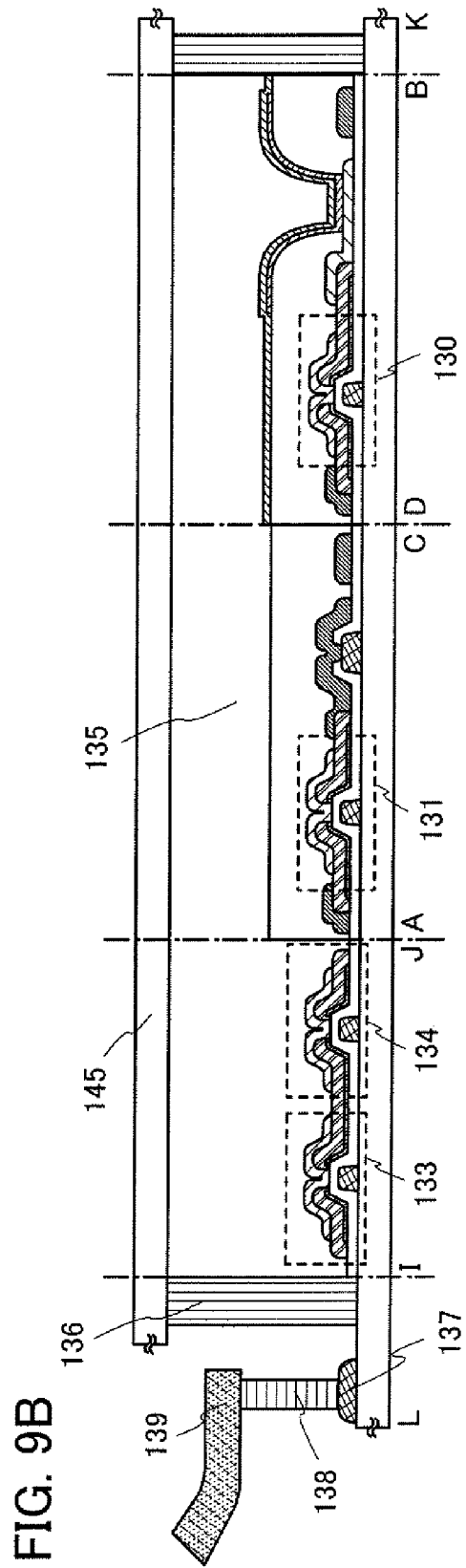
FIG. 9A
FIG. 9B

FIG. 17A
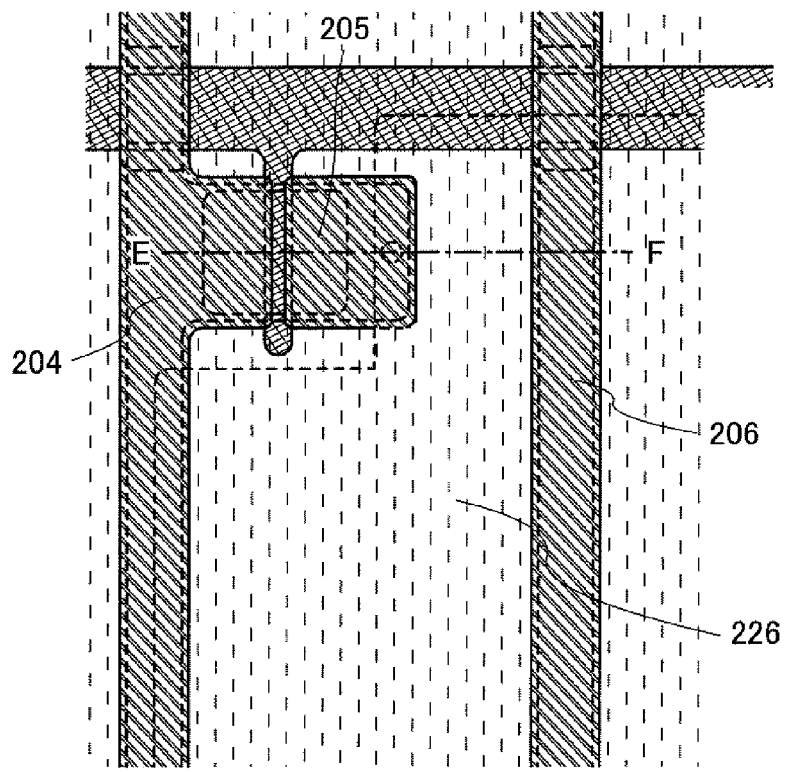
FIG. 17B
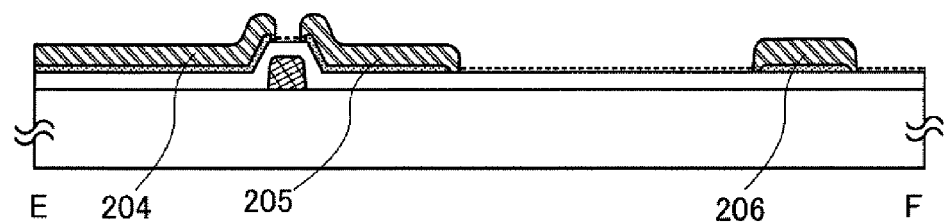

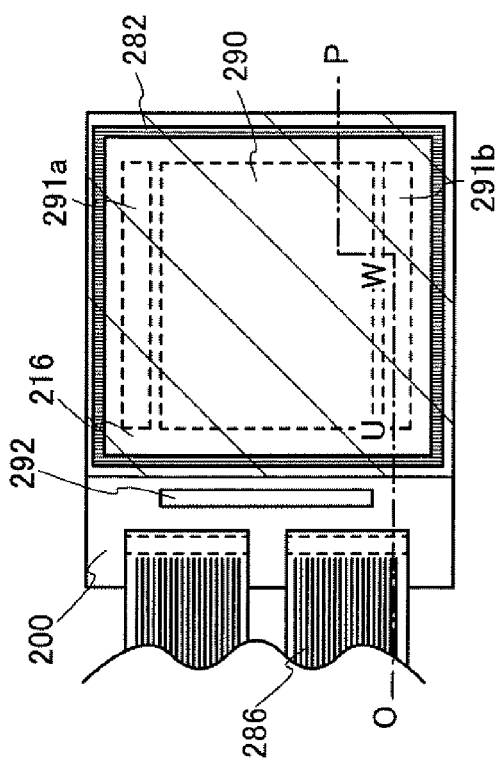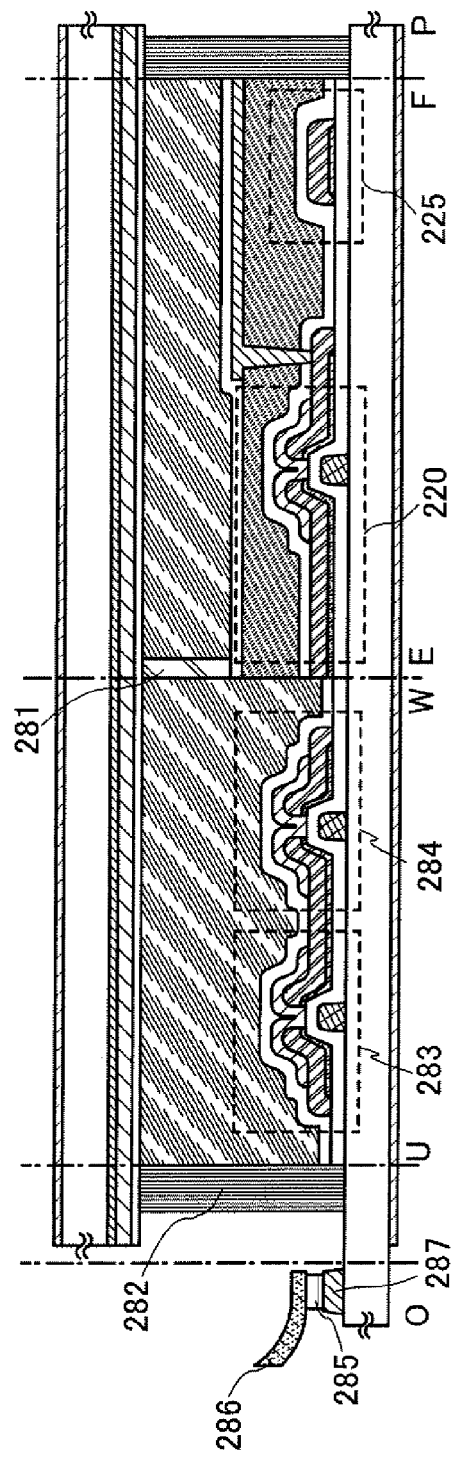
FIG. 19A
FIG. 19B

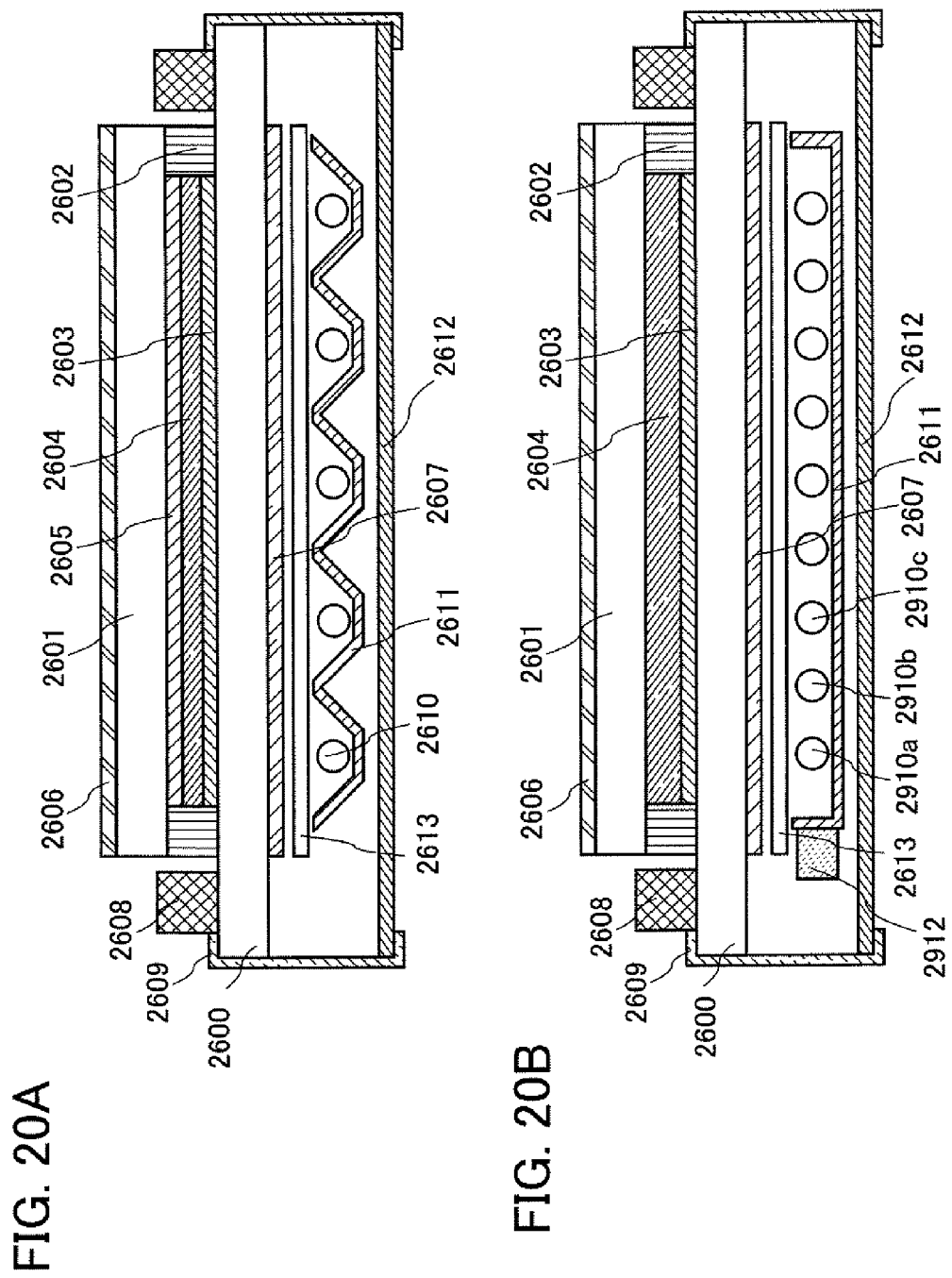

190

191

197

193

194

195

196

MANUFACTURING METHOD OF SEMICONDUCTOR DEVICE AND SEMICONDUCTOR DEVICE

BACKGROUND OF THE INVENTION

1. Field of the Invention

The present invention relates to a semiconductor device and a manufacturing method thereof using a printing method.

2. Description of the Related Art

In a thin film transistor (hereinafter also referred to as a TFT) and an electronic circuit using the thin film transistor, various thin films such as a semiconductor film, an insulating film, and a conductive film are stacked over a substrate, and they are appropriately formed into predetermined patterns by a photolithography technique. The photolithography technique is a technique in which a pattern of a circuit or the like which is formed using a material that does not transmit light over a transparent flat plate, which is referred to as a photomask, is transferred to an aimed substrate by using light. A photolithography technique is widely used in a manufacturing process of a semiconductor integrated circuit and the like.

The conventional manufacturing process using a photolithography technique requires multiple steps such as exposure, development, baking, and peeling only for treating a mask pattern formed by using a photosensitive organic resin material referred to as a photoresist. Therefore, the manufacturing cost is inevitably increased as the number of photolithography steps is increased. In order to solve this problem, it has been attempted to manufacture TFTs with lower number of photolithography steps (for example, see Patent Document 1: Japanese Published Patent Application No. 2000-133636). In Patent Document 1, a resist mask formed in a photolithography step is used once, and then reused as a resist mask having a different shape by being expanded in volume by swelling.

SUMMARY OF THE INVENTION

It is an object of the present invention to provide a technique which reduces the number of photolithography steps in a manufacturing process of a thin film transistor (TFT), an electronic circuit using the TFTs, or a semiconductor device or a display device including the TFTs, and simplifies the manufacturing process so that they can be manufactured with high yield even when a large substrate having a side of more than one meter is used.

In addition, it is another object of the present invention to provide a technique of manufacturing thin film transistors in a self-aligned manner so that a highly-reliable semiconductor device can be manufactured with high productivity.

In the present invention, an organic layer containing a photopolymerizable reactive group which becomes insoluble to a specific solvent (such as an organic solvent) by light irradiation is used and the organic layer containing a photopolymerizable reactive group is selectively polymerized to be processed into a desired shape by rear light-exposure so as to be an organic polymer layer. Difference in adsorption property for a liquid repellent between a gate insulating layer containing an inorganic material and the organic polymer layer are utilized to make wettability of the gate insulating layer and that of the organic polymer layer be different from each other. When a composition containing a conductive material is discharged in regions with thus controlled wettability, a source electrode layer and a drain electrode layer can be formed only over the organic polymer layer. In this manner, a thin film transistor can be manufactured in a self-aligned manner. Therefore, according to the present invention, a semiconductor device, a display device, and the like can be manufactured at low cost and with high productivity.

Note that in this specification, the term "semiconductor device" refers to a device which can be operated by utilizing semiconductor characteristics. A multilayer wiring layer and a semiconductor device such as a processor chip can be manufactured by using the present invention.

The present invention can also be applied to a display device having a display function. The display device using the present invention includes a light emitting display device, in which a TFT and a light emitting element having electrodes sandwiching a layer containing an organic substance, an inorganic substance, or a mixture of an organic substance and an inorganic substance which exhibits light emission referred to as electroluminescence (hereinafter also referred to as EL), a liquid crystal display device in which a liquid crystal element including a liquid crystal material is used as a light emitting element, and the like.

One method of manufacturing a semiconductor device of the present invention includes steps of forming a gate electrode layer over a light-transmitting substrate, forming a gate insulating layer containing an inorganic material over the gate electrode layer, forming an organic layer containing a photopolymerizable reactive group over the gate electrode layer, polymerizing selectively the organic layer containing a photopolymerizable reactive group by selectively irradiating the organic layer containing a photopolymerizable reactive group with light which passes through the light-transmitting substrate, using the gate electrode layer as a mask, forming an organic polymer layer by removing a region of the organic layer containing a photopolymerizable reactive group, which is other than a polymerized region, forming an organosilane film having a hydrolytic group over the gate insulating layer containing an inorganic material in a region other than a formation region of the organic polymer layer, forming a source electrode layer and a drain electrode layer by discharging a composition containing a conductive material over the organic polymer layer, and forming a semiconductor layer over the gate electrode layer, the source electrode layer, and the drain electrode layer.

One method of manufacturing a semiconductor device of the present invention includes steps of forming a gate electrode layer over a light-transmitting substrate, forming a gate insulating layer containing an inorganic material over the gate electrode layer, forming an organic layer containing a photopolymerizable reactive group over the gate electrode layer, polymerizing selectively the organic layer containing a photopolymerizable reactive group by selectively irradiating the organic layer containing a photopolymerizable reactive group with light which passes through the light-transmitting substrate, using the gate electrode layer as a mask, forming an organic polymer layer by removing a region of the organic layer containing a photopolymerizable reactive group, which is other than a polymerized region, forming a first organosilane film having a hydrolytic group over the gate insulating layer containing an inorganic material in a region other than a formation region of the organic polymer layer, forming a source electrode layer and a drain electrode layer by discharging a composition containing a conductive material over the organic polymer layer, removing the first organosilane film having a hydrolytic group, forming a second organosilane film having a hydrolytic group over the gate electrode layer, the source electrode layer, and the drain electrode layer, and forming a semiconductor layer over the second organosilane film having a hydrolytic group. Organosilane having a hydrolytic group can use organosilane having a hydrolytic group including a fluorocarbon group or an alkyl group as its end group.

A semiconductor device of the present invention includes a gate electrode layer over a substrate having an insulating surface, a gate insulating layer containing an inorganic material over the gate electrode layer, an organic polymer layer in a region which is over the gate insulating layer containing an inorganic material and which does not overlap with the gate electrode layer, a source electrode layer and a drain electrode layer over the organic polymer layer, and a semiconductor layer over the gate insulating layer containing an inorganic material, the source electrode layer, and the drain electrode layer.

A semiconductor device of the present invention includes a gate electrode layer over a substrate having an insulating surface, a gate insulating layer containing an inorganic material over the gate electrode layer, an organic polymer layer in a region which is over the gate insulating layer containing an inorganic material and which does not overlap with the gate electrode layer, an organic polymer layer in a region which is over the gate insulating layer containing the inorganic material and which does not overlap with the gate electrode layer, a source electrode layer and a drain electrode layer over the organic polymer layer, and a semiconductor layer over the gate insulating layer containing an inorganic material, the source electrode layer, and the drain electrode layer.

In the present invention, a source electrode layer and a drain electrode layer are formed in a self-aligned manner. Accordingly, a defective shape or the like due to misalignment of a mask does not occur and the source electrode layer and the drain electrode layer can be formed with good controllability. Therefore, a highly-reliable semiconductor device, display device, and the like can be manufactured with high yield according to the present invention.

BRIEF DESCRIPTION OF THE DRAWINGS

FIGS. 9A and 9B are views illustrating a display device of the present invention;

FIGS. 17A and 17B are views illustrating a manufacturing method of a display device of the present invention;

FIGS. 19A and 19B are views illustrating a display device of the present invention;

FIGS. 20A and 20B are cross-sectional views each illustrating a structural example of a liquid crystal display module of the present invention;

DETAILED DESCRIPTION OF THE INVENTION

Figure 1A:
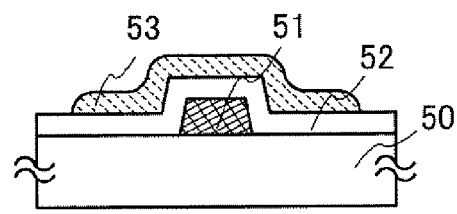
FIGS. 1A to 1E are conceptional views illustrating the present invention.

Embodiment Modes of the present invention are described in detail with reference to the accompanying drawings. Note that the present invention is not limited to the following description and it is easily understood by those skilled in the art that modes and details be modified in various ways without departing from the purpose and the scope of the present invention. Accordingly, the present invention should not be construed as being limited to the description of the embodiment modes given below. Note that in a structure of the present invention described below, like portions or portions having like functions in different drawings are denoted by the like reference numerals and repeated description thereof is omitted.

Embodiment Mode 1

An embodiment mode of the present invention is described with reference to FIGS. 1A to 1E. An object of this embodiment mode is to manufacture a highly-reliable thin film transistor in a self-aligned manner.

In this embodiment mode, an organic layer containing a photopolymerizable reactive group which becomes insoluble to an organic solvent by light irradiation is used and the organic layer containing a photopolymerizable reactive group is selectively processed into a desired shape by rear light-exposure so as to be an organic polymer layer. Difference in adsorption property for a liquid repellent between a gate insulating layer containing an inorganic material and the organic polymer layer is utilized to make wettability of the gate insulating layer and that of the organic polymer layer be different from each other. When a composition containing a conductive material is discharged in regions with thus controlled wettability, a source electrode layer and a drain electrode layer can be formed only over the organic polymer layer. In this manner, a thin film transistor can be manufactured in a self-aligned manner. Therefore, according to the present invention, a semiconductor device, a display device, and the like can be manufactured at low cost and with high productivity.

A gate electrode layer 51 is formed over a light-transmitting substrate 50. A gate insulating layer 52 is formed over the gate electrode layer 51. An organic layer 53 containing a photopolymerizable reactive group is formed over the gate insulating layer 52 overlapping with the gate electrode layer 51. The gate insulating layer 52 contains an inorganic material. The organic layer 53 containing a photopolymerizable reactive group is formed using a material which is cross-linked or polymerized and improves in insolubility to an organic solvent by being irradiated with light. The gate insulating layer may be a single or stacked layer, and the outermost surface is formed using a material to which organosilane having a hydrolytic group is easily adsorbed, and an inorganic film, such as a film of silicon oxide, silicon nitride, silicon nitride containing oxygen, silicon oxide containing nitrogen, or the like, or a material which contains an inorganic component, such as organopolysiloxane is used.

The organic layer containing a photopolymerizable reactive group may be formed of a material with which a light irradiation portion thereof becomes poorly soluble (difficult to be dissolved) in a specific solvent. A material which is polymerized by light irradiation can be used, for example, a photodimerization resin having a cinnamoyl group, a cinnamylidene group, a phenylenediacrylate group, or the like; a diazo-based compound, such as diazonium salt or diazoxide; a mixture of a resin having a hydroxyl group, such as polyvinyl alcohol, and a diazo-based compound; a monomer or an oligomer having a vinyl group, such as acrylate polymerized by light irradiation. In this specification, the term "polymerization" refers to bonding of at least two monomers, and the molecular weight is increased by polymerization. The polymerization includes a cross-linking reaction in which molecules are bonded to form a bridged shape. The organic polymer layer is a layer in which the organic layer containing a photopolymerizable reactive group is polymerized and increased in molecular weight. The organic polymer layer formed by a polymerization reaction has a cyclobutane ring and the like.

In this embodiment mode, a liquid composition containing polyvinylcinnamate is discharged by a droplet discharging method and is dried and baked to be solidified, so that the organic layer 53 containing a photopolymerizable reactive group is selectively formed (see FIG. 1A).

As a method by which an object can be selectively formed into a desired pattern, a droplet discharging (jetting) method (also referred to as an ink jet method depending on its system) in which a droplet of a composition which is mixed for a specific purpose is selectively discharged (jetted) to be formed into a predetermined pattern is used. Alternatively, a method by which an object can be transferred or drawn into a desired pattern, for example, various printing methods (a method by which an object can be formed into a desired pattern, such as screen (mimeograph) printing, offset (planography) printing, relief printing, or gravure (intaglio) printing), a dispenser method, or a selective coating method can be used.

This embodiment mode employs a method of discharging (ejecting) a composition containing a fluidized film-forming material (a conductive material or an insulating material) as a droplet so that a desired pattern can be formed, in a manufacturing process of a semiconductor device or a display device. A droplet containing the film-forming material is discharged to a region where the pattern is to be formed and is baked, dried, and the like to be fixed (or solidified), so that the film is formed into the desired pattern. When the organic layer 53 containing a photopolymerizable reactive group is selectively formed by a droplet discharging method as described in this embodiment mode, the manufacturing process is further simplified.

Figure 1B:
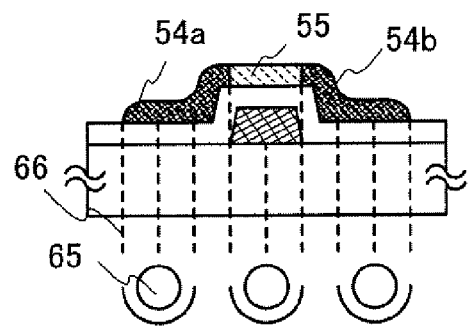

The organic layer 53 containing a photopolymerizable reactive group is irradiated with light 66 which is emitted from a light source 65 to the light-transmitting substrate 50 side and passes through the light-transmitting substrate 50 (see FIG. 1B). The light 66 passes through the light-transmitting substrate 50 and the gate insulating layer 52, but does not pass through and is blocked by the gate electrode layer 51, which has a non-light transmitting property. Therefore, in the organic layer 53 containing a photopolymerizable reactive group, a region overlapping with the gate electrode layer 51 becomes a light-unexposed region 55, and the organic layer containing a photopolymerizable reactive group in light-exposed regions 54a and 54b is modified by light. In this embodiment mode, the organic layer containing a photopolymerizable reactive group in the light-exposed regions 54a and 54b are cross-linked or polymerized so as to be poorly soluble in an organic solvent. The light 66 may be light with a wavelength and intensity which polymerize the organic layer containing a photopolymerizable reactive group, and ultraviolet light with a wavelength of 300 nm to 350 nm is used in this embodiment mode.

The organic layer containing a photopolymerizable reactive group in the light-unexposed region is removed with an organic solvent. As the organic solvent, one which can selectively dissolve only the light-unexposed region without dissolving the light-exposed region is selected. In this embodiment mode, the organic layer containing a photopolymerizable reactive group is immersed in dimethylformamide to form organic polymer layers 57a and 57b.

Figure 1C:
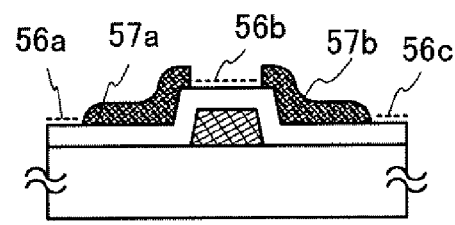

Then, liquid-repellent treatment is performed with organosilane having a hydrolytic group in order to control wettability. In this embodiment mode, hexamethyldisilazane (HMDS) is used as organosilane having a hydrolytic group. As organosilane films 56a, 56b, and 56c having a hydrolytic group, organosilane having a hydrolytic group is adsorbed to the gate insulating layer containing an inorganic material more closely than to the organic polymer layer (see FIG. 1C). Organosilane having a hydrolytic group has a liquid-repellent property against a composition containing a conductive material, which is a material for forming a source electrode layer and a drain electrode layer; therefore, the surface of the gate insulating layer, to which organosilane having a hydrolytic group is closely adsorbed, has low wettability with respect to the composition containing a conductive material than surfaces of the organic polymer layers 57a and 57b. In FIG. 1C, the organosilane films 56a, 56b, and 56c having a hydrolytic group over the gate insulating layer are denoted by dotted lines in order to show that the organosilane having a hydrolytic group is closely adsorbed to the gate insulating layer.

Before the formation of the organosilane film having a hydrolytic group, ultraviolet ozone treatment, oxygen ($O_2$) ashing, or the like is preferably performed. By ultraviolet ozone treatment or oxygen ($O_2$) ashing, an organic substance over the gate insulating layer is decomposed, organosilane having a hydrolytic group is easily adsorbed over the gate insulating layer, and a hydroxyl group is introduced to the organic polymer layer so that wettability of the organic polymer layer can be enhanced.

The difference of wettability between the regions is relative. It is only necessary that the wettability with respect to the composition containing a conductive material forming the source electrode layer and the drain electrode layer differ between a formation region of the source electrode layer and the drain electrode layer and a region therearound. Regions having different wettability have different contact angles of the composition containing a conductive material. A region with a large contact angle of the composition containing a conductive material is a region having low wettability (hereinafter, referred to as a low wettability region), whereas a region having a small contact angle of the composition containing a conductive material is a region having high wettability (hereinafter, referred to as a high wettability region). This is because, in a region with a large contact angle, a liquid composition having fluidity does not spread over a surface of the region and is repelled and the surface is not wetted, whereas in a region with a small contact angle, a composition having fluidity spreads over the surface and the surface is well wetted. Therefore, the regions having different wettability have different surface energy. The surface energy of the region having low wettability is low and the surface energy of the region having high wettability is high. In the present invention, the contact angles between two regions having different wettability differ by 30° or more, preferably, 40° or more.

The organosilane having a hydrolytic group is expressed by the chemical formula: $R_n$—Si—$X_{(4-n)}$ (wherein n=1, 2, 3) or $R_3$—Si—NR—S—$R_3$. In the formula, R represents a substance having a relatively inactive group such as an alkyl group, and X includes a hydrolytic group which can be bonded by condensation of a hydroxyl group or adsorbed water on a base material surface, such as halogen, a methoxy group, an ethoxy group, or an acetoxy group.

As a typical example of organosilane having a hydrolytic group, an organosilane having a fluorine-based hydrolytic group which has a fluoroalkyl group for R, (fluoroalkylsilane (hereinafter also referred to as FAS)), can be used. R in FAS has a structure expressed by $(CF_3)(CF_2)_x(CH_2)_y$ (wherein x is an integer of 0 or more and 10 or less, and y is an integer of 0 or more and 4 or less) and when a plurality of Rs or Xs are bonded with Si, the Rs or Xs may be the same or different. The following can be given as typical FAS: fluoroalkylsilane, such as heptadecafluorotetrahydrodecyltriethoxysilane, heptadecafluorotetrahydrodecyltrichlorosilane, tridecafluorotetrahydrooctyltrichlorosilane, or trifluoropropyltrimethoxysilane.

Needless to say, a substance of organosilane having a hydrolytic chain which does not have a fluorocarbon group but has an alkyl group in R may alternatively be used. Octadecyltrimethoxysilane or the like can be used, for example.

As a solvent for organosilane having a hydrolytic group, a hydrocarbon-based solvent, such as n-pentane, n-hexane, n-heptane, n-octane, n-decane, dicyclopentane, benzene, toluene, xylene, durene, indene, tetrahydronaphthalene, decahydronaphthalene, or squalene; tetrahydrofuran; or the like can be used.

A droplet containing the conductive material is discharged through a nozzle of a droplet discharging apparatus 67 to the region where the source electrode layer and the drain electrode layer are to be formed, that is, the organic polymer layers 57a and 57b. The droplet which is discharged is not attached to the organosilane films 56a, 56b, and 56c having a hydrolytic group over the gate insulating layer, which are the low wettability regions, and are attached to the organic polymer layers 57a and 57b, which are high wettability regions with higher wettability than the low wettability region. Even if the discharging method of the conductive material cannot be precisely controlled depending on a size, scanning capability, or the like of a discharge outlet of the nozzle through which the droplet is discharged; by the liquid-repellent treatment for the region other than the region where the source and drain electrode layers are to be formed, the droplet is attached only to the region where the source and drain electrode layers are to be formed, so that source and drain electrode layers 58a and 58b are formed into a desired pattern (see FIG. 1D). This is because the region where the source and drain electrode layers are to be formed and a region therearound have different wettability from each other, so that the droplet is repelled by the low wettability region and remains in a formation region of the source and drain electrode layers with high wettability. In other words, since the droplet is repelled by the low wettability region, the boundary between the high wettability region and the low wettability region serves as a partition wall. Accordingly, even a fluid composition containing a conductive material remains in the high wettability region; therefore, the source and drain electrode layers can be formed into desired shapes.

According to the present invention, for example, in the case of forming a minute electrode layer, a conductive layer can be formed only in a formation region of the electrode layer, without a droplet spreading over the formation region, even if a discharge outlet is large to a certain degree. Therefore, a defect, such as short circuit which may occur when the electrode layer fails to be formed in a region where the electrode layer is not to be formed can be prevented. When the surface of a substance is modified by light irradiation from a substrate side as in this embodiment mode, the productivity is improved because a large area can be treated as well as the conductive layer can be formed with good controllability. In addition, when a droplet discharging method is combined, less material is wasted and the cost can be reduced compared to a method in which a material is applied over the entire surface, such as a spin coating method. According to the present invention, even when a wiring and the like are arranged densely and complexly due to reduction in size and film thickness, the wirings and the like can be formed with good controllability.

The organosilane film having a hydrolytic group may be extremely thin depending on its formation conditions, and the film does not necessarily maintain the form of a film.

Note that treatment for enhancing wettability of a region is treatment in which the force of a region for holding a droplet discharged thereover (also referred to as adhesion force or fixing force) is made stronger than a region therearound, which is equivalent to treatment for enhancing adhesion between the region and the droplet by modifying the region with light irradiation. In addition, only the surface of the region which is in contact and holds the droplet may have that wettability, and the film does not necessarily have similar wettability in the entire thickness direction.

Organosilane having a hydrolytic group which is deposited in pretreatment may remain after the formation of the source and drain electrode layers, or an unnecessarily part thereof may be removed after the formation of the source and drain electrode layers. Organosilane having a hydrolytic group may be removed by ashing with oxygen or the like, etching, plasma treatment, or the like and the source and drain electrode layers can be used as a mask.

Figure 1D:
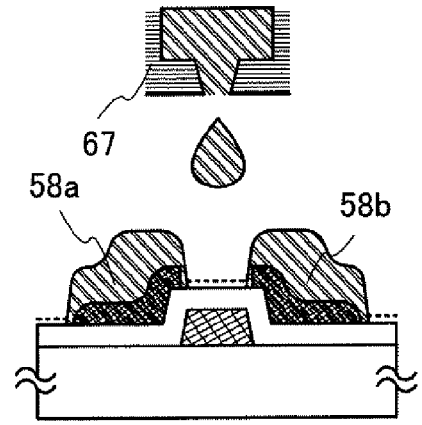
Figure 1E:
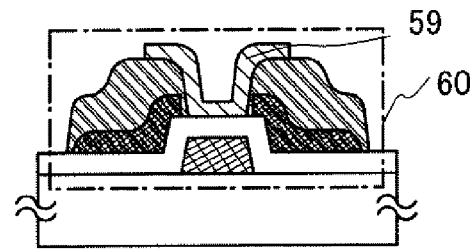

The source or drain electrode layer 58a and the source or drain electrode layer 58b are formed on surfaces of the organic polymer layers 57a and 57b; therefore, they may be formed so as to cover top surfaces and side surfaces of the organic polymer layers 57a and 57b as shown in FIG. 1D. However, the source and drain electrode layers may be formed only on the top surfaces of the organic polymer layers 57a and 57b and not formed on the side surfaces of the organic polymer layers 57a and 57b depending on liquid-repellent intensity or a condition of adsorption (density or the like) of organosilane having a hydrolytic group.

The organosilane film having a hydrolytic group is etched. A semiconductor layer 59 is formed over the source or drain electrode layer 58a and the source or drain electrode layer 58b (see FIG. 1E). In this embodiment mode, the semiconductor layer 59 is formed using pentacene. Through the foregoing steps, a thin film transistor 60 having an inverted coplanar structure in this embodiment mode can be manufactured.

Figure 2A:
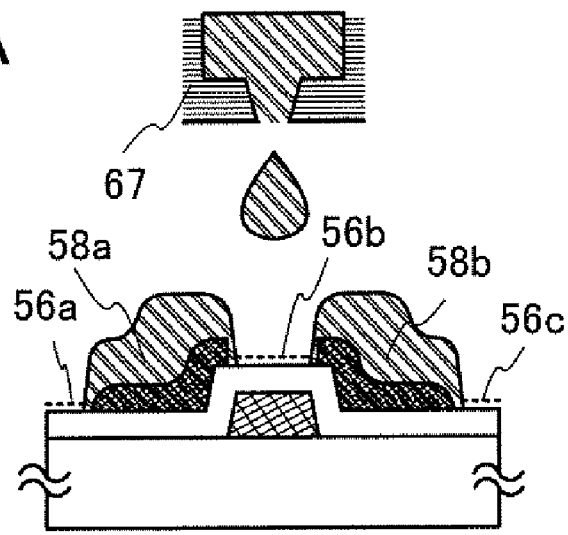
FIGS. 2A to 2C are conceptional views illustrating the present invention.
Figure 2B:
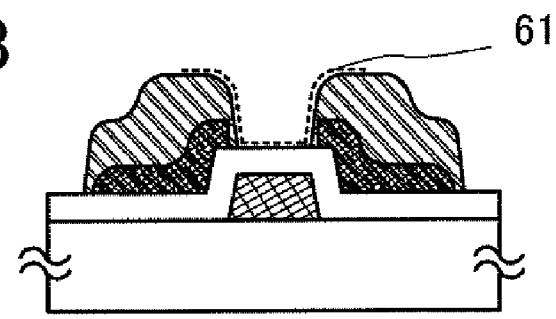
Figure 2C:
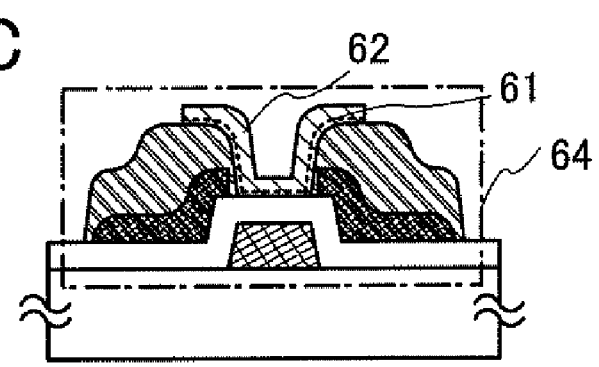
Figure 3A:
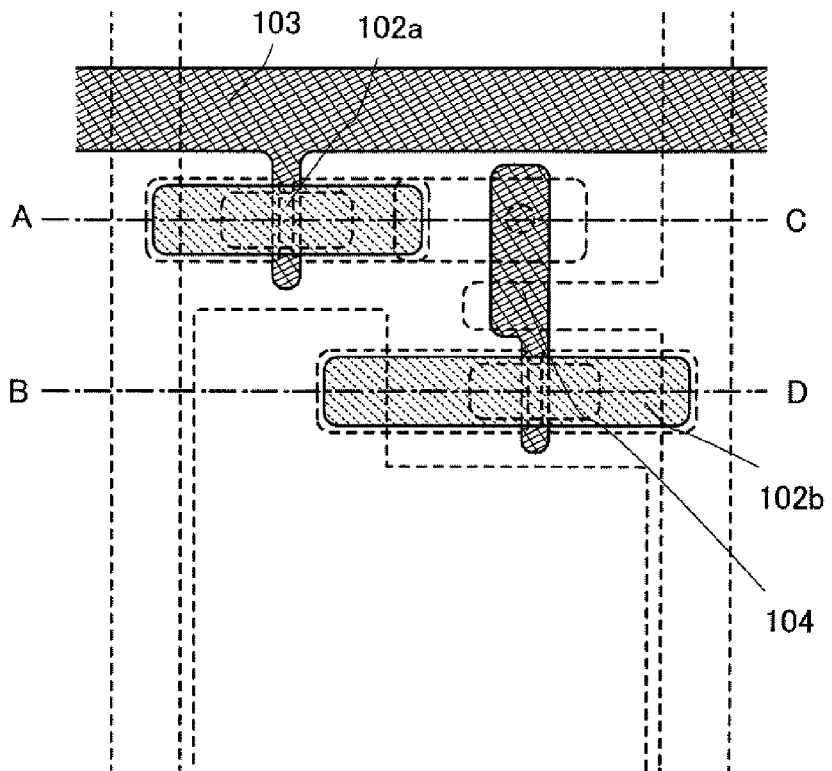
FIGS. 3A to 3C are views illustrating a manufacturing method of a display device of the present invention.
Figure 3B:
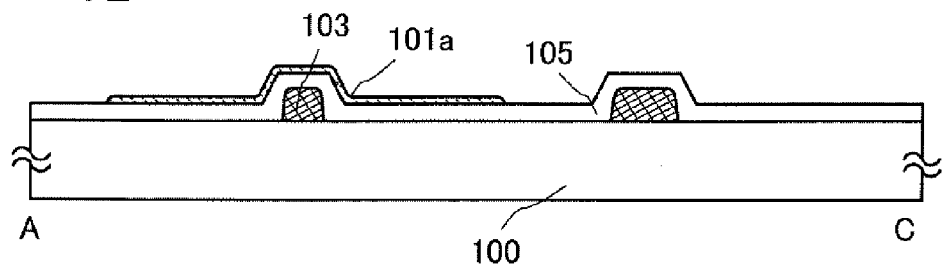
Figure 3C:
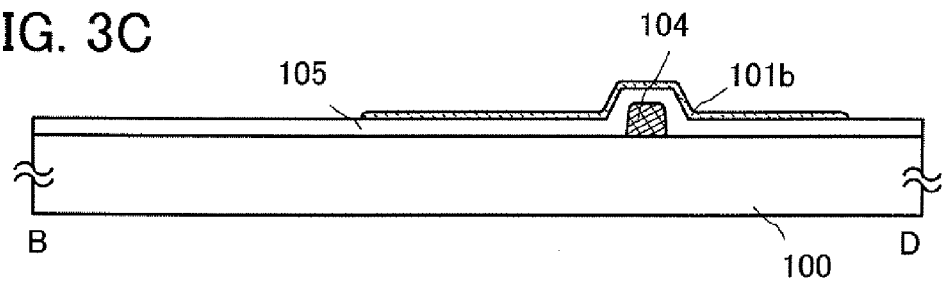

Before the formation of the semiconductor layer, an organosilane film having a hydrolytic group may be formed in a formation region of the semiconductor layer in order to improve mobility of the semiconductor layer. FIG. 2A corresponds to FIG. 1D and shows a step of forming the source and drain electrode layers 58a and 58b. Next, the orgasilane films 56a, 56b and 56c having a hydrolytic group are removed, and then, as shown in FIG. 2B, an organosilane film 61 having a hydrolytic group is formed in the formation region of the semiconductor layer. In this embodiment mode, pentacene is used as a semiconductor layer 62 and octadecyltrimethoxysilane (ODS) is used as the organosilane film 61 having a hydrolytic group. Octadecyltrimethoxysilane is effective on improvement in mobility of pentacene. After the organosilane film 61 having a hydrolytic group is formed of octadecyltrimethoxysilane, a film of pentacene is formed by a vapor deposition method to be the semiconductor layer 62. Through the foregoing steps, a thin film transistor 64 having an inverted coplanar structure in this embodiment mode can be manufactured as shown in FIG. 2C.

In this embodiment mode, a source electrode layer and a drain electrode layer are formed in a self-aligned manner. Accordingly, a defective shape or the like due to misalignment of a mask does not occur and wirings can be formed with good controllability. Therefore, a highly-reliable semiconductor device, display device, and the like can be manufactured with high yield according to the present invention.

Embodiment Mode 2

Figure 22A:
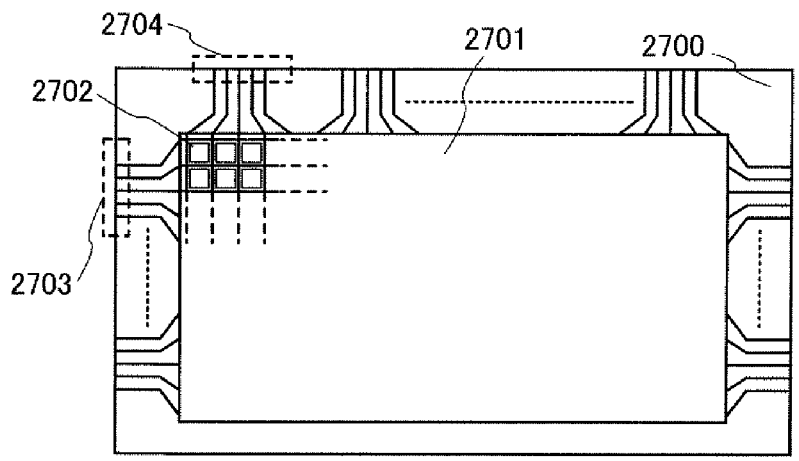
FIGS. 22A to 22C are top views each illustrating a display device of the present invention.

FIG. 22A is a top view showing a structure of a display panel according to the present invention. A pixel portion 2701 in which pixels 2702 are arranged in matrix, a scanning line input terminal 2703, and a signal line input terminal 2704 are formed over a substrate 2700 having an insulating surface. The number of pixels may be set in accordance with various standards. In the case of XGA, the number of pixels is 1024×768×3 (RGB). In the case of UXGA, the number of pixels is 1600×1200×3 (RGB), and in the case of full-spec high-definition display it is 1920×1080×3 (RGB).

The pixels 2702 are arranged in matrix by being provided at intersections of scanning lines extended from the scanning line side input terminal 2703 and signal lines extended from the signal line side input terminal 2704. Each pixel 2702 includes a switching element and a pixel electrode connected thereto. A typical example of a switching element is a TFT. A TFT has a gate electrode side connected to the scanning line and a source or drain side connected to the signal line, so that each pixel can be controlled independently by a signal inputted from an external portion.

Figure 23A:
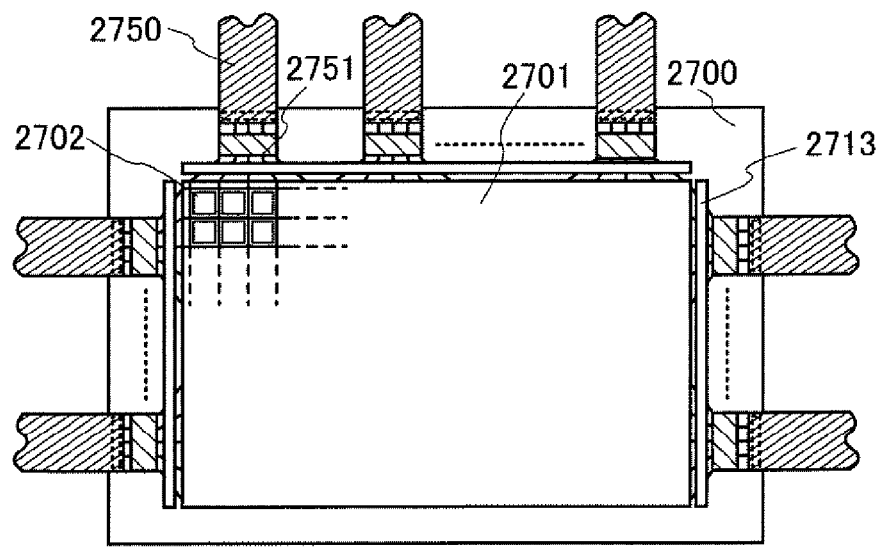
FIGS. 23A and 23B are top views each illustrating a display device of the present invention.
Figure 23B:
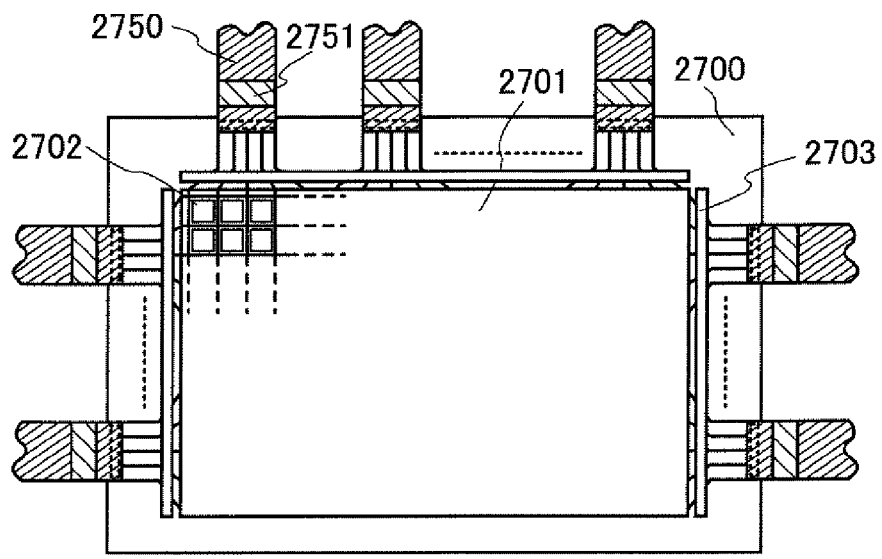

Although FIG. 22A shows a structure of a display panel in which signals inputted to the scanning line and the signal line are controlled by an external driver circuit, a driver IC 2751 may be mounted over the substrate 2700 by a COG (chip on glass) method as shown in FIG. 23A. Alternatively, a TAB (tape automated bonding) method shown in FIG. 23B may be employed. The driver IC may be one formed using a single crystalline semiconductor substrate or may be a circuit that is formed using a TFT over a glass substrate. In FIGS. 23A and 23B, the driver IC 2751 is connected to an FPC (flexible printed circuit) 2750.

Figure 22B:
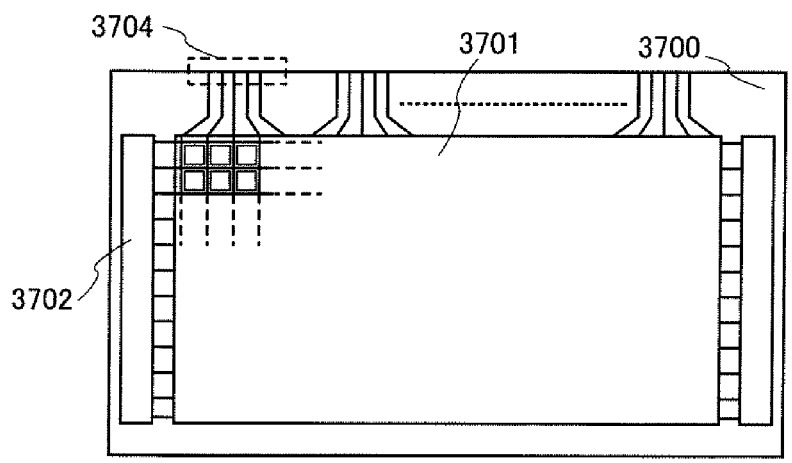
Figure 22C:
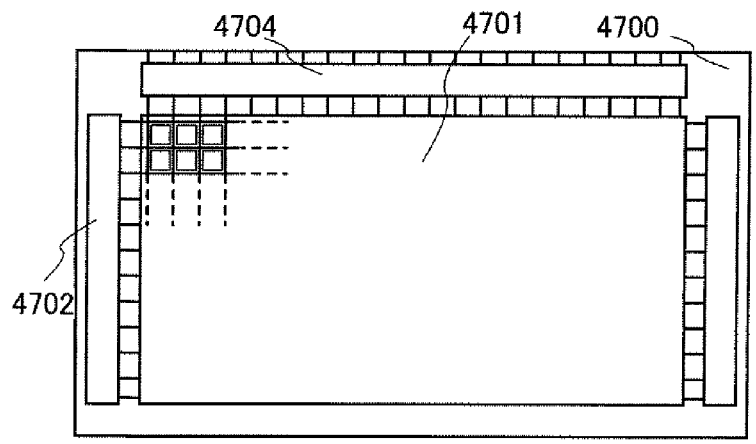

In the case of forming a TFT provided in a pixel using a polycrystalline (microcrystalline) semiconductor having high crystallinity, a scanning line side driver circuit 3702 can also be formed over a substrate 3700, as shown in FIG. 22B. In FIG. 22B, reference numeral 3701 denotes a pixel portion, and a signal line side driver circuit is controlled by an external driver circuit as in FIG. 22A. In the case where a TFT provided in a pixel is formed of a polycrystalline (microcrystalline) semiconductor, a signal crystalline semiconductor, or the like with high mobility, like a TFT formed in the present invention, a scanning line side driver circuit 4702 and a signal line side driver circuit 4704 can be integrated over a substrate 4700 as shown in FIG. 22C.

An embodiment mode of the present invention is described with reference to FIGS. 3A to 9B. This embodiment mode describes an example in which a display device is manufactured using an inverted coplanar thin film transistor having a bottom gate structure which is manufactured in a self-aligned manner through a simplified manufacturing process and at low cost according to the present invention is applied. FIGS. 3A, 4A, 5A, 6A, and 7A are top views of a pixel portion of a display device, FIGS. 3B, 4B, 5B, 6B, and 7B are cross-sectional views taken along the lines A-C in FIGS. 3A, 4A, 5A, 6A, and 7A, and FIGS. 3C, 4C, 5C, 6C, and 7C are cross-sectional views taken along the lines B-D in FIGS. 3A, 4A, 5A, 6A, and 7A. FIGS. 8A and 8B are cross-sectional views and FIG. 9A is a top view of a display device. FIG. 9B is a cross-sectional view taken along the line L-K (including the line I-J) in FIG. 9A.

A glass substrate formed of a barium borosilicate glass, aluminoborosilicate glass, or the like, a quartz substrate, or a plastic substrate which can withstand the processing temperature of the manufacturing process is used as a substrate 100. A surface of the substrate may be polished by a CMP method or the like so as to be planarized. In this embodiment mode, irradiation treatment of light which passes through the substrate 100 is performed; therefore, the substrate 100 needs to be formed of a substance which transmits light used in the treatment and have a light transmitting property.

Note that an insulating layer may be formed over the substrate 100. The insulating layer is formed using a single or stacked layer of an oxide material or nitride material containing silicon by a method such as a CVD method, a plasma CVD method, a sputtering method, a spin coating method, or the like. Alternatively, an acrylic acid, a methacrylic acid, or a derivative thereof; a heat-resistant high molecular compound such as polyimide, aromatic polyamide, or polybenzimidazole; or a siloxane resin may be used. Note that a siloxane resin corresponds to a resin including a Si—O—Si bond. Siloxane has a skeleton structure formed of the bond of silicon (Si) and oxygen (O) and an organic group having at least hydrogen (for example, an alkyl group or aromatic hydrocarbon) or a fluoro group may be used as its substituent. An organic group having at least hydrogen and a fluoro group may alternatively be used as its substituent. Alternatively, for the insulating layer, a resin material, for example, a vinyl resin, such as polyvinyl alcohol or polyvinylbutyral, an epoxy resin, a phenol resin, a novolac resin, an acrylic resin, a melamine resin, or a urethane resin may be used. Further alternatively, an organic material such as benzocyclobutene, parylene, fluorinated arylene ether, or polyimide; a composition material containing a water-soluble homopolymer and a water-soluble copolymer; or the like may be used. A droplet discharging method, a printing method (such as screen printing or offset printing by which a pattern is formed), a coating method, such as a spin coating method, a dipping method, or the like can be used. This insulating layer is not necessarily formed, but it has an advantageous effect of blocking a contaminant or the like from the substrate 100.

A gate electrode layer 103 and a gate electrode layer 104 are formed over the substrate 100. The gate electrode layers 103 and 104 can be formed using a CVD method, a sputtering method, a droplet discharging method, and the like. The gate electrode layers 103 and 104 may be formed of an element selected from Ag, Au, Ni, Pt, Pd, Ir, Rh, Ta, W, Ti, Mo, Al, and Cu, or an alloy material or a compound material containing any of the foregoing elements as its main component. Alternatively, a semiconductor film typified by a polycrystalline silicon film doped with an impurity element, such as phosphorus, or an AgPdCu alloy may be used. The gate electrode layers 103 and 104 may have either a single layer structure or a multi-layer structure. For example, the gate electrode layers 103 and 104 may have a two-layer structure of a tungsten nitride film and a molybdenum (Mo) film, or a three-layer structure in which a tungsten film having a thickness of 50 nm, a film of an alloy of aluminum and silicon (Al—Si) having a thickness of 500 nm, and a titanium nitride film having a thickness of 30 nm are sequentially stacked may be used. Further, in the case of the three-layer structure, tungsten nitride may be used instead of tungsten of a first conductive film, a film of an alloy of aluminum and titanium (Al—Ti) may be used instead of the film of an alloy of aluminum and silicon (Al—Si) as a second conductive film, and a titanium film may be used instead of the titanium nitride film as a third conductive film.

When etching processing is needed to form the gate electrode layers 103 and 104, a mask may be formed ant the etching processing may be performed with dry etching or wet etching. The electrode layers can be etched into tapered shapes by an inductively coupled plasma (ICP) etching method with the etching condition (the amount of electric power applied to a coiled electrode, the amount of electric power applied to an electrode on a substrate side, the temperature of the electrode on the substrate side, or the like) appropriately adjusted. Note that a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be appropriately used as an etching gas.

The mask can be formed by selectively discharging a composition. When the mask is selectively formed, the step of processing the mask shape can be simplified. The mask is formed using an organic material, such as an epoxy resin, a phenol resin, a novolac resin, an acrylic resin, a melamine resin, a urethane resin, benzocyclobutene, parylene, fluorinated arylene ether, or polyimide; a resin having a siloxane-bond by a droplet discharging method. The surface tension and the viscosity of any material which is used can be controlled by adjusting the concentration of a solvent or by adding a surfactant or the like.

In the case of forming the mask by a droplet discharging method in this embodiment mode, treatment for controlling wettability of a region where the mask is to be formed and the vicinity thereof may be performed as pretreatment. In the present invention, when a conductive layer or an insulating layer is formed by discharging a droplet by a droplet discharging method, the shape of the conductive layer or the insulating layer can be controlled by controlling wettability of the region where the conductive layer or the insulating layer is to be formed and the vicinity thereof. With this treatment, the conductive layer or the insulating layer can be formed with good controllability. The wettability may vary in accordance with the shape of the conductive layer or the insulating layer to be formed. Wettability may be uniform or may be different to form a plurality of regions having different wettability in the region where the conductive layer or the insulating layer is to be formed. This step can be applied as pretreatment in formation of any conductive layer or insulating layer using a liquid material.

In this embodiment mode, the gate electrode layers 103 and 104 are formed using a droplet discharging means. The droplet discharging means is a generic term for means provided with means that discharges a droplet, such as a nozzle having a discharge opening of a composition, or a head equipped with a single or plurality of nozzles. The diameter of the nozzle included in the droplet discharging means is 0.02 to 100 μm (preferably, 30 μm or less), and the amount of the composition discharged from the nozzle is 0.001 pl to 100 pl (preferably, 0.1 pl or more and 40 pl or less, more preferably, 10 pl or less). The amount of the composition discharged increases in proportion to the diameter of the nozzle. Further, the distance between an object and the discharge opening of the nozzle is preferably as short as possible in order to discharge a droplet at a desired position. The distance is preferably about 0.1 to 3 mm (more preferably, 1 mm or shorter).

Figure 30:
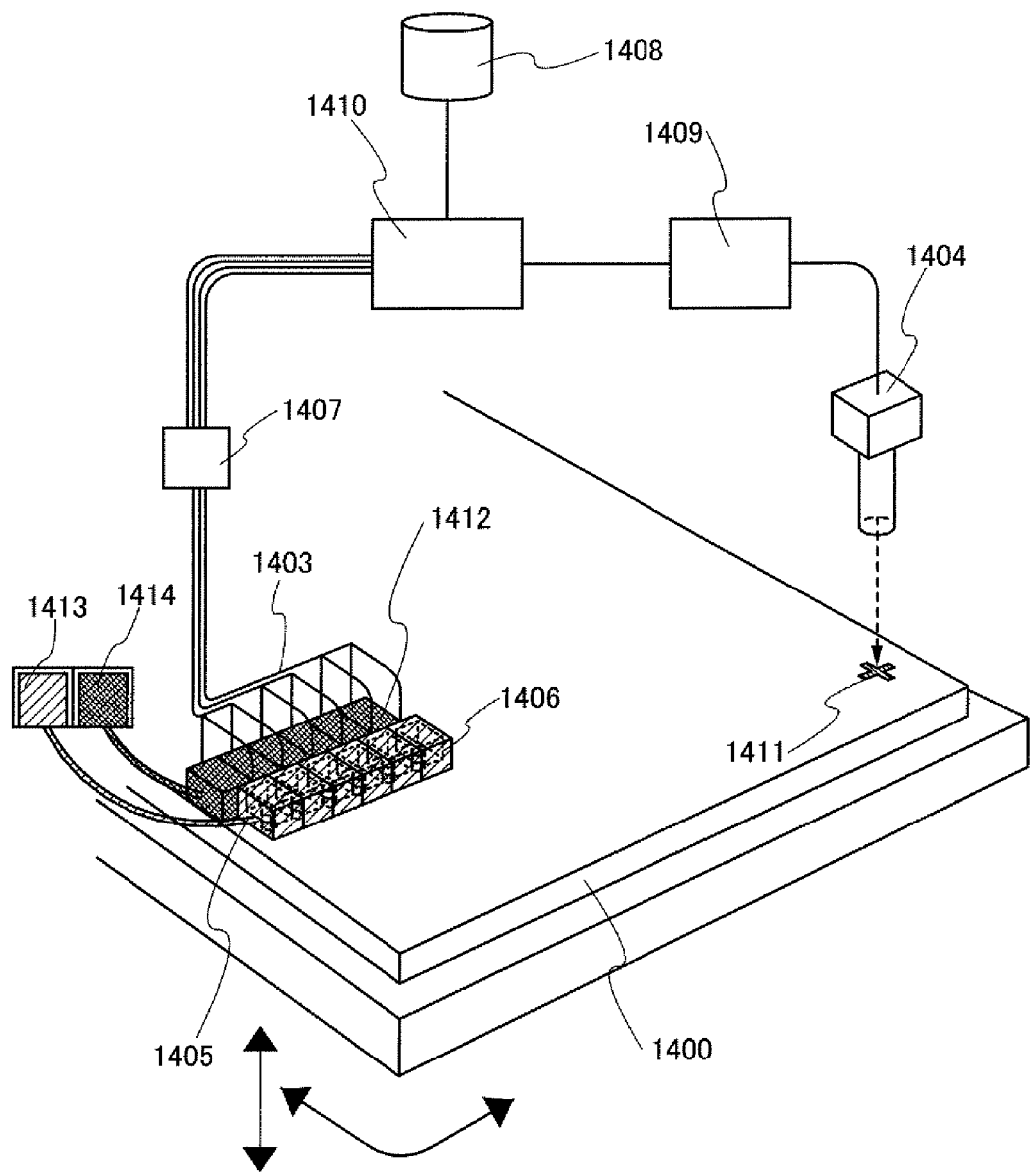
FIG. 30 is a view illustrating a droplet discharging apparatus which can be applied to the present invention.

One mode of a droplet discharging apparatus used for a droplet discharging method is shown in FIG. 30. Each of heads 1405 and 1412 of a droplet discharging means 1403 is connected to a control means 1407, and this control means 1407 is controlled by a computer 1410, so that a preprogrammed pattern can be drawn. The timing for dawning may be determined, for example, based on a marker 1411 formed over a substrate 1400. Alternatively, a reference point may be fixed based on an edge of the substrate 1400. The reference point is detected by an imaging means 1404 and converted into a digital signal by an image processing means 1409. Then, the digital signal is recognized by the computer 1410, so that a control signal is generated, and the control signal is transmitted to the control means 1407. An image sensor or the like using a charge coupled device (CCD) or a complementary metal oxide semiconductor (CMOS) can be used as the imaging means 1404. Needless to say, information about a pattern to be formed over the substrate 1400 is stored in a storage medium 1408, and the control signal is transmitted to the control means 1407 based on the information, so that the head 1405 and the head 1412 of the droplet discharging means 1403 can be individually controlled. A material to be discharged is supplied to the heads 1405 and 1412 from a material supply sources 1413 and 1414 through pipes, respectively.

Inside the head 1405, a space filled with a liquid material as indicated by a dotted line 1406 and a nozzle which is a discharge opening are provided. Although not shown, an internal structure of the head 1412 is similar to that of the head

1405. When the nozzle sizes of the heads 1405 and 1412 are different from each other, different materials can be discharged with different widths simultaneously. Each head can discharge and draw a conductive material, an organic material, an inorganic material, or the like. In the case of drawing over a large area such as an interlayer film, the same material can be simultaneously discharged to be drawn from a plurality of nozzles to improve throughput. When a large substrate is used, the heads 1405 and 1412 can freely move over the substrate in a direction indicated by the arrows in FIG. 30, and a drawing region can be freely set. Thus, a plurality of the same patterns can be drawn over one substrate.

In the case of forming a film (such as an insulating film or a conductive film) by a droplet discharging method, the film is formed as follows: a composition containing a film material which is processed into a particle form is discharged, and the composition is fused or welded by baking and is solidified. Many of films which are formed by discharging and baking the composition containing a conductive material in this way have a polycrystalline structure having a large number of grain boundaries whereas many of films which are formed by a sputtering method or the like have a columnar structure.

For the composition to be discharged from the discharge opening, a conductive material dissolved or dispersed in a solvent is used. The conductive material corresponds to a microparticle or a dispersive nanoparticle of one or plural kinds of metal, such as Ag, Au, Cu, Ni, Pt, Pd, Ir, Rh, W, or Al. In addition, a microparticle or a dispersive nanoparticle of one or plural kinds of a metal sulfide of Cd, or Zn, oxide of Fe, Ti, Ge, Si, Zr, Ba, or the like, or silver halide may be mixed to the foregoing conductive material. In addition, a transparent conductive film transmits light at the time of rear light-exposure since it has a light transmitting property, but it can be used in a stacked body with a material which does not transmit light. For the transparent conductive film, indium tin oxide (ITO), ITSO that contains indium tin oxide and silicon oxide, organic indium, organic tin, zinc oxide, titanium nitride, or the like can be used. Alternatively, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used. However, as for the composition to be discharged from the discharge opening, any of the materials of gold, silver, and copper dissolved or dispersed in a solvent is preferably used, taking into consideration a specific resistance value. It is more preferable to use silver or copper having a low resistance value. However, when silver or copper is used, a barrier film may be additionally provided as a countermeasure against impurities. A silicon nitride film or a nickel boron (NiB) film can be used as the barrier film.

The composition to be discharged is a conductive material dissolved or dispersed in a solvent, which also contains a dispersant, or a thermosetting resin called a binder. In particular, the binder has a function of preventing the generation of cracks or uneven baking during baking. Thus, a conductive film which is formed may contain an organic material. The organic material to be contained depends on a heating temperature, atmosphere, or time. This organic material is an organic resin which functions as a binder, a solvent, a dispersant, and a coating of a metal particle. A typical example thereof is an organic resin such as polyimide, acrylic, a novolac resin, a melamine resin, a phenol resin, an epoxy resin, a silicone resin, a furan resin, or a diallyl phthalate resin.

Alternatively, a particle with a plurality of layers in which a conductive material is coated with another conductive material may be used. For example, a three-layer structure particle in which copper is coated with nickel boron (NiB) and is further coated with silver, may be used. As for the solvent, esters such as butyl acetate or ethyl acetate, alcohols such as isopropyl alcohol or ethyl alcohol, an organic solvent such as methyl ethyl ketone or acetone, water, or the like is used. The viscosity of the composition is preferably 20 mPa·s (cp) or less in order to prevent the composition from drying, and to enable the composition to be discharged smoothly from the discharge opening. The surface tension of the composition is preferably 40 mN/m or less, but the viscosity of the composition and the like may be appropriately controlled depending on a solvent which is used and an intended purpose. For example, the viscosity of a composition in which ITO, organic indium, or organic tin is dissolved or dispersed in a solvent may be set to 5 to 20 mPa·s, the viscosity of a composition in which silver is dissolved or dispersed in a solvent may be set to 5 to 20 mPa·s, and the viscosity of a composition in which gold is dissolved or dispersed in a solvent may be set to 5 to 20 mPa·s.

The conductive layer may be formed by stacking a plurality of conductive materials. In addition, the conductive layer may be formed first by a droplet discharging method using silver as a conductive material, and then may be plated with copper or the like. The plating may be performed by an electroplating or chemical (electroless) plating method. The plating may be performed by immersing a substrate surface in a container filled with a solution containing a plating material; alternatively, the substrate may be placed obliquely (or vertically) and the solution containing a plating material may be applied so as to flow on the substrate surface. When the plating is performed by applying a solution with the substrate placed obliquely (or vertically), there is the advantage of miniaturizing a process apparatus.

The diameter of a conductive particle is preferably as small as possible, for the purpose of preventing the nozzle from being clogged and for manufacturing a minute pattern, although it depends on the diameter of the nozzle, a desired shape of a pattern, and the like. Preferably, the diameter of the particle of the conductive material is 0.1 μm or less. The composition is formed by a method, such as an electrolyzing method, an atomizing method, or a wet reduction method, and the particle size to be obtained is typically about 0.01 to 10 μm. However, when a gas evaporation method is employed, nanoparticles protected by a dispersant are minute, each having a size of about 7 nm, and when the surface of each particle is covered with a coating, the nanoparticles do not aggregate and are uniformly dispersed in the solvent at room temperature, and behaves similarly to a liquid. Accordingly, it is preferable to use a coating.

In addition, the step of discharging the composition may be performed under reduced pressure. The substrate may be heated when the composition is discharged. After discharging the composition, either or both steps of drying and baking are performed. Both the drying and baking steps are heat treatments, but they have a different purpose, temperature, and time period, for example, drying is performed for three minutes at 100° C. and baking is performed for 15 to 60 minutes at a temperature of 200 to 550° C. The steps of drying and baking are performed under normal pressure or under reduced pressure, by laser light irradiation, rapid thermal annealing, heating using a heating furnace, or the like. Note that the timing and the number of heat treatments are not particularly limited. In order to favorably perform the steps of drying and baking, the temperature at that time is, although it depends on the material of the substrate and a property of the composition, generally room temperature to 800° C. (preferably, 100 to 550° C.). Through these steps, the solvent in the composition is volatilized or the dispersant is chemically removed, and a peripheral resin is hardened and shrunk, so that nanoparticles are made in contact with each other and fusion and welding are accelerated.

A continuous wave or pulsed gas laser or solid-state laser may be used for laser light irradiation. An excimer laser, a YAG laser, or the like can be used as the former gas laser. A laser such as a laser using a crystal of YAG, $YVO_4$, $GdVO_4$, or the like doped with Cr; Nd, or the like can be used as the latter solid-state laser. Note that a continuous wave laser is preferably used in consideration of the absorptance of laser light. Moreover, a laser irradiation method in which pulsed and continuous wave lasers are combined may be used. However, it is preferable that the heat treatment by laser light irradiation is instantaneously performed within several microseconds to several tens of seconds so as not to damage the substrate, depending on heat resistance of the substrate. Rapid thermal annealing (RTA) is carried out by raising the temperature rapidly and heating the substrate instantaneously for several microseconds to several minutes using an infrared lamp or a halogen lamp which emits ultraviolet to infrared light in an inert gas atmosphere. Since this treatment is performed instantaneously, only the outermost thin film can be heated and a layer under the film is not adversely affected. In other words, even a substrate having low heat resistance, such as a plastic substrate is not adversely affected.

After forming the gate electrode layers 103 and 104 by discharging a liquid composition by a droplet discharging method, the surface thereof may be planarized by pressing with pressure to improve planarity. As a pressing method, unevenness may be reduced by moving a roller-shaped object over the surface, or the surface may be pressed with a flat plate-shaped object. A heating step may be performed at the time of pressing. Alternatively, the unevenness of the surface may be eliminated with an air knife after softening or melting the surface with a solvent or the like. A CMP method may alternatively be used for polishing the surface. This step may be employed in planarizing a surface when unevenness is generated by a droplet discharging method.

Although a film formation method by the foregoing droplet discharging method is explained using a conductive layer as an example, conditions for discharging, drying, baking, a solvent, and the like and detailed description can also be applied to organosilane having a hydrolytic group, the insulating layer, and the organic layer containing a photopolymerizable reactive group formed in this embodiment mode. When a droplet discharging method is combined, the cost can be reduced compared to the method in which the material is applied over the entire surface, such as a spin coating method.

Next, a gate insulating layer 105 is formed over the gate electrode layers 103 and 104. The gate insulating layer 105 contains an inorganic material. The gate insulating layer 105 needs to have a light transmitting property with respect to light with which irradiation is performed in order to transmit the light through the gate insulating layer 105 in irradiating the organic layer containing a photopolymerizable reactive group which is to be formed thereover, with light. The gate insulating layer 105 may be formed of an oxide material or a nitride material of silicon, or the like, which may be a single or stacked layer. In this embodiment mode, a stacked layer of three layers, a silicon nitride film, a silicon oxide film, and a silicon nitride film, is used. Alternatively, a single layer or a stacked layer of two layers of any of those films or a silicon oxynitride film may be used. Preferably, a silicon nitride film with dense film quality is used. The gate insulating layer 105 may be a single or stacked layer, and the outermost surface is an inorganic film, such as a film of silicon oxide, silicon nitride, silicon nitride containing oxygen, silicon oxide containing nitrogen, or the like, or is formed of a material which contains an inorganic component, such as organopolysiloxane and to which organosilane having a hydrolytic group is easily adsorbed. Note that in order to form a dense insulating film with less gate leakage current at a low temperature, a reactive gas containing a rare gas element, such as argon may be mixed into the insulating film to be formed.

After forming the substrate, an insulating layer, a semiconductor layer, a gate insulating layer, an interlayer insulating layer, and another insulating layer, conductive layer, or the like included in a display device or a semiconductor device, the surfaces of the substrate, the insulating layer, the semiconductor layer, the gate insulating layer, the interlayer insulating layer may be oxidized or nitrided by plasma treatment. When the semiconductor layer and the insulating layer are oxidized or nitrided by plasma treatment, the surfaces of the semiconductor layer and the insulating layer are modified and a denser insulating layer than an insulating layer formed by a CVD method or a sputtering method can be obtained. Accordingly, defects such as a pinhole can be suppressed, and characteristics or the like of a semiconductor device can be improved. Such plasma treatment as described above can be performed on a conductive layer, such as a gate electrode layer, a source wiring layer, or a drain wiring layer, and the surface thereof can be nitrided or oxidized by nitridation or oxidization (or both nitridation and oxidization).

In addition, the plasma treatment is performed in the foregoing gas atmosphere with an electron density of $1\times10^{11}$ $cm^{-3}$ or more and a plasma electron temperature of 1.5 eV or less. In more details, the plasma treatment is performed with an electron density of $1\times10^{11}$ $cm^{-3}$ or more and $1\times10^{13}$ $cm^{-3}$ or less and a plasma electron temperature of 0.5 eV or more and 1.5 eV or less. Since plasma electron density is high and electron temperature is low in the vicinity of an object to be treated over the substrate, damage by plasma to the object can be prevented. Further, since the plasma electron density is as high as $1\times10^{11}$ $cm^{-3}$ or more, an oxide film or a nitride film formed by oxidizing or nitriding the object by the plasma treatment is superior in uniformity of thickness or the like to a film formed by a CVD method, a sputtering method, or the like, and a dense film can be formed. In addition, since the plasma electron temperature is as low as 1.5 eV or less, oxidizing or nitriding treatment can be performed at lower temperature than conventional plasma treatment or thermal oxidation method. For example, oxidizing or nitriding treatment can be performed sufficiently even in the case of performing the plasma treatment at a temperature lower by 100° C. or more than a strain point of the glass substrate. Note that as frequency to form plasma, high frequency wave, such as microwave (2.45 GHz) can be used. Note that plasma treatment is assumed to be performed under the foregoing conditions unless otherwise specified hereinafter.

In this embodiment mode, a source electrode layer and a drain electrode layer of a transistor are formed in a self-aligned manner by forming an organic polymer layer and performing liquid-repellent treatment. In addition, the organic polymer layer is formed by selectively polymerizing an organic layer containing a photopolymerizable reactive group by rear light-exposure. Difference in adsorption property for a liquid repellent between a gate insulating layer containing an inorganic material and the organic polymer layer is utilized to make wettability of the gate insulating layer and that of the organic polymer layer be different from each other. When a composition containing a conductive material is discharged in regions with thus controlled wettability, a source electrode layer and a drain electrode layer can be formed only over the organic polymer layer. In this manner, a thin film transistor can be manufactured in a self-aligned manner. Therefore, according to the present invention, a display device and the like can be manufactured at low cost and with high productivity.

The shape of the organic layer containing a photopolymerizable reactive group may be processed using a resist mask, an evaporation mask, or the like and the foregoing droplet discharging (ejecting) method, a printing method (such as screen (mimeograph) printing, offset (planography) printing, relief printing, or gravure (intaglio) printing), a dispenser method, or the like may be combined therewith. By selectively forming the organic layer containing a photopolymerizable reactive group by a droplet discharging method as described in this embodiment mode, a manufacturing process is more simplified.

In this embodiment mode, an organic layer 101a containing a photopolymerizable reactive group and an organic layer 101b containing a photopolymerizable reactive group are selectively formed by a droplet discharging method. A liquid composition containing an organic material containing a photopolymerizable reactive group is discharged from a droplet discharging apparatus to form the organic layer 101a containing a photopolymerizable reactive group and the organic layer 101b containing a photopolymerizable reactive group (see FIGS. 3A to 3C). The organic layer 101a containing a photopolymerizable reactive group and the organic layer 101b containing a photopolymerizable reactive group are solidified by drying or baking. In this embodiment mode, the organic layer containing a photopolymerizable reactive group is formed by discharging a solution in which polyvinylcinnamate is dissolved in dimethylformamide and solidifying the solution in a film shape by drying or heating treatment. In this specification, a film formed by a droplet discharging method, which is described as a film, may be extremely thin depending on its formation conditions, and the film does not necessarily maintain the form of a film; for example, it may have a discontinuous island structure or the like.

The organic layers 101a and 101b containing a photopolymerizable reactive group may be formed of a material with which a light irradiation portion thereof becomes poorly soluble (difficult to be dissolved) in a specific organic solvent. A material which is cross-linked or polymerized by light irradiation can be used, for example, a photodimerization resin having a cinnamoyl group, a cinnamylidene group, a phenylenediacrylate group, or the like; a diazo-based compound, such as diazonium salt or diazoxide; a mixture of a resin having a hydroxyl group, such as polyvinyl alcohol, and a diazo-based compound; a monomer or an oligomer having a vinyl group, such as acrylate polymerized by light irradiation.

Figure 4A:
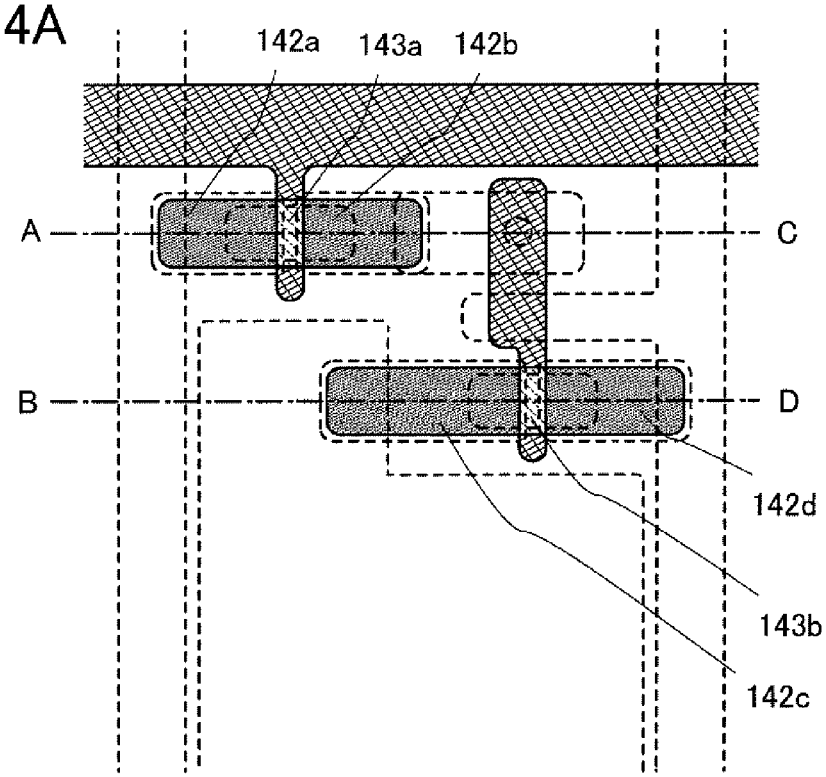
FIGS. 4A to 4C are views illustrating a manufacturing method of a display device of the present invention.
Figure 4B:
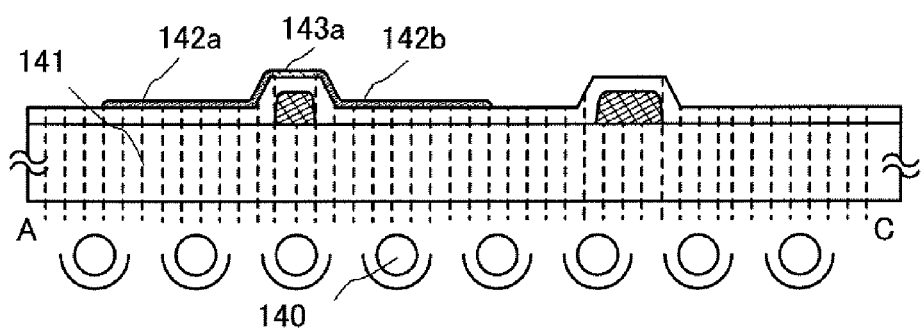
Figure 4C:
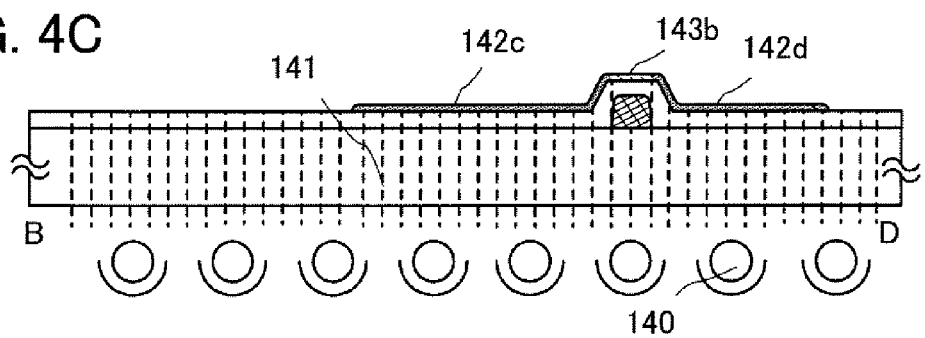

The organic layers 101a and 101b containing a photopolymerizable reactive group are irradiated with light 141 which is emitted from a light source 140 to the light-transmitting substrate 100 and passes through the light-transmitting substrate 100 (see FIGS. 4A to 4C). The light 141 passes through the light-transmitting substrate 100 and the gate insulating layer 105, but does not pass through and is blocked by the gate electrode layers 103 and 104, which have a non-light transmitting property. Therefore, in the organic layers 101a and 101b containing a photopolymerizable reactive group, regions overlapping with the gate electrode layers 103 and 104 become light-unexposed regions 143a and 143b, and the organic layer containing a photopolymerizable reactive group in light-exposed regions 142a, 142b, 142c, and 142d is modified by light. In this embodiment mode, the organic layers containing a photopolymerizable reactive group in the light-exposed regions 142a, 142b, 142c, and 142d are cross-linked or polymerized so as to be poorly soluble in an organic solvent. The light 141 may be light with a wavelength and intensity which polymerize the organic layer containing a photopolymerizable reactive group, and ultraviolet light with a wavelength of 300 nm to 350 nm is used in this embodiment mode.

Light to be used can be, but not exclusively, one of infrared light, visible light, and ultraviolet light or a combination thereof. For example, light emitted from an ultraviolet lamp, a black light, a halogen lamp, a metal halide lamp, a xenon arc lamp, a carbon arc lamp, a high pressure sodium lamp, or a high pressure mercury lamp may be used. In that case, a lamp light source may be lighted for a necessary period or multiple times for irradiation.

Alternatively, laser light may be used as light used for modification treatment, and a laser oscillator which can oscillate ultraviolet light, visible light, or infrared light can be used as a laser oscillator. As the laser oscillator, an excimer laser oscillator of KrF, ArF, XeCl, Xe, or the like, a gas laser oscillator of He, He—Cd, Ar, He—Ne, Hf, or the like, a solid-state laser oscillator using crystal such as YAG, GdVO$_4$, YVO$_4$, YLF, or YAlO$_3$ doped with Cr, Nd, Er, Ho, Ce, Co, Ti, or Tm, a semiconductor laser oscillator of GaN, GaAs, GaAlAs, InGaAsP, or the like can be used. Note that first to fifth harmonics of a fundamental wave are preferably used in the solid-state laser oscillator.

A shutter, a reflector such as a mirror or a half mirror, an optical system including a cylindrical lens, a convex lens, or the like may be provided to adjust the shape or path of light emitted from the lamp light source and laser light emitted from the laser oscillator. In addition, one or more lamp light sources or laser oscillators may be provided, and arrangement of an optical system which includes a light source and a substrate to be irradiated may be appropriately selected in accordance with an object to be irradiated (material, thickness, or the like of the object to be irradiated).

Note that in FIGS. 4A to 4C, light emitted from a plurality of light sources is made almost perpendicular to the surface of the substrate 100.

Note that light irradiation may be selectively performed by moving a substrate, or light irradiation may be performed by moving light in the X- and Y-axis directions. In that case, a polygon mirror or a galvanometer mirror is preferably used in the optical system.

In addition, a combination of light from a lamp light source and laser light can be used as the light. It is possible that a relatively large region on which light exposure treatment is performed may be irradiated using a lamp, and only a region on which highly precise light exposure treatment is performed may be irradiated with laser light. By performing light irradiation treatment in such a manner, throughput can be improved and a highly precisely processed wiring board, display device, or the like can be obtained.

The organic layer containing a photopolymerizable reactive group in the light-unexposed region is removed with an organic solvent. As the organic solvent, one which can selectively dissolve only the light-unexposed region without dissolving the light-exposed region is selected. In this embodiment mode, the organic layer containing a photopolymerizable reactive group is immersed in dimethylformamide to form organic polymer layers 114a, 114b, 114c, and 114d.

Figure 5A:
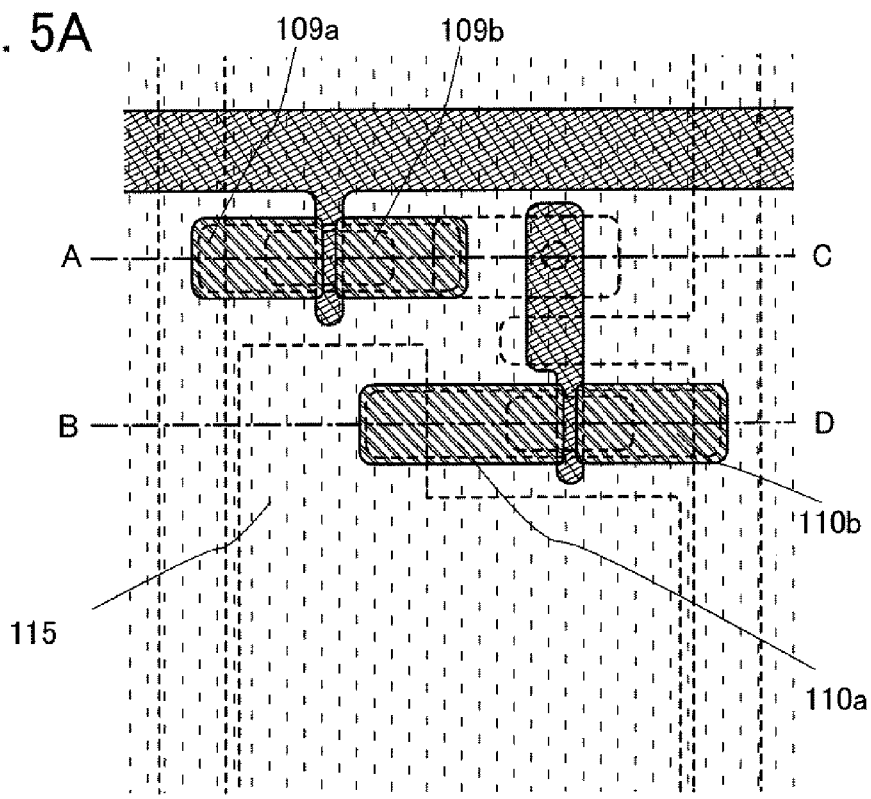
FIGS. 5A to 5C are views illustrating a manufacturing method of a display device of the present invention.
Figure 5B:
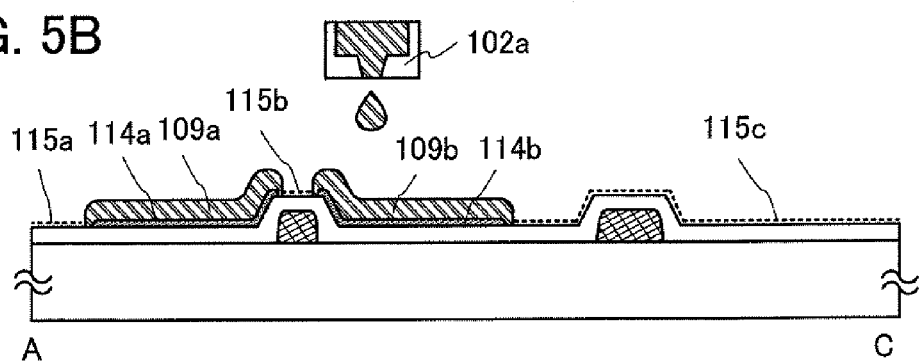
Figure 5C:
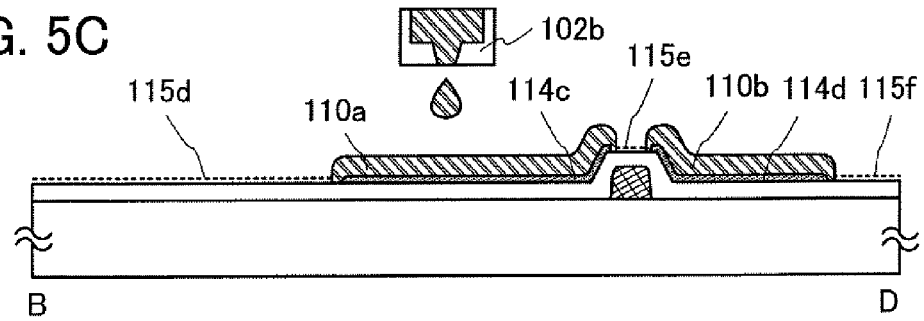

Then, liquid-repellent treatment is performed with organosilane having a hydrolytic group in order to control wettability. In this embodiment mode, hexamethyldisilazane (HMDS) is used as the organosilane having a hydrolytic group. Organosilane films 115a, 115b, 115c, 115d, 115e, and 115f having a hydrolytic group is adsorbed to the gate insulating layer containing an inorganic material more closely than to the organic polymer layer (see FIGS. 5A to 5C). Organosilane having a hydrolytic group has a liquid-repellent property against a composition containing a conductive material, which is a material for forming a source electrode layer and a drain electrode layer; therefore, the surface of the gate insulating layer, to which organosilane having a hydrolytic group is closely adsorbed, has low wettability with respect to the composition containing a conductive material than surfaces of the organic polymer layers 114a, 114b, 114c, and 114d. In FIGS. 5A to 5C, the organosilane films 115a, 115b, 115c, 115d, 115e, and 115f having a hydrolytic group over the gate insulating layer are denoted by dotted lines in order to show that the organosilane having a hydrolytic group is closely adsorbed to the gate insulating layer.

Before the formation of the organosilane film having a hydrolytic group, ultraviolet ozone treatment, oxygen ($O_2$) ashing, or the like is preferably performed. By ultraviolet ozone treatment or oxygen ($O_2$) ashing, an organic substance over the gate insulating layer is decomposed, organosilane having a hydrolytic group is easily adsorbed over the gate insulating layer, and a hydroxyl group is introduced to the organic polymer layer so that wettability of the organic polymer layer can be enhanced.

A droplet containing the conductive material is discharged through a nozzle of droplet discharging apparatuses 102a and 102b to the region where the source electrode layer and the drain electrode layer are to be formed, that is, the organic polymer layers 114a, 114bb, 114c, and 114d. The droplet which is discharged is not attached to the organosilane films 115a, 115b, 115c, 115d, 115e, and 115f having a hydrolytic group over the gate insulating layer, which are the low wettability regions, and is attached to the organic polymer layers 114a, 114b, 114c, and 114d, which are high wettability regions with higher wettability than the low wettability region. Even if the discharging method of the conductive material cannot be precisely controlled depending on a size, scanning capability, or the like of a discharge outlet of the nozzle through which the droplet is discharged; by the liquid-repellent treatment for the region other than the region where the source and drain electrode layers are to be formed, the droplet is attached only to the region where the source and drain electrode layers are to be formed, so that source and drain electrode layers 109a and 109b and a source electrode layer and a drain electrode layer 110a and 110b are formed into a desired pattern (see FIGS. 5A to 5C). This is because the region where the source and drain electrode layers are to be formed and a region therearound have different wettability from each other, so that the droplet is repelled by the low wettability region and remains in a formation region of the source and drain electrode layers with high wettability. In other words, since the droplet is repelled by the low wettability region, the boundary between the high wettability region and the low wettability region serves as a partition wall. Accordingly, even a fluid composition containing a conductive material remains in the high wettability region; therefore, the source drain electrode layers can be formed into desired shapes.

According to the present invention, for example, in the case of forming a minute electrode layer, a conductive layer can be formed only in a formation region of the electrode layer, without a droplet spreading over the formation region, even if a discharge outlet is large to a certain degree. Therefore, a defect, such as short circuit which may occur when the electrode layer fails to be formed in a region where the electrode layer is to be formed can be prevented. When the surface of a substance is modified by light irradiation from a substrate side as in this embodiment mode, the productivity is improved because a large area can be treated as well as the conductive layer can be formed with good controllability. In addition, when a droplet discharging method is combined, less material is wasted and the cost can be reduced compared to a method in which a material is applied over the entire surface, such as a spin coating method. According to the present invention, even when a wiring and the like and are arranged densely and complexly due to reduction in size and film thickness, the wirings and the like can be formed with good controllability.

The organosilane film having a hydrolytic group which is formed in pretreatment may remain after the formation of the source and drain electrode layers, or an unnecessarily part thereof may be removed after the formation of the source and drain electrode layers. The organosilane film having a hydrolytic group may be removed by ashing with oxygen or the like, etching, plasma treatment, or the like. In this embodiment mode, the organosilane films 115a, 115b, 115c, 115d, 115e, and 115f having a hydrolytic group are removed.

In this embodiment mode, a source electrode layer and a drain electrode layer are formed in a self-aligned manner. Accordingly, a defective shape or the like due to misalignment of a mask does not occur and wirings can be formed with good controllability. Therefore, a highly-reliable semiconductor device, display device, and the like can be manufactured with high yield according to the present invention.

A mask is formed of a resist or an insulating material such as polyimide by a droplet discharging method. An opening 125 is formed in a part of the gate insulating layer 105 by etching processing using the mask in order to partially expose the gate electrode layer 104 formed under the gate insulating layer 105. The etching process may employ either plasma etching (dry etching) or wet etching; but, plasma etching is suitable for treating a large substrate. As an etching gas, a fluorine-based gas such as $CF_4$ or $NF_3$ or a chlorine-based gas such as $Cl_2$ or $BCl_3$ is used, to which an inert gas such as He or Ar may be appropriately added. Alternatively, local electric discharge processing may be performed when the etching process is performed using atmospheric pressure discharge, and a mask layer is not necessarily formed over the entire surface of the substrate.

A mask used for etching to form the opening 125 can also be formed by selectively discharging a composition. Such selective formation of the mask can simplify the forming process of the opening. The mask is formed using an organic material, such as an epoxy resin, a phenol resin, a novolac resin, an acrylic resin, a melamine resin, a urethane resin, benzocyclobutene, parylene, fluorinated arylene ether, or polyimide; a resin having a siloxane-bond by a droplet discharging method. The surface tension and the viscosity of any material which is used can be controlled by adjusting the concentration of a solvent or by adding a surfactant or the like.

Figure 6A:
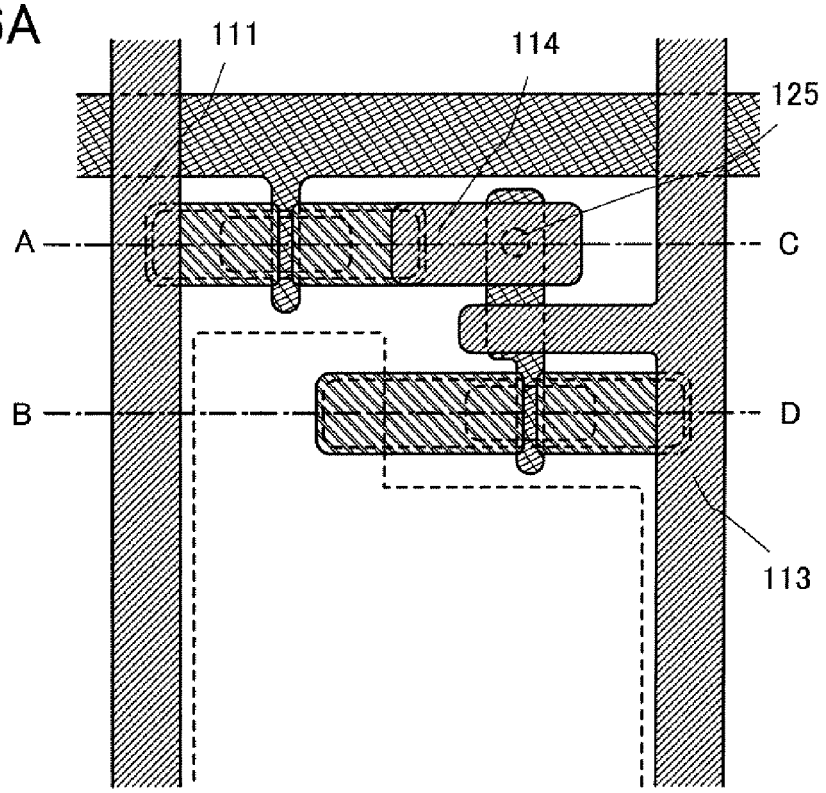
FIGS. 6A to 6C are views illustrating a manufacturing method of a display device of the present invention.
Figure 6B:
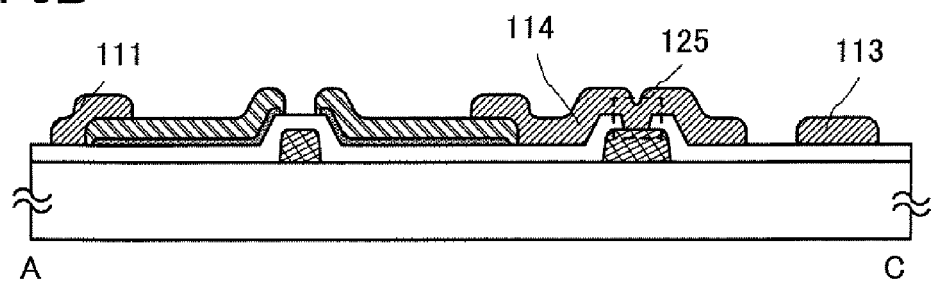
Figure 6C:
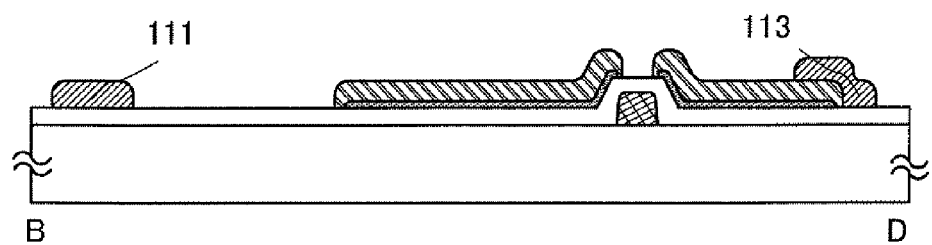

A liquid composition containing a conductive material is discharged by a droplet discharging apparatus over the gate insulating layer 105 to form a wiring layer 111, a wiring layer 113, and a wiring layer 114 (see FIGS. 6A to 6C). The wiring layer 111 also serves as a source or drain wiring layer and is formed to be in contact with and electrically connected to the source or drain electrode layer 109a. The wiring layer 114 is formed in contact with the source or drain electrode layer 109b and the gate electrode layer 104 and is electrically connected to the gate electrode layer 104 in the opening 125 formed in the gate insulating layer 105. The wiring layer 113 also serves as a power supply line and is formed to be in contact with and electrically connected to the source or drain electrode layer 110b (see FIGS. 6A to 6C). A capacitor is also formed in a region in which the wiring layer 113, the gate insulating layer 105, and the gate electrode layer 104 are stacked.

As the conductive material for forming the wiring layers 111, 113, and 114 by a droplet discharging method as described in this embodiment mode, a composition containing a metal particle of Ag (silver), Au (gold), Cu (copper), W (tungsten), Al (aluminum), or the like as its main component can be used. Indium tin oxide (ITO), ITSO containing indium tin oxide and silicon oxide, organic indium, organic tin, zinc oxide, titanium nitride, or the like which has a light transmitting property may be combined therewith.

Alternatively, the wiring layers 111, 113, and 114 can be formed by forming a conductive film by a PVD method, a CVD method, an evaporation method, or the like, and then etching the conductive film into a desired shape. Alternatively, the wiring layer can be formed selectively at a predetermined place by a printing method, an electroplating method, or the like. Furthermore, a reflow method or a damascene method may be used. The wiring layer may be formed using an element such as Ag, Au, Cu, Ni, Pt, Pd, Ir, Rh, W, Al, Ta, Mo, Cd, Zn, Fe, Ti, Si, Ge, Zr, or Ba, an alloy or nitride of any of those elements.

Next, a semiconductor layer is formed. A semiconductor layer having one conductivity type may be formed if necessary. An NMOS structure including an n-channel TFT with an n-type semiconductor layer, a PMOS structure including a p-channel TFT with a p-type semiconductor layer, and a CMOS structure including an n-channel TFT and a p-channel TFT can be manufactured. An n-channel TFT or a p-channel TFT can also be formed by forming an impurity region in a semiconductor layer by adding an element which imparts conductivity thereto by doping in order to impart conductivity. The conductivity may be imparted to a semiconductor layer by performing a plasma treatment using a $PH_3$ gas instead of forming the n-type semiconductor layer.

An amorphous semiconductor (hereinafter also referred to as AS) manufactured by a vapor phase growth method or a sputtering method using a semiconductor material gas typified by silane or germane; a polycrystalline semiconductor, which is an amorphous semiconductor crystallized with light energy or thermal energy; a semiamorphous (also referred to as microcrystalline) semiconductor (hereinafter also referred to as SAS); or the like can be used as a material for forming the semiconductor layer. The semiconductor layer can be formed by a sputtering method, an LPCVD method, a plasma CVD method, or the like.

SAS is a semiconductor having an intermediate structure between an amorphous structure and a crystalline structure (including a single crystal and a polycrystal) and having a third state which is stable in terms of free energy, and includes a crystalline region having short-range order and lattice distortion. The SAS is formed by glow discharge decomposition (plasma CVD) of a gas containing silicon. $SiH_4$ is used as the gas containing silicon. Alternatively, $Si_2H_6$, $SiH_2Cl_2$, $SiHCl_3$, $SiCl_4$, $SiF_4$, or the like can be used. Further, $F_2$ or $GeF_4$ may be mixed. This gas containing silicon may be diluted with $H_2$, or $H_2$ and one or more rare gas elements selected from He, Ar, Kr, and Ne. An SAS layer formed using a hydrogen-based gas and an SAS layer formed using a fluorine-based gas are stacked to be the semiconductor layer.

The amorphous semiconductor is typified by hydrogenated amorphous silicon, and the crystalline semiconductor is typified by polysilicon or the like. Polysilicon (polycrystalline silicon) includes so-called high-temperature polysilicon which contains polysilicon that is formed at a process temperature of 800° C. or higher as the main component; so-called low-temperature polysilicon which contains polysilicon that is formed at a process temperature of 600° C. or lower as the main component; polysilicon which is crystallized with an element for promoting crystallization or the like added thereto; and the like. Needless to say, as described above, either a semiconductor which contains a crystalline phase in a portion of a semiconductor layer or a semiamorphous semiconductor can also be used.

As the material for the semiconductor, an elementary substance such as silicon (Si) or germanium (Ge), or a compound semiconductor such as GaAs, InP, SiC, ZnSe, GaN, or SiGe can alternatively be used. Further, zinc oxide (ZnO), tin oxide ($SnO_2$), or the like which is an oxide semiconductor can be used. In the case of using ZnO for the semiconductor layer, $Y_2O_3$, $Al_2O_3$, $TiO_2$, a stacked layer thereof, or the like may be used for the gate insulating layer, and ITO, Au, Ti, or the like may be used for the gate electrode layer, the source electrode layer, and the drain electrode layer. In addition, In, Ga, or the like can be added to ZnO.

In the case where a crystalline semiconductor layer is used as the semiconductor layer, a laser crystallization method, a thermal crystallization method, a thermal crystallization method using an element promoting crystallization such as nickel, or the like may be employed as a method for manufacturing the crystalline semiconductor layer. A microcrystalline semiconductor, which is an SAS, can be crystallized by laser light irradiation to enhance the crystallinity. In the case where the element promoting crystallization is not introduced, hydrogen is released until the concentration of hydrogen contained in an amorphous silicon film becomes $1\times10^{20}$ atoms/cm$^3$ or less by heating the amorphous silicon film at a temperature of 500° C. for one hour in a nitrogen atmosphere before irradiating the amorphous silicon film with laser light. This is because the amorphous silicon film containing much hydrogen is damaged when irradiated with laser light.

Any method can be used for introducing a metal element into the amorphous semiconductor layer as long as the method is capable of making the metal element exist on the surface of or inside the amorphous semiconductor layer. For example, a sputtering method, a CVD method, a plasma treatment method (including a plasma CVD method), an adsorption method, or a method for applying a metal salt solution can be employed. Among them, the method using a solution is simple, and advantageous in terms of easy concentration control of the metal element. It is preferable that an oxide film be formed by UV light irradiation in an oxygen atmosphere, a thermal oxidation method, a treatment with ozone water or hydrogen peroxide including a hydroxyl radical, or the like, in order to improve wettability of the surface of the amorphous semiconductor layer and to spread the aqueous solution over the entire surface of the amorphous semiconductor layer.

In a crystallization step in which an amorphous semiconductor layer is crystallized to form a crystalline semiconductor layer, crystallization may be performed by adding an element which promotes crystallization (also referred to as a catalyst element or a metal element) to the amorphous semiconductor layer and performing heat treatment (at 550° C. to 750° C. for 3 minutes to 24 hours). As for the element which promotes crystallization, one or more plural kinds of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used as a metal element which promotes crystallization of silicon.

In order to remove or reduce the element which promotes crystallization from the crystalline semiconductor layer, a semiconductor layer containing an impurity element is formed in contact with the crystalline semiconductor layer and used as a gettering sink. The impurity element may be an impurity element imparting n-type conductivity, an impurity element imparting p-type conductivity, or a rare gas element, for example, one or plural kind of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. The semiconductor layer containing a rare gas element is formed on the crystalline semiconductor layer containing the element which promotes crystallization, and heat treatment (at 550° C. to 750° C. for 3 minutes to 24 hours) is performed. The element which promotes crystallization in the crystalline semiconductor layer moves into the semiconductor layer containing a rare gas element, and the element which promotes crystallization in the crystalline semiconductor layer is removed or reduced. Then, the semiconductor layer containing a rare gas element, which serves as a gettering sink, is removed.

Heat treatment and laser light irradiation may be combined, alternatively, one of the heat treatment and the laser light irradiation may be performed plural times for crystallization of the amorphous semiconductor layer.

The crystalline semiconductor layer may be directly formed over the substrate by a plasma method. Alternatively, the crystalline semiconductor layer may be selectively formed over the substrate by a plasma method.

The semiconductor layer can be formed using an organic semiconductor material by a printing method, a spray method, a spin coating method, a droplet discharging method, or the like. In this case, the foregoing etching step is not necessary, so that the number of steps can be reduced. A low molecular material, a high molecular material, or the like is used as the organic semiconductor material, and, a material such as an organic pigment or a conductive high molecular material can also be used. A π-electron conjugated high molecular material having a skeleton including conjugated double bonds is preferably used as the organic semiconductor material used in the present invention. Typically, a soluble high molecular material such as polythiophene, polyfluorene, poly(3-alkylthiophene), or a polythiophene derivative, pentacene, or the like can be used.

In addition, there is a material which can be used as the organic semiconductor material in the present invention; the semiconductor layer using the organic semiconductor material can be formed by depositing a soluble precursor of the material and then performing treatment thereon. Note that polythienylenevinylene, poly(2,5-thienylenevinylene), polyacetylene, a polyacetylene derivative, polyallylenevinylene, or the like can be used as such an organic semiconductor material.

In converting the precursor into an organic semiconductor, a reaction catalyst such as a hydrogen chloride gas is added in addition to heat treatment. The following are typical solvents which dissolve the soluble organic semiconductor material and can be employed: toluene, xylene, chlorobenzene, dichlorobenzene, anisole, chloroform, dichloromethane, γ butyl lactone, butyl cellosolve, cyclohexane, NMP (N-methyl-2-pyrrolidone), cyclohexanone, 2-butanone, dioxane, dimethylformamide (DMF), THF (tetrahydrofuran), or the like.

A semiconductor layer 107 and a semiconductor layer 108 are formed over the source or drain electrode layer 109a and the source or drain electrode layer 109b, and the source or drain electrode layer 110a and the source or drain electrode layer 110b, respectively. In this embodiment mode, the semiconductor layer 107 and the semiconductor layer 108 are formed using pentacene. Through the foregoing steps, a thin film transistor 130 having an inverted coplanar structure and a thin film transistor 131 having an inverted coplanar structure in this embodiment mode can be manufactured (see FIGS. 7A to 7C).

Before the formation of the semiconductor layer, an organosilane film having a hydrolytic group may be formed in a formation region of the semiconductor layer in order to improve mobility of the semiconductor layer as described in Embodiment Mode 1 with reference to FIGS. 2A to 2C. An organosilane film having a hydrolytic group is formed in the formation region of the semiconductor layer. For example, pentacene may be used as the semiconductor layer and octadecyltrimethoxysilane (ODS) may be used as the organosilane film having a hydrolytic group. Octadecyltrimethoxysilane is effective on improvement in mobility of pentacene.

Figure 7A:
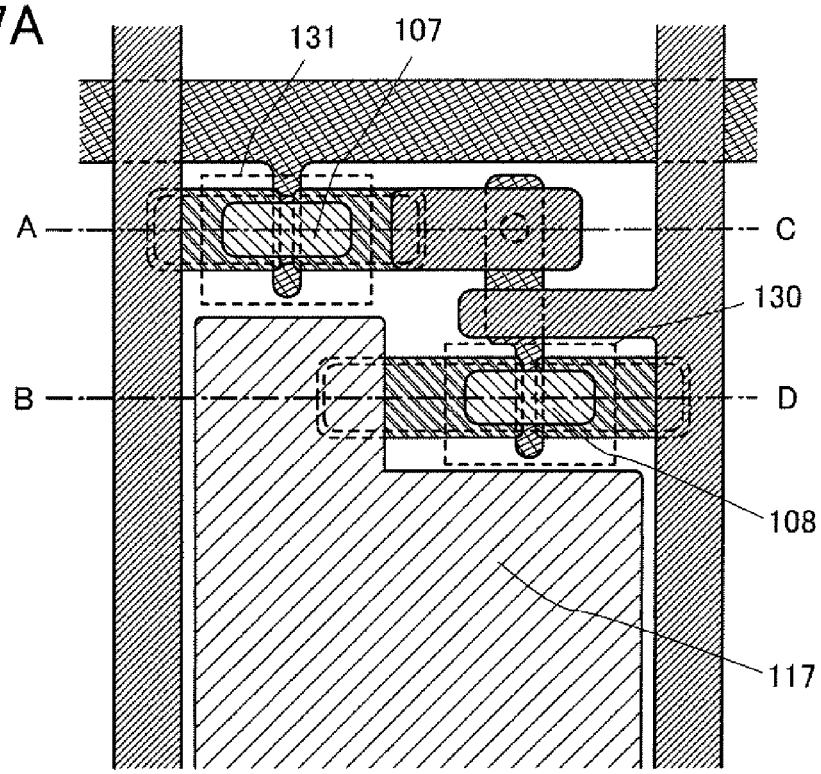
FIGS. 7A to 7C are views illustrating a manufacturing method of a display device of the present invention.
Figure 7B:
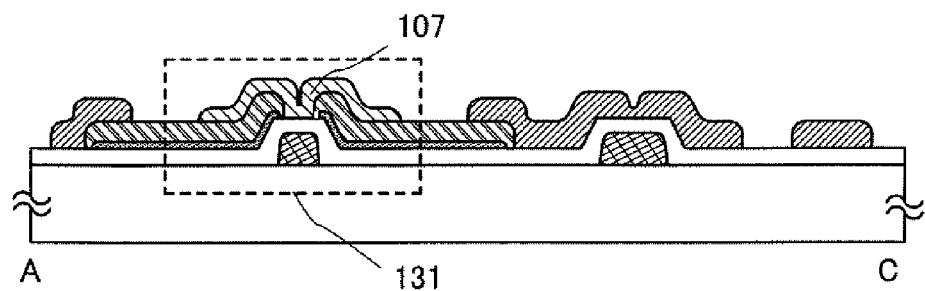
Figure 7C:
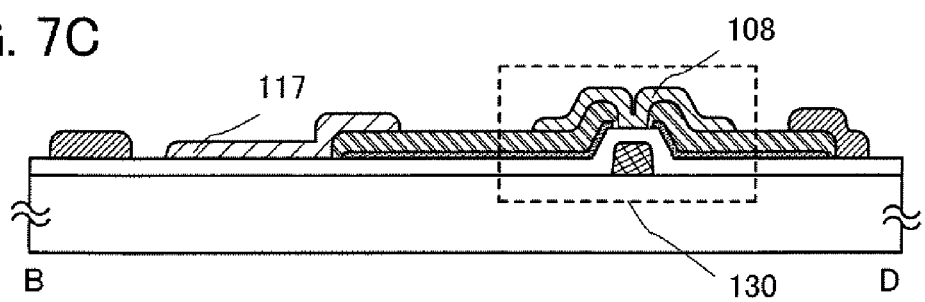
Figure 8A:
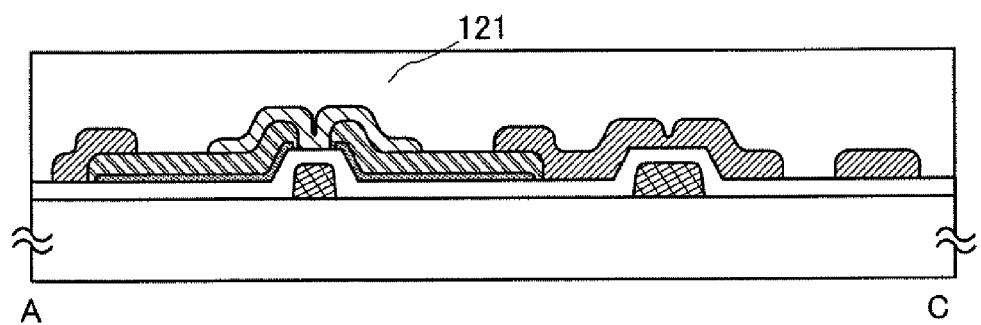
FIGS. 8A and 8B are views illustrating a manufacturing method of a display device of the present invention.
Figure 8B:
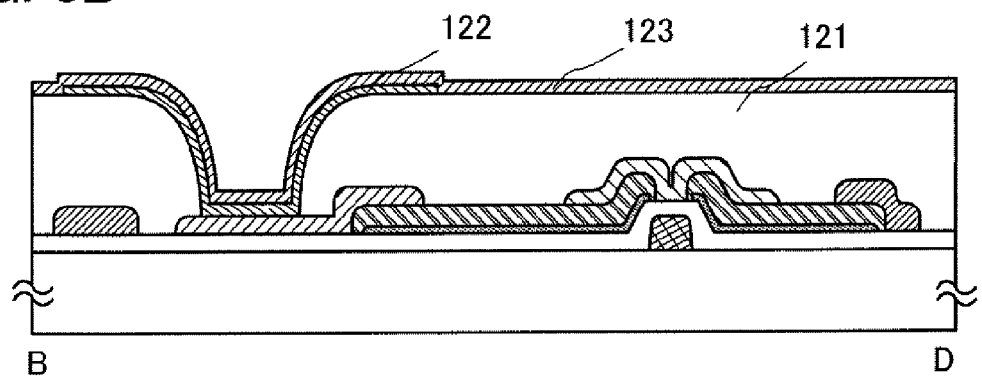

Then, a composition containing a conductive material is selectively discharged over the gate insulating layer 105 to form a first electrode layer 117 (see FIGS. 7A to 7C). In the case where light is emitted from the substrate 100 side, the first electrode layer 117 can be formed by forming a predetermined pattern using a composition and by baking the pattern. The composition contains indium tin oxide (ITO), indium tin oxide containing silicon oxide (ITSO) indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like. In this embodiment mode a composition containing ITO is discharged and baked to form the first electrode layer 117.

Examples of composition ratios of the conductive material having a light transmitting property are described. As for indium oxide containing tungsten oxide, the composition ratio of tungsten oxide to indium oxide may be 1.0 wt % to 99.0 wt %. As for indium zinc oxide containing tungsten oxide, the composition ratio of tungsten oxide to zinc oxide to indium oxide may be 1.0 wt % to 0.5 wt % to 98.5 wt %. As for indium oxide containing titanium oxide, titanium oxide to indium oxide may be 1.0 to 5.0 wt % to 95.0 to 99.0 wt %. As for indium tin oxide (ITO), the composition ratio of tin oxide to indium oxide may be 10.0 wt % to 90.0 wt %. As for indium zinc oxide (IZO), the composition ratio of zinc oxide to indium oxide may be 10.7 wt % to 89.3 wt %. As for indium tin oxide containing titanium oxide, the composition ratio of titanium oxide to tin oxide to indium oxide may be 5.0 wt % to 10.0 wt % to 85.0 wt %. The foregoing composition ratios are examples, and the composition ratios may be appropriately set.

Even in the case of using a material which does not have a light transmitting property, such as a metal film, light can be emitted through the first electrode layer 117 by making the first electrode layer 117 very thin (preferably, a thickness of about 5 nm to 30 nm) so as to transmit light. As a metal thin film which can be used for the first electrode layer 117, a conductive film formed of titanium, tungsten, nickel, gold, platinum, silver, aluminum, magnesium, calcium, lithium, zinc, or an alloy thereof or a film formed of a compound material containing any of the foregoing elements as its main component, such as titanium nitride $TiSi_xN_y$, $WSi_x$, tungsten nitride, $WSi_xN_y$, or NbN can be used.

As long as the first electrode layer 117 is electrically connected to the source or drain electrode layer 110a, the connection structure is not limited to this embodiment mode. A structure may be employed in which an insulating layer serving as an interlayer insulating layer is formed over the source or drain electrode layer 110a and is electrically connected to the first electrode layer 117 by a wiring layer. In this case, an opening (contact hole) is not necessarily formed by removing the insulating layer. Instead of that, the following method may be employed. A liquid repellent substance with respect to the insulating layer is formed over the source or drain electrode layer 110a and a composition containing an insulating material is applied by a coating method or the like, so that the insulating layer is formed in a region except for a region where the liquid repellent substance is formed.

The insulating layer is formed by solidification by heating, drying, or the like. Then, the liquid repellent substance is removed and an opening is formed. The wiring layer is formed to fill this opening, and the first electrode layer 117 is formed to be in contact with this wiring layer. This method has an advantageous effect of simplifying a process because this method does not need formation of an opening portion by etching.

In the case of making a structure in which generated light is emitted to the side opposite to the substrate 100 side (the case of manufacturing a top emission type display panel), a composition which contains metal particles of Ag (silver), Au (gold), Cu (copper), W (tungsten), Al (aluminum), or the like as its main component can be used. As another method, the first electrode layer 117 may be formed in such a way in which a transparent conductive film or a light-reflecting conductive film is formed by a sputtering method, and a mask pattern is formed by a droplet discharging method, then an etching process is also performed.

The first electrode layer 117 may be wiped and polished by a CMP method or with a polyvinyl alcohol-based porous body so that the surface thereof is planarized. In addition, after polishing by a CMP method, ultraviolet irradiation, oxygen plasma treatment, or the like may be performed on the surface of the first electrode layer 117.

Through the foregoing steps, a TFT substrate for a display panel is completed in which an inverted coplanar thin film transistor is connected to the first electrode layer 117 over the substrate 100.

Next, an insulating layer 121 (also referred to as a partition wall) is selectively formed. The insulating layer 121 is formed to have an opening portion over the first electrode layer 117. In this embodiment mode, the insulating layer 121 is formed over the entire surface, and etched and processed using a mask of a resist or the like. When the insulating layer 121 is formed by a droplet discharging method, a printing method, or the like, by which the insulating layer 121 can be selectively formed directly, processing by etching is not always needed.

The insulating layer 121 can be formed of silicon oxide, silicon nitride, silicon oxynitride, aluminum oxide, aluminum nitride, aluminum oxynitride, or another inorganic insulating material; acrylic acid, methacrylic acid, or a derivative thereof; a heat-resistant high molecular material such as polyimide, aromatic polyamide, or polybenzimidazole; or a siloxane resin material. The insulating layer 121 may also be formed by using a photosensitive or non-photosensitive material such as acrylic or polyimide. The insulating layer 121 preferably has a shape in which a curvature radius changes continuously so as to improve coverage of an electroluminescent layer 122 and a second electrode layer 123 to be formed over the insulating layer 121.

A light emitting element is formed over the substrate 100, which is a TFT substrate for a display panel (see FIGS. 5A and 5B).

Heat treatment is performed at 200° C. under atmospheric pressure to remove moisture in the first electrode layer 117 and the insulating layer 121 or moisture adsorbed onto the surfaces thereof before forming the electroluminescent layer 122. It is preferable to perform heat treatment at 200 to 400° C., preferably, 250 to 350° C. under reduced pressure and to form the electroluminescent layer 122 by a vacuum vapor deposition method or a droplet discharging method under reduced pressure successively, without the substrate 100 being exposed to air.

As the electroluminescent layer 122, each of materials exhibiting light emission of red (R), green (G), and blue (B) is selectively formed by a vapor deposition method using an evaporation mask, or the like. The materials exhibiting light emission of red (R), green (G), and blue (B) (low molecular materials, high molecular materials, or the like) can be deposited by a droplet discharging method as in the case of a color filter, which is preferable because R, G, and B can be separately applied without using masks. The second electrode layer 123 is stacked over the electroluminescent layer 122, thus, a display device having a display function using a light emitting element is completed.

Although not shown, it is effective to provide a passivation film so as to cover the second electrode layer 123. The passivation film which is provided at the time of forming a display device may have a single layer structure or a multi-layer structure. As the passivation film, a single layer of or a stacked layer of an insulating film containing silicon nitride (SiN), silicon oxide ($SiO_2$), silicon oxynitride (SiON), silicon nitride oxide (SiNO), aluminum nitride (AlN), aluminum oxynitride (AlON), aluminum nitride oxide (AlNO) which contains more nitrogen than oxygen, or aluminum oxide, diamond-like carbon (DLC), or a nitrogen-containing carbon film ($CN_X$) can be used. For example, a stacked layer of a nitrogen-containing carbon film ($CN_X$) and silicon nitride (SiN) can be used. Alternatively, an organic material can be used, for example, a stacked layer of a high molecular material such as a styrene polymer may be used. Further, a siloxane material (inorganic siloxane, organic siloxane) may be used.

At this time, it is preferable to use a film having good coverage as the passivation film. A carbon film, especially, a DLC film is effective. The DLC film can be formed at a temperature ranging from room temperature to 100° C.; therefore, the DLC film can be easily formed over an electroluminescent layer having low heat resistance. The DLC film can be formed by a plasma CVD method (typically, an RF plasma CVD method, a microwave CVD method, an electron cyclotron resonance (ECR) CVD method, a heat filament CVD method, or the like), a combustion flame method, a sputtering method, an ion beam evaporation method, a laser evaporation method, or the like. A hydrogen gas and a hydrocarbon-based gas (for example, $CH_4$, $C_2H_2$, $C_6H_6$, or the like) are used as a reaction gas which is used for forming the passivation film. The reaction gas is ionized by glow discharge, and the ions are accelerated to collide with a cathode with negative self bias applied, so that the passivation film is formed. A CN film may be formed using a $C_2H_4$ gas and an $N_2$ gas as the reaction gas. The DLC film has a high blocking effect on oxygen and can suppress oxidation of the electroluminescent layer. Accordingly, the electroluminescent layer can be prevented from being oxidized during the next sealing step.

As shown in FIG. 9B, a sealant 136 is formed and sealing is performed using a sealing substrate 145. Then, a gate wiring layer formed to electrically connect to the gate electrode layer 103 may be connected to a flexible wiring board for external electrical connection. This applies to a source wiring layer formed to be electrically connected to the wiring layer 111.

The space between the substrate 100 having the element and the sealing substrate 145 is filled with a filler 135 and sealed. The space can be filled with the filler by a dropping method as is the case with a liquid crystal material described in Embodiment Mode 3. Instead of the filler 135, the space may be filled with an inert gas such as nitrogen. In addition, by providing a drying agent within the display device, deterioration of the light emitting element due to moisture can be prevented. The position of the drying agent may be either on the sealing substrate 145 side or on the substrate 100 having the element side. Alternatively, the drying agent may be provided in a depression formed in the region provided with the sealant 136 in the substrate. When the drying agent is provided in an area which does not contribute to displaying, such as a driver circuit region or a wiring region of the sealing substrate 145, the aperture ratio is not decreased even when the drying agent is opaque. Further, the filler 135 may be formed to contain a material having a moisture absorbing property in order to serve as a drying agent. Accordingly, the display device having a display function using the light emitting element is completed (see FIGS. 9A and 9B).

An FPC 139 is attached to a terminal electrode layer 137 for electrically connecting the inside of the display device and the outside thereof with an anisotropic conductive film 138 so as to be electrically connected to the terminal electrode layer 137.

FIG. 9A is a top view of the display device. As shown in FIG. 9A, a pixel region 150, a scanning line driver region 151*a*, a scanning line driver region 151*b*, and a connecting region 153 are sealed between the substrate 100 and the sealing substrate 145 with the sealant 136, and a signal line side driver circuit 152 formed using a driver IC is provided over the substrate 100. The driver circuit region is provided with thin film transistors 133 and 134, and a pixel portion is provided with the thin film transistors 130 and 131.

In this embodiment mode, the case in which the light emitting element is sealed with a glass substrate is described. Sealing treatment is treatment for protecting the light emitting element from moisture, and any of a method in which a light emitting element is mechanically sealed with a cover material, a method in which a light emitting element is sealed with a thermosetting resin or an ultraviolet curable resin, and a method in which a light emitting element is sealed with a thin film of metal oxide, metal nitride, or the like having high barrier capability, can be used. As for the cover material, glass, ceramics, plastics, or metal can be used. The cover material needs to have a light transmitting property when light is emitted to the cover material side. The cover material is attached to the substrate provided with the above-mentioned light emitting element with a sealant such as a thermosetting resin or an ultraviolet curable resin, and the resin is cured with heat treatment or ultraviolet light irradiation treatment, so that an enclosed space is formed. It is also effective to provide a moisture absorbing material typified by barium oxide in the enclosed space. This moisture absorbing material may be provided over the sealant or over a partition wall or a peripheral part so as not to block light emitted from the light emitting element. Further, it is also possible to fill the space between the cover material and the substrate provided with the light emitting element using a thermosetting resin or an ultraviolet curable resin. In this case, it is effective to add a moisture absorbing material typified by barium oxide in the thermosetting resin or the ultraviolet curable resin.

In this embodiment mode, although an example in which a switching TFT with a single gate structure is described in detail, a multi-gate structure such as a double gate structure may also be employed. In the case where a semiconductor layer is manufactured using an SAS or a crystalline semiconductor, an impurity region can be formed by adding an impurity which imparts one conductivity type. In this case, a semiconductor layer may have impurity regions having different concentrations. For example, the semiconductor layer may have a low concentration impurity region in the vicinity of a channel formation region and a region which overlaps with the gate electrode layer, and may have a high concentration impurity region outside the low concentration region.

In this embodiment mode, the manufacturing process can be simplified as described above. By forming various components (parts) and a mask layer directly over a substrate by a droplet discharging method, a display panel can be easily manufactured even in the case of using a glass substrate of the fifth generation or later having a side of more than 1000 mm.

In this embodiment mode, a source electrode layer and a drain electrode layer are formed in a self-aligned manner. Accordingly, a defective shape or the like due to misalignment of a mask does not occur and wirings can be formed with good controllability. Therefore, a highly-reliable semiconductor device, display device, and the like can be manufactured with high yield according to the present invention.

Embodiment Mode 3

An embodiment mode of the present invention is described with reference to FIGS. 15A to 19B. This embodiment mode describes an example in which a display device is manufactured using an inverted coplanar thin film transistor having a bottom gate structure which is manufactured in a self-aligned manner through a simplified manufacturing process and at low cost according to the present invention is applied. FIGS. 15A, 16A, 17A, and 18A are top views of a pixel portion of a display device, FIGS. 15B, 16B, 17B, and 18B are cross-sectional views taken along the lines E-F in steps of forming FIGS. 15A, 16A, 17A, and 18A. FIG. 19A is also a top view of a display device, and FIG. 19B is a cross-sectional view taken along a line O-P (including a line U-W) in FIG. 19A. Note that as an example of a display element, a liquid crystal display device using a liquid crystal material is described. Repetitive explanation of the same portion or a portion having a similar function is omitted.

In this embodiment mode, the present invention is employed in manufacturing a source electrode layer, a drain electrode layer, a capacitor wiring layer, and another wiring layer. A gate electrode layer 203 is formed over a substrate 200, and a gate insulating layer 202 is formed to cover the gate electrode layer 203. The gate insulating layer 202 contains an inorganic material.

In the present invention, in irradiating an organic layer containing a photopolymerizable reactive group formed over the substrate 200 with light, light irradiation is performed by rear light-exposure from the substrate 200 side through the substrate 200 to polymerize the organic layer containing a photopolymerizable reactive group which is formed. Accordingly, the substrate 200 needs to be formed using a substance which transmits enough light (wavelength, energy, or the like of light) to polymerize the organic layer containing a photopolymerizable reactive group. The gate insulating layer 202 needs to have a light transmitting property as well as the substrate 200. On the other hand, the gate electrode layer 203 serves as a mask which blocks light at the time of rear light-exposure; therefore, the gate electrode layer 203 needs to have a non-light transmitting property with respect to light to be used.

The gate electrode layer 203 can be formed using a CVD method, a sputtering method, a droplet discharging method, and the like. The gate electrode layer 203 may be formed of an element selected from Ag, Au, Ni, Pt, Pd, Ir, Rh, Ta, W, Ti, Mo, Al, and Cu, or an alloy material or a compound material containing any of the foregoing elements as its main component. Alternatively, a semiconductor film typified by a polycrystalline silicon film doped with an impurity element, such as phosphorus, or an AgPdCu alloy may be used. The gate electrode layer 203 may have either a single layer structure or a multi-layer structure. For example, the gate electrode layer 203 may have a two-layer structure of a tungsten nitride film and a molybdenum (Mo) film, or a three-layer structure in which a tungsten film having a thickness of 50 nm, a film of an alloy of aluminum and silicon (Al—Si) having a thickness of 500 nm, and a titanium nitride film having a thickness of 30 nm are sequentially stacked may be used. Further, in the case of the three-layer structure, tungsten nitride may be used instead of tungsten of a first conductive film, a film of an alloy of aluminum and titanium (Al—Ti) may be used instead of the film of an alloy of aluminum and silicon (Al—Si) as a second conductive film, and a titanium film may be used instead of the titanium nitride film as a third conductive film.

When etching processing is needed to form the gate electrode layer 203, a mask may be formed ant the etching processing may be performed with dry etching or wet etching. The electrode layer can be etched into a tapered shape by an inductively coupled plasma (ICP) etching method with the etching condition (the amount of electric power applied to a coiled electrode, the amount of electric power applied to an electrode on a substrate side, the temperature of the electrode on the substrate side, or the like) appropriately adjusted. Note that a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be appropriately used as an etching gas.

In this embodiment mode, a source electrode layer and a drain electrode layer of a transistor are formed in a self-aligned manner by forming an organic polymer layer and performing liquid-repellent treatment. In addition, the organic polymer layer is formed by selectively polymerizing an organic layer containing a photopolymerizable reactive group by rear light-exposure. Difference in adsorption property for a liquid repellent between a gate insulating layer containing an inorganic material and the organic polymer layer is utilized to make wettability of the gate insulating layer and that of the organic polymer layer be different from each other. When a composition containing a conductive material is discharged in regions with thus controlled wettability, a source electrode layer and a drain electrode layer can be formed only over the organic polymer layer. In this manner, a thin film transistor can be manufactured in a self-aligned manner. Therefore, according to the present invention, a display device and the like can be manufactured at low cost and with high productivity.

The shape of the organic layer containing a photopolymerizable reactive group may be processed using a resist mask, an evaporation mask, or the like and the foregoing droplet discharging (ejecting) method, a printing method (such as screen (mimeograph) printing, offset (planography) printing, relief printing, or gravure (intaglio) printing), a dispenser method, or the like may be combined therewith. By selectively forming the organic polymer layer formed by selectively polymerizing the organic layer containing a photopolymerizable reactive group by a droplet discharging method as described in this embodiment mode, a manufacturing process is more simplified.

In this embodiment mode, an organic layer 201a containing a photopolymerizable reactive group and an organic layer 201b containing a photopolymerizable reactive group are selectively formed by a droplet discharging method. A liquid composition containing an organic material containing a photopolymerizable reactive group is discharged from a droplet discharging apparatus to form the organic layer 201a containing a photopolymerizable reactive group and the organic layer 201b containing a photopolymerizable reactive group (see FIGS. 15A and 15B). The organic layer 201a containing a photopolymerizable reactive group and the organic layer 201b containing a photopolymerizable reactive group are solidified by drying or baking. In this embodiment mode, the organic polymer layer which is formed by selective polymerization of the organic layer containing a photopolymerizable reactive group is formed by discharging a solution in which polyvinylcinnamate is dissolved in dimethylformamide and solidifying the solution in a film shape by drying or heating treatment. In this specification, a film formed by a droplet discharging method, which is described as a film, may be extremely thin depending on its formation conditions, and the film does not necessarily maintain the form of a film; for example, it may have a discontinuous island structure or the like.

The organic layers 201a and 201b containing a photopolymerizable reactive group may be formed of a material with which a light irradiation portion thereof becomes poorly soluble (difficult to be dissolved) in a specific organic solvent. A material which is cross-linked or polymerized by light irradiation can be used, for example, a photodimerization resin having a cinnamoyl group, a cinnamylidene group, a phenylenediacrylate group, or the like; a diazo-based compound, such as diazonium salt or diazoxide; a mixture of a resin having a hydroxyl group, such as polyvinyl alcohol, and a diazo-based compound; a monomer or an oligomer having a vinyl group, such as acrylate polymerized by light irradiation.

Figure 16A:
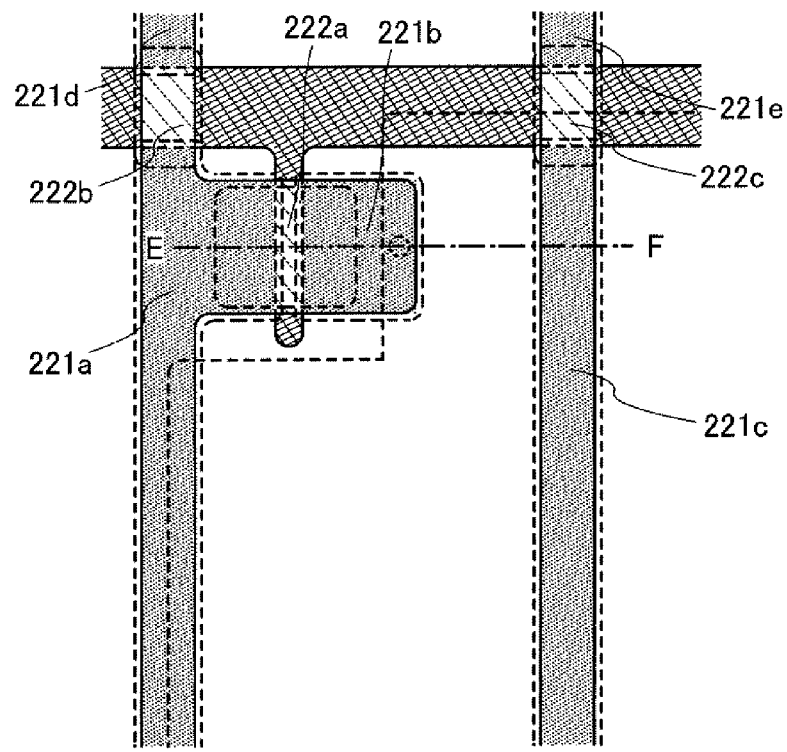
FIGS. 16A to 16C are views illustrating a manufacturing method of a display device of the present invention.
Figure 16B:
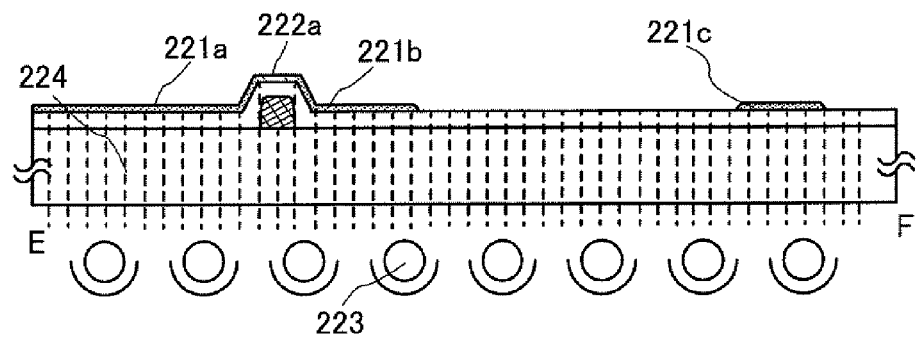

The organic layers 201a and 201b containing a photopolymerizable reactive group are irradiated with light 224 which is emitted from a light source 223 to the light-transmitting substrate 200 and passes through the light-transmitting substrate 200 (see FIGS. 16A and 16B). The light 224 passes through the light-transmitting substrate 200 and the gate insulating layer 202, but does not pass through and is blocked by the gate electrode layer 203, which has a non-light transmitting property. Therefore, in the organic layers 201a and 201b containing a photopolymerizable reactive group, regions overlapping with the gate electrode layer 203 become light-unexposed regions 222a, 222b, and 222c and the organic polymer layer which is formed by selective polymerization of the organic layer containing a photopolymerizable reactive group in light-exposed regions 221a, 221b, 221c, 221d, and 221e is modified by light. In this embodiment mode, the organic polymer layers which are formed by selective polymerization of the organic layer containing a photopolymerizable reactive group in the light-exposed regions 221a, 221b, 221c, 221d, and 221e are cross-linked or polymerized so as to be poorly soluble in an organic solvent. The light 224 may be light with a wavelength and intensity which polymerize the organic layer containing a photopolymerizable reactive group, and ultraviolet light with a wavelength of 300 nm to 350 nm is used in this embodiment mode.

Figure 16C:
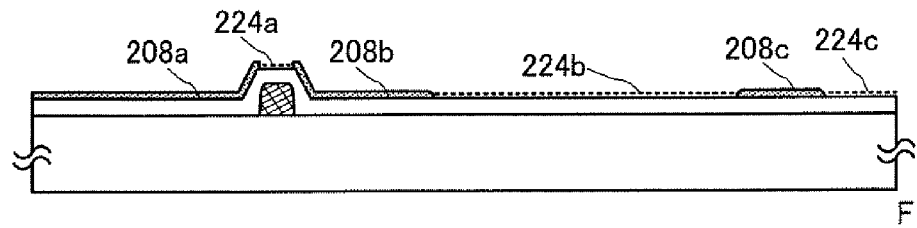
Figure 18A:
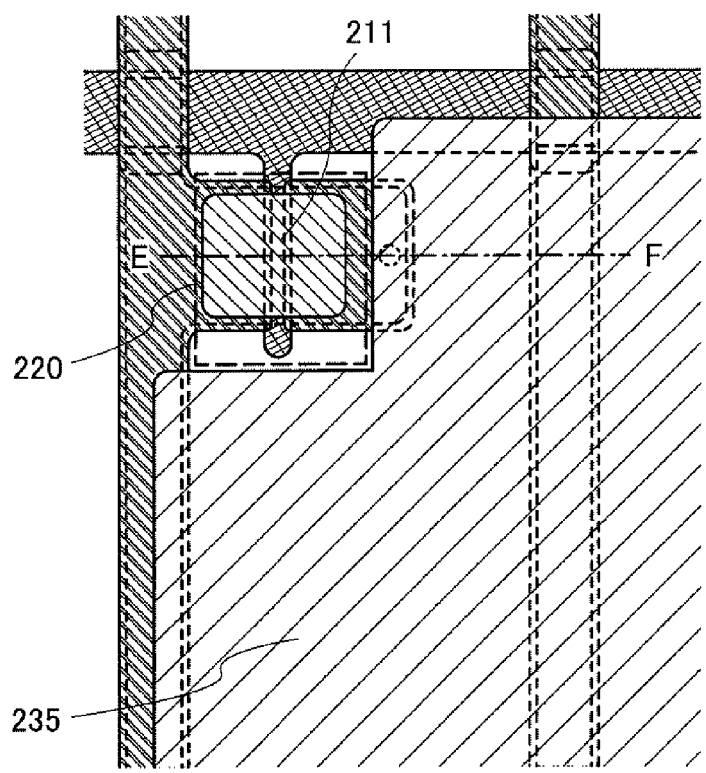
FIGS. 18A and 18B are views illustrating a manufacturing method of a display device of the present invention.
Figure 18B:
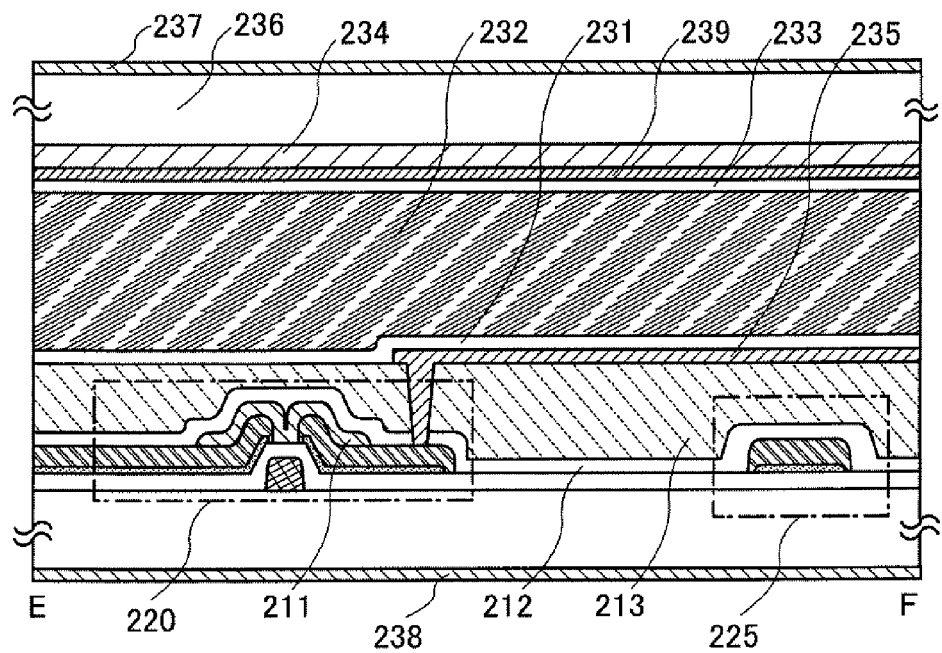

The organic layer containing a photopolymerizable reactive group in the light-unexposed region is removed with an organic solvent, and organic polymer layers 208a, 208b, and 208c are formed (see FIG. 16C). FIG. 16C is a step following a step of FIG. 16B. As the organic solvent, one which can selectively dissolve only the light-unexposed region without dissolving the light-exposed region is selected. In this embodiment mode, the organic polymer layer which is formed by selective polymerization of the layer containing a photopolymerizable reactive group is immersed in dimethylformamide to form the organic polymer layers 208a, 208b, and 208c.

Then, liquid-repellent treatment is performed with organosilane having a hydrolytic group in order to control wettability. In this embodiment mode, hexamethyldisilazane (HMDS) is used as the organosilane having a hydrolytic group. Organosilane films 224a, 224b, and 224c having a hydrolytic group is adsorbed to the gate insulating layer more closely than to the organic polymer layer. Organosilane having a hydrolytic group has a liquid-repellent property against a composition containing a conductive material, which is a material for forming a source electrode layer and a drain electrode layer; therefore, the surface of the gate insulating layer, to which organosilane having a hydrolytic group is closely adsorbed, has low wettability with respect to the composition containing a conductive material than surfaces of the organic polymer layers 208a, 208b, and 208c. In FIGS. 16A to 16C, the organosilane films 224a, 224b, and 224c of having a hydrolytic group over the gate insulating layer are denoted by dotted lines in order to show that the organosilane having a hydrolytic group is closely adsorbed to the gate insulating layer.

The light-unexposed regions 222a, 222b, and 222c are regions where a source electrode layer, a drain electrode layer, and a capacitor wiring layer is to be formed. In this embodiment mode, the source electrode layer, the drain electrode layer, and the capacitor wiring layer are formed by a droplet discharging method; therefore, a mask layer is formed so that the organosilane film having a hydrolytic group is not formed over the light-unexposed regions 222a, 222b, and 222c. The mask layer may be the same as the organic layer containing a photopolymerizable reactive group.

Before the formation of the organosilane film having a hydrolytic group, ultraviolet ozone treatment, oxygen ($O_2$) ashing, or the like is preferably performed. By ultraviolet ozone treatment or oxygen ($O_2$) ashing, an organic substance over the gate insulating layer is decomposed, organosilane having a hydrolytic group is easily adsorbed over the gate insulating layer, and a hydroxyl group is introduced to the organic polymer layer so that wettability of the organic polymer layer can be enhanced.

A droplet containing the conductive material is discharged through a nozzle of a droplet discharging apparatus 207 to the region where the source electrode layer, the drain electrode layer, and a capacitor wiring layer are to be formed, that is, the organic polymer layers 208a, 208b, and 208c. The droplet which is discharged is not attached to the organosilane films 224a, 224b, and 224c having a hydrolytic group over the gate insulating layer, which are the low wettability regions, and are attached to the organic polymer layers 208a, 208b, and 208c, which are high wettability regions with higher wettability than the low wettability region. Even if the discharging method of the conductive material cannot be precisely controlled depending on a size, scanning capability, or the like of a discharge outlet of the nozzle through which the droplet is discharged; by the liquid-repellent treatment for the region other than the region where the source and drain electrode layers and the capacitor wiring layer are to be formed, the droplet is attached only to the region where the source and drain electrode layers and the capacitor wiring layer are to be formed, so that source and drain electrode layers 204 and 205 and a capacitor wiring layer 206 are formed into a desired pattern (see FIGS. 17A and 17B). This is because the region where the source and drain electrode layers and the capacitor wiring layer are to be formed and a region therearound have different wettability from each other, so that the droplet is repelled by the low wettability region and remains in a formation region of the source and drain electrode layers and the capacitor wiring layer with higher wettability. In other words, since the droplet is repelled by the low wettability region, the boundary between the high wettability region and the low wettability region serves as a partition wall. Accordingly, even a fluid composition containing a conductive material remains in the high wettability region; therefore, the source and drain electrode layers can be formed into desired shapes.

According to the present invention, for example, in the case of forming a minute electrode layer, a conductive layer can be formed only in a formation region of the electrode layer, without a droplet spreading over the formation region, even if a discharge outlet is large to a certain degree. Therefore, a defect, such as short circuit which may occur when the electrode layer fails to be formed in a region where the electrode layer is not to be formed can be prevented. When the surface of a substance is modified by light irradiation from a substrate side as in this embodiment mode, the productivity is improved because a large area can be treated as well as the conductive layer can be formed with good controllability. In addition, when a droplet discharging method is combined, less material is wasted and the cost can be reduced compared to a method in which a material is applied over the entire surface, such as a spin coating method. According to the present invention, even when a wiring and the like and are arranged densely and complexly due to reduction in size and film thickness, the wirings and the like can be formed with good controllability.

The organosilane film having a hydrolytic group which is formed in pretreatment may remain after the formation of the source and drain electrode layers, or an unnecessarily part thereof may be removed after the formation of the source and drain electrode layers. The organosilane film having a hydrolytic group may be removed by ashing with oxygen or the like, etching, plasma treatment, or the like. In this embodiment mode, the organosilane films 224a, 224b, and 224c having a hydrolytic group are removed.

In this embodiment mode, a source electrode layer and a drain electrode layer are formed in a self-aligned manner. Accordingly, a defective shape or the like due to misalignment of a mask does not occur and wirings can be formed with good controllability. Therefore, a highly-reliable semiconductor device, display device, and the like can be manufactured with high yield according to the present invention.

As the conductive material for forming the source electrode layer, the drain electrode layer, and the capacitor wiring layer by a droplet discharging method as described in this embodiment mode, a composition containing a metal particle of Ag (silver), Au (gold), Cu (copper), W (tungsten), Al (aluminum), or the like as its main component can be used. Indium tin oxide (ITO), ITSO containing indium tin oxide and silicon oxide, organic indium, organic tin, zinc oxide, titanium nitride, or the like which has a light transmitting property may be combined therewith.

A semiconductor layer 211 is formed over the source or drain electrode layer 204 and the source or drain electrode layer 205. In this embodiment mode, the semiconductor layer 211 is formed using pentacene. Through the foregoing steps, a thin film transistor 220 having an inverted coplanar structure a capacitor 225 in this embodiment mode can be manufactured (see FIGS. 18A and 18B).

Before the formation of the semiconductor layer, an organosilane film having a hydrolytic group may be formed in a formation region of the semiconductor layer in order to improve mobility of the semiconductor layer as described in Embodiment Mode 1 with reference to FIGS. 2A to 2C. An organosilane film having a hydrolytic group is formed in the formation region of the semiconductor layer. For example, pentacene may be used as the semiconductor layer and octadecyltrimethoxysilane (ODS) may be used as the organosilane film having a hydrolytic group. Octadecyltrimethoxysilane is effective on improvement in mobility of pentacene.

An insulating layer 212 and an insulating layer 213 are formed over the thin film transistor 220 and the capacitor 225. The insulating layer 213 serves as a planarizing film.

The insulating layer 212 and the insulating layer 213 can be formed using a material selected from silicon oxide, silicon nitride, silicon oxynitride, silicon nitride oxide, aluminum nitride (AlN), aluminum oxynitride (MON), aluminum nitride oxide having more nitrogen content than oxygen content (AlNO), aluminum oxide, diamond-like carbon (DLC), a nitrogen-containing carbon ($CN_x$) film, PSG (phosphosilicate glass), BPSG (borophosphosilicate glass), an alumina film, polysilazane, and another substance containing an inorganic insulating material. Alternatively, a siloxane resin may be employed. Further alternatively, a photosensitive or non-photosensitive organic insulating material may be employed, for example, polyimide, acrylic, polyamide, polyimide amide, resist, benzocyclobutene, or a low dielectric material can be used.

Then, an opening which reaches the source or drain electrode layer 205 is formed in the insulating layer 212 and the insulating layer 213, and a pixel electrode layer 235 is formed in contact with the source or drain electrode layer 205. The pixel electrode layer 235 can be formed using a similar material to the foregoing first electrode layer 117. In the case of manufacturing a transmissive liquid crystal display panel, indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide to which silicon oxide is added (ITSO), or the like can also be used. As a reflective metal thin film, a conductive film formed of titanium, tungsten, nickel, gold, platinum, silver, aluminum, magnesium, calcium, lithium, an alloy thereof, or the like can be employed.

The pixel electrode layer 235 can be formed using a vapor deposition method, a sputtering method, a CVD method, a printing method, a droplet discharging method, or the like. In this embodiment mode, indium tin oxide (ITO) is used for the pixel electrode layer 235.

Next, an insulating layer 231 referred to as an orientation film is formed by a printing method or a spin coating method to cover the pixel electrode layer 235 and the insulating layer 213. Note that the insulating layer 231 can be selectively formed by using a screen printing method or an offset printing method. Then, rubbing is performed. Then, a sealant 282 is formed by a droplet discharging method at the periphery of a region where pixels are formed.

Then, a counter substrate 236 provided with an insulating layer 233 serving as an orientation film, a conductive layer 239 serving as a counter electrode, a colored layer 234 serving as a color filter, and a polarizing plate 237 is attached to the substrate 200 that is a TFT substrate with a spacer 281 sandwiched therebetween, and a liquid crystal layer 232 is provided in the space, so that a liquid crystal display panel can be manufactured (see FIGS. 18A to 19B). A polarizing plate 238 is formed also on the side opposite to the side of the substrate 200 where elements are formed. The sealant may be mixed with a filler, and further, the counter substrate 236 may be provided with a shielding film (black matrix) or the like. Note that a dispenser method (a dropping method) or a dip method (a pumping method) by which a liquid crystal is injected utilizing a capillary action after attaching the substrate 200 having elements to the counter substrate 236 can be used as a method for forming the liquid crystal layer.

In a liquid crystal dropping method employing a dispenser method, a closed loop is formed with the sealant, and the liquid crystal is dropped once or plural times in the closed loop from a head. When the liquid crystal material has high viscosity, the liquid crystal material is continuously discharged and attached to a region where liquid crystal is to be attached. On the other hand, when the liquid crystal material has low viscosity, a droplet of the liquid crystal material is intermittently discharged. At this time, a barrier layer is provided to prevent the sealant and the liquid crystal from reacting with each other. Then, the substrates are attached to each other in vacuum, and then, ultraviolet curing is performed, thus, the space is filled with the liquid crystal. Alternatively, a sealant may be formed and a liquid crystal may be dropped on a TFT substrate side.

The spacer may be provided by dispersing particles of several micrometers; however, in this embodiment mode, the spacer is provided by forming a resin film over the entire surface of the substrate and then processed it by etching. After a spacer material is applied using a spinner, the spacer material is formed into a predetermined pattern by light exposure and developing treatment. Further, the pattern is cured by heating at a temperature of 150 to 200° C. with a clean oven. The spacer manufactured in this manner can have different shapes depending on the conditions of the light exposure and the developing treatment. It is preferable that the spacer has a pillar shape with a flat top portion since the mechanical strength as a liquid crystal display device can be secured when the counter substrate is attached to the substrate. The shape of the spacer is not specifically limited, and it may have a shape of a circular cone or a pyramid.

A connection portion is formed to connect the inside of the display device formed through the foregoing steps to an external wiring board. The insulating layer in the connection portion is removed by ashing treatment using an oxygen gas under atmospheric pressure or pressure close to the atmospheric pressure. This treatment is performed by using an oxygen gas and one or more gases of hydrogen, $CF_4$, $NF_3$, $H_2O$, and $CHF_3$. In this process, ashing treatment is performed after sealing with the counter substrate to prevent damage or destruction due to static electricity; however, the ashing treatment may be performed at any timing when there are few effects of static electricity.

Then, an FPC 286, which is a wiring board for connection is provided over terminal electrode layer 287 electrically connected to the pixel portion, with an anisotropic conductive layer 285 sandwiched therebetween. The FPC 286 has a function of transmitting a signal or an electric potential from the outside. Through the foregoing steps, a liquid crystal display device having a display function can be manufactured.

FIG. 19A shows a top view of the liquid crystal display device. As shown in FIG. 19A, a pixel region 290, a scanning line driver region 291a, and a scanning line driver region 291b are sealed between the substrate 200 and the counter substrate 236 with the sealant 282, and a signal line side driver circuit 292 formed using a driver IC is provided over the substrate 200. A driver circuit having thin film transistors 283 and 284 is provided in the driver region.

Since the thin film transistors 283 and 284 are n-channel thin film transistors, an NMOS circuit including the thin film transistors 283 and 284 is provided as a peripheral driver circuit in this embodiment mode.

In this embodiment mode, an NMOS structure is used so as to serve as an inverter in a driver circuit region. In the case of thus using only a PMOS structure or an NMOS structure, gate electrode layers of some TFTs are connected to source or drain electrode layers thereof.

In this embodiment mode, although a switching TFT has a single gate structure, it may have a single gate structure or a multi-gate structure. In the case where a semiconductor layer is manufactured using an SAS or a crystalline semiconductor, an impurity region can be formed by adding an impurity which imparts one conductivity type. In this case, a semiconductor layer may have impurity regions having different concentrations. For example, the semiconductor layer may have a low concentration impurity region in the vicinity of a channel formation region and a region which overlaps with the gate electrode layer, and may have a high concentration impurity region outside the low concentration region.

In this embodiment mode, the manufacturing process can be simplified as described above. By forming various components (parts) and a mask layer directly over a substrate by a droplet discharging method, a display panel can be easily manufactured even in the case of using a glass substrate of the fifth generation or later having a side of more than 1000 mm.

In this embodiment mode, a source electrode layer and a drain electrode layer are formed in a self-aligned manner. Accordingly, a defective shape or the like due to misalignment of a mask does not occur and wirings can be formed with good controllability. Therefore, a highly-reliable semiconductor device, display device, and the like can be manufactured with high yield according to the present invention.

Embodiment Mode 4

A thin film transistor can be formed in a self-aligned manner using the present invention, and a display device can be formed using the thin film transistor. When a light emitting element and a transistor for driving the light emitting element are used, the light emitting element emits light in any one of bottom emission, top emission, and dual emission. Here, a stacked layer structures of the light emitting element corresponding to each emission type is described with reference to FIGS. 11A to 11C. In this embodiment mode, an example of a display device which is manufactured through a simplified manufacturing process and at low cost is described.

In this embodiment mode, thin film transistors 461, 471, and 481 are used, which are inverted coplanar thin film transistors manufactured in Embodiment Mode 1. The thin film transistor 481 is provided over a light-transmitting substrate 480 and includes a gate electrode layer 493, a gate insulating layer 497, a semiconductor layer 494, a source or drain electrode layer 492a, and a source or drain electrode layer 492b. The gate insulating layer 497 contains an inorganic material. An insulating layer 498 which serves as a partition wall is formed so as to cover the thin film transistor 481. An organic polymer layer 491a and an organic polymer layer 491b are formed by selectively polymerizing an organic layer containing a photopolymerizable reactive group by rear light-exposure using the gate electrode layer 493 as a mask. The source or drain electrode layer 492a and the source or drain electrode layer 492b are formed in a self-aligned manner: an organosilane film having a hydrolytic group is formed over the organic polymer layer 491a, the organic polymer layer 491b, and the gate insulating layer 497, treatment for making a liquid-repellent property of the gate insulating layer 497 higher than those of the organic polymer layers 491a and 491b is performed, and then a composition containing a conductive material is discharged.

Figure 11A:
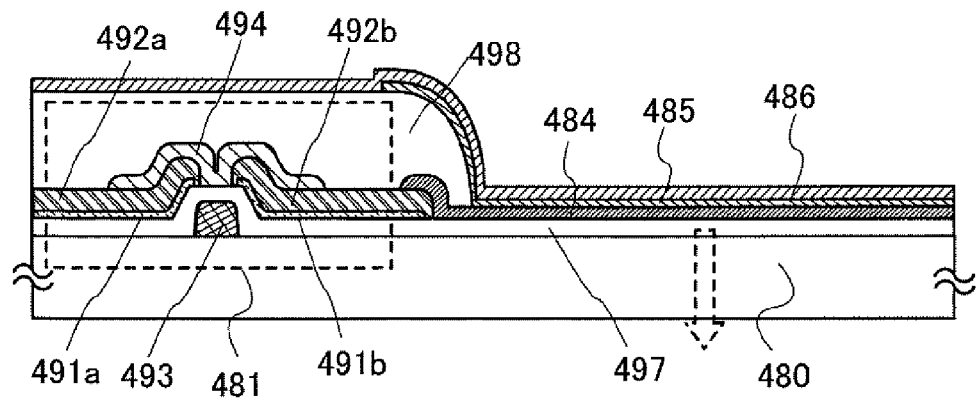
FIGS. 11A to 11C are views each illustrating a display device of the present invention.
Figure 11B:
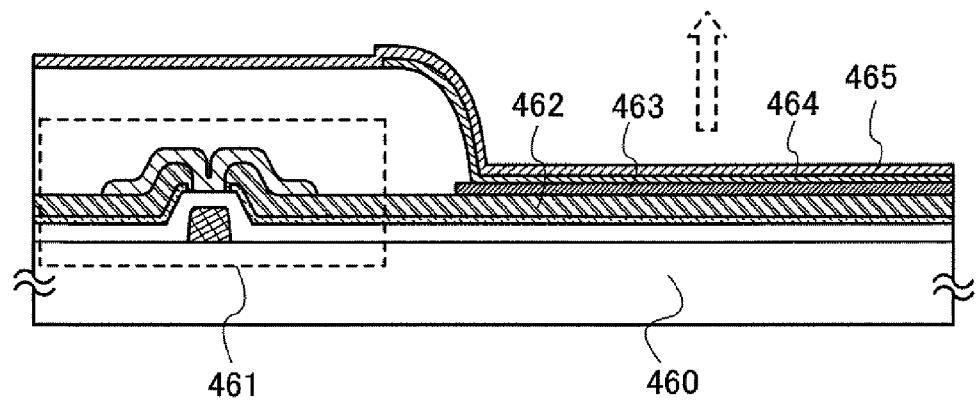
Figure 11C:
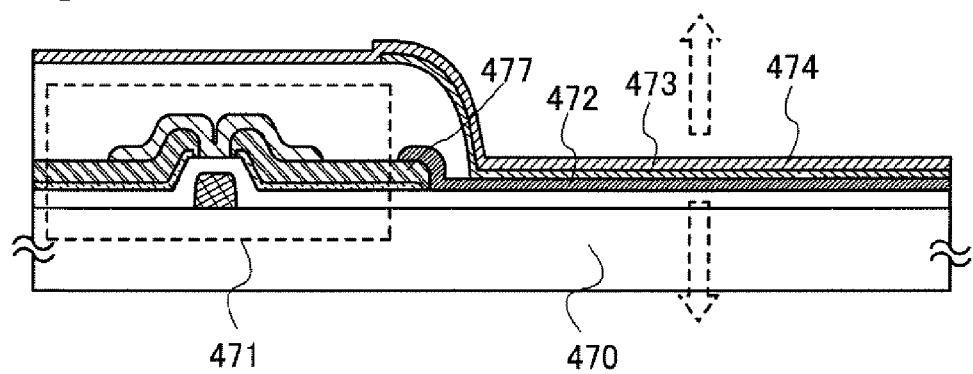

First, the case of emitting light to the substrate 480 side, in other words, the case of bottom emission, is described with reference to FIG. 11A. In this case, a first electrode layer 484, which is in contact with the source or drain electrode layer 492b in order to be electrically connected to the thin film transistor 481, an electroluminescent layer 485, and a second electrode layer 486 are sequentially stacked. The substrate 480 through which light passes needs to transmit at least visible light. Next, the case of emitting light to the side opposite to a substrate 460, in other words, the case of top emission, is described with reference to FIG. 11B. The thin film transistor 461 can be formed in a similar manner to the above described thin film transistor.

A source or drain electrode layer 462 electrically connected to the thin film transistor 461 is in contact with and electrically connected to a first electrode layer 463. The first electrode layer 463, an electroluminescent layer 464, and a second electrode layer 465 are sequentially stacked. The source or drain electrode layer 462 is a reflective metal layer and reflects light which is emitted from a light-emitting element, upward as indicated by the arrow. The source or drain electrode layer 462 and the first electrode layer 463 are stacked, and therefore, when the first electrode layer 463 is formed using a light-transmitting material and transmits light, the light is reflected by the source or drain electrode layer 462 and is emitted to the side opposite to the substrate 460. Needless to say, the first electrode layer 463 may be formed using a reflective metal film. Since light generated in the light emitting element is emitted through the second electrode layer 465, the second electrode layer 465 is formed using a material which transmits at least visible light. Lastly, the case of emitting light to both a substrate 470 side and the side opposite thereto, in other words, the case of dual emission, is described with reference to FIG. 11C. The thin film transistor 471 is also a channel protective thin film transistor. A source or drain electrode layer 477 electrically connected to a semiconductor layer of the thin film transistor 471 is electrically connected to a first electrode layer 472. The first electrode layer 472, an electroluminescent layer 473, and a second electrode layer 474 are sequentially stacked. When both the first electrode layer 472 and the second electrode layer 474 are formed using a material which transmits at least light in the visible region or formed to have such thicknesses as to transmit light, dual emission is realized. In this case, an insulating layer and the substrate 470 through which light passes also needs to transmit at least light in the visible region.

Modes of light emitting elements that can be applied to this embodiment mode are shown in FIGS. 12A to 12D. FIGS. 12A to 12D each shows a structure of a light emitting element. Each light emitting element has a structure in which an electroluminescent layer 860, in which an organic compound and an inorganic compound are mixed, is sandwiched between a first electrode layer 870 and a second electrode layer 850. The electroluminescent layer 860 includes a first layer 804, a second layer 803, and a third layer 802 as illustrated.

The first layer 804 is a layer which has a function of transporting holes to the second layer 803, and contains at least a first organic compound and a first inorganic compound showing an electron-accepting property to the first organic compound. What is important is that the first organic compound and the first inorganic compound are not only simply mixed, but the first inorganic compound shows an electron-accepting property to the first organic compound. This structure generates many hole-carriers in the first organic compound, which originally has almost no inherent carriers, and thus, a highly excellent hole-injecting property and a highly excellent hole-transporting property are obtained.

Therefore, as for the first layer 804, not only an advantageous effect that is considered to be obtained by mixing an inorganic compound (such as improvement in heat resistance), but also excellent conductivity (in particular, a hole-injecting property and a hole-transporting property in the first layer 804) can be obtained. This excellent conductivity is advantageous effect that cannot be obtained in a conventional hole-transporting layer in which an organic compound and an inorganic compound which do not electronically interact with each other are simply mixed. This advantageous effect can make a drive voltage lower than a conventional one. In addition, since the first layer 804 can be made thicker without causing an increase in drive voltage, short circuit of the element due to dust and the like can be suppressed.

It is preferable to use a hole-transporting organic compound as the first organic compound because hole-carriers are generated in the first organic compound as described above. Examples of the hole-transporting organic compound include, but are not limited to, phthalocyanine (abbreviated as $H_2Pc$), copper phthalocyanine (abbreviated as $CuPc$)_7 vanadyl phthalocyanine (abbreviated as VOPc), 4,4',4'-tris(N,N-diphenylamino)triphenylamine (abbreviated as TDATA), 4,4',4"-tris[N-(3-methylphenyl)-N-phenylamino]triphenylamine (abbreviated as MTDATA), 1,3,5-tris[N,N-di(m-tolyl)amino]benzene (abbreviated as m-MTDAB), N,N'-diphenyl-N,N'-bis(3-methylphenyl)-1,1'-biphenyl-4,4'-diamine (abbreviated as TPD), 4,4'-bis[N-(1-naphthyl)-N-phenylamino]biphenyl (abbreviated as NPB), 4,4'-bis{N-[4-di(m-tolyl)amino]phenyl-N-phenylamino}biphenyl (abbreviated as DNTPD), 4,4',4"-tris(N-carbazolyl)triphenylamine (abbreviated as TCTA), and the like. Among the compounds mentioned above, aromatic amine compounds typified by TDATA, MTDATA, m-MTDAB, TPD, NPB, DNTPD, and TCTA can easily generate hole-carriers, and are a suitable group of compounds for the first organic compound.

On the other hand, the first inorganic compound may be any material as long as it can easily accept electrons from the first organic compound, and any kind of metal oxide and metal nitride can be used, but oxide of a transition metal that belongs to any of Groups 4 to 12 of the periodic table is preferable because such oxide of a transition metal easily shows an electron-accepting property. Specifically, titanium oxide, zirconium oxide, vanadium oxide, molybdenum oxide, tungsten oxide, rhenium oxide, ruthenium oxide, zinc oxide, and the like can be used. Among the metal oxides mentioned above many of oxides of transition metals that belong to any of Groups 4 to 8 have a higher electron-accepting property, which are a preferable group of compounds. In particular, vanadium oxide, molybdenum oxide, tungsten oxide, and rhenium oxide are preferable since they can be vapor deposited in vacuum and easily handled.

Note that the first layer 804 may be formed by stacking a plurality of layers each including a combination of the organic compound and the inorganic compound described above, or may further including another organic compound or another inorganic compound.

Next, the third layer 802 is described. The third layer 802 is a layer which has a function of transporting electrons to the second layer 803, and contains at least a third organic compound and a third inorganic compound showing an electron-donating property to the third organic compound. What is important is that the third organic compound and the third inorganic compound are not only simply mixed but the third inorganic compound shows an electron-donating property to the third organic compound. This structure generates many electron-carriers in the third organic compound which has originally almost no inherent carriers, and a highly excellent electron-injecting property and a highly excellent electron-transporting property are obtained.

Therefore, as for the third layer 802, not only an advantageous effect that is considered to be obtained by mixing an inorganic compound (such as improvement in heat resistance), but also excellent conductivity (in particular, an electron-injecting property and an electron-transporting property in the third layer 802) can also be obtained. This excellent conductivity is an advantageous effect that cannot be obtained in a conventional electron-transporting layer in which an organic compound and an inorganic compound which do not electronically interact with each other are simply mixed. This advantageous effect can make a drive voltage lower than the conventional one. In addition, since the third layer 802 can be made thick without causing an increase in drive voltage, short circuit of the element due to dust and the like can be suppressed.

It is preferable to use an electron-transporting organic compound as the third organic compound because electron-carriers are generated in the third organic compound as described above. Examples of the electron-transporting organic compound include, but are not limited to, tris(8-quinolinolato) aluminum (abbreviated as $Alq_3$), tris(4-methyl-8-quinolinolato)aluminum (abbreviated as $Almq_3$), bis(10-hydroxybenzo[h]-quinolinato)beryllium (abbreviated as $BeBq_2$), bis(2-methyl-8-quinolinolato)(4-phenylphenolato) aluminum (abbreviated as BAlq), bis[2-(2'-hydroxyphenyl) benzoxazolato]zinc (abbreviated as $Zn(BOX)_2$), bis[2-(2'-hydroxyphenyl)benzothiazolato]zinc (abbreviated as $Zn(BTZ)_2$), bathophenanthroline (abbreviated as BPhen), bathocuproin (abbreviated as BCP), 2-(4-biphenylyl)-5-(4-tert-butylphenyl)-1,3,4-oxadiazole (abbreviated as PBD), 1,3-bis[5-(4-tert-butylphenyl)-1,3,4-oxadiazol-2-yl]benzene (abbreviated as OXD-7), 2,2',2"-(1,3,5-benzenetriyl)-tris(1-phenyl-1H-benzimidazole) (abbreviated as TPBI), 3-(4-biphenylyl)-4-phenyl-5-(4-tert-butylphenyl)-1,2,4-triazole (abbreviated as TAZ), 3-(4-biphenylyl)-4-(4-ethylphenyl)-5-(4-tert-butylphenyl)-1,2,4-triazole (abbreviated as p-EtTAZ), and the like. Among the compounds mentioned above, chelate metal complexes each having a chelate ligand including an aromatic ring, typified by $Alq_3$, $Almq_3$, $BeBq_2$, BAlq, $Zn(BOX)_2$, $Zn(BTZ)_2$, and the like; organic compounds each having a phenanthroline skeleton typified by BPhen, BCP, and the like; and organic compounds having an oxadiazole skeleton typified by PFD, OXD-7, and the like can easily generate electron-carriers, and are suitable groups of compounds for the third organic compound.

On the other hand, the third inorganic compound may be any material as long as it can easily donate electrons to the third organic compound, and any kind of metal oxide and metal nitride can be used, but alkali metal oxide, alkaline earth metal oxide, rare earth metal oxide, alkali metal nitride, alkaline earth metal nitride, and rare earth metal nitride are preferable because they easily show an electron-donating property. Specifically, lithium oxide, strontium oxide, barium oxide, erbium oxide, lithium nitride, magnesium nitride, calcium nitride, yttrium nitride, lanthanum nitride, and the like can be used. In particular, lithium oxide, barium oxide, lithium nitride, magnesium nitride, and calcium nitride are preferable since they can be vapor deposited in vacuum and easily handled.

Note that the third layer 802 may be formed by stacking a plurality of layers each including a combination of the organic compound and the inorganic compound described above, or may further including another organic compound or another inorganic compound.

Next, the second layer 803 is described. The second layer 803 is a layer which has a function of emitting light, and contains a second organic compound that has a light emitting property. A second inorganic compound may also be contained. The second layer 803 can be formed by using various light emitting organic compounds and inorganic compounds. However, since it is believed to be hard to make a current flow through the second layer 803 as compared with the first layer 804 or the third layer 802, the second layer 803 preferably has a thickness of about 10 nm to 100 nm.

The second organic compound is not particularly limited as long as it is a light-emitting organic compound, and examples of the second organic compound include, for example, 9,10-di(2-naphthyl)anthracene (abbreviated as DNA), 9,10-di(2-naphthyl)-2-tert-butylanthracene (abbreviated as t-BuDNA), 4,4'-bis(2,2-diphenylvinylbiphenyl (abbreviated as DPVBi), coumarin 30, coumarin 6, coumarin 545, coumarin 545T, perylene, rubrene, periflanthene, 2,5,8,11-tetra(tert-butyl) perylene (abbreviated as TBP), 9,10-diphenylanthracene (abbreviated as DPA), 5,12-diphenyltetracene, 4-(dicyanomethylene)-2-methyl-6-[p-(dimethylamino)styryl]-4H-pyran (abbreviated as DCM1), 4-(dicyanomethylene)-2-methyl-6-[2-(julolidin-9-yl)ethenyl]-4H-pyran (abbreviated as DCM2), 4-(dicyanomethylene)-2,6-bis[p-(dimethylamino) styryl]-4H-pyran (abbreviated as BisDCM), and the like. Alternatively, a compound which can emit phosphorescence can be used, such as bis[2-(4,6'-difluorophenyl)pyridinato-N, $C^{2'}$]iridium(picolinate) (abbreviated as FIrpic), bis{2-[3',5'-bis(trifluoromethyl)phenyl]pyridinato-N,$C^{2'}$}iridium(picolinate) (abbreviated as Ir(CF$_3$ ppy)$_2$(pic)), tris(2-phenylpyridinato-N,$C^{2'}$)iridium (abbreviated as Ir(ppy)$_3$), bis (2-phenylpyridinato-N,$C^{2'}$)iridium(acetylacetonate) (abbreviated as Ir(ppy)$_2$(acac)), bis[2-(2'-thienyl)pyridinato-N,$C^{3'}$]iridium(acetylacetonate) (abbreviated as Ir(thp)$_2$ (acac)), bis(2-phenylquinolinato-N,$C^{2'}$)iridium(acetylacetonate) (abbreviated as Ir(pq)$_2$(acac)), or bis[2-(2'-benzothienyl)pyridinato-N,$C^{3'}$]iridium(acetylacetonate) (abbreviated as Ir(btp)$_2$(acac)).

Further, a triplet excitation light-emitting material containing a metal complex or the like may be used for the second layer 803 in addition to a singlet excitation light-emitting material. For example, among pixels emitting red, green, and blue light, a pixel emitting red light of which luminance is reduced by half in a relatively short time is formed by using a triplet excitation light-emitting material and the other pixels are formed by using a singlet excitation light-emitting material. A triplet excitation light-emitting material has high luminous efficiency and is advantageous in that lower power consumption is needed in order to obtain the same luminance. In other words, when a triplet excitation light-emitting material is used for a red pixel, only a small amount of current needs to be applied to a light emitting element, and thus, reliability can be improved. Pixels emitting red light and green light may be formed by using a triplet excitation light-emitting material and a pixel emitting blue light may be formed by using a singlet excitation light-emitting material to achieve lower power consumption. Low power consumption can be further achieved by forming a light emitting element emitting green light that is highly visible to human eyes by using a triplet excitation light-emitting material.

The second layer 803 may include not only the foregoing second organic compound, which emits light, but also another organic compound. Examples of organic compounds that can be added include, but are not limited to, TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, and DPVBi, which are mentioned above, and further, 4,4'-bis(N-carbazolyl)biphenyl (abbreviated as CBP), 1,3,5-tris[4-(N-carbazolyl)phenyl]benzene (abbreviated as TCPB), and the like. It is preferable that the organic compound, which is added in addition to the second organic compound, have higher excitation energy than that of the second organic compound and be added in a larger amount than the second organic compound in order to make the second organic compound emit light efficiently (thus, concentration quenching of the second organic compound can be prevented). Alternatively, the added organic compound may have another function of emitting light along with the second organic compound (thus, white light emission or the like can be realized).

The second layer 803 may have a structure in which light emitting layers having different light emission wavelength bands are formed in pixels so as to perform color display. Typically, light emitting layers corresponding to respective luminescent colors of R (red), G (green), and B (blue) are formed. In this case, color purity can be improved and specular reflection (glare) of a pixel portion can be prevented by providing a filter that transmits light of the light emission wavelength band on a light emission side of the pixels. By providing the filter, a circular polarizing plate or the like, which has been conventionally required, can be omitted, so that loss of light emitted from the light emitting layers can be reduced. In addition, a change in hue, which is caused in the case where a pixel portion (a display screen) is seen obliquely, can be reduced.

Both a low molecular organic light-emitting material and a high molecular organic light emitting material can be used for the second layer 803. A high molecular organic light emitting material has high physical strength compared with a low molecular material, and a durability of an element is high. In addition, manufacturing of an element is relatively easy because a film of a high molecular organic light emitting material can be formed by coating.

Since the luminescent color depends on a material of the light emitting layer, a light emitting element which emits light of a desired color can be formed by selecting the material. As the high molecular electroluminescent material which can be used to form the light emitting layer, a polyparaphenylene vinylene based material, a polyparaphenylene based material, a polythiophene based material, or a polyfluorene based material can be given.

As the polyparaphenylene vinylene based material, a derivative of poly(paraphenylenevinylene) [PPV]: poly(2,5-dialkoxy-1,4-phenylenevinylene) [RO-PPV], poly[2-(2'-ethyl-hexoxy)-5-methoxy-1,4-phenylenevinylene] [MEH-PPV], poly[2-(dialkoxyphenyl)-1,4-phenylenevinylene] [ROPh-PPV], or the like can be used. As the polyparaphenylene based material, a derivative of polyparaphenylene [PPP]; poly(2,5-dialkoxy-1,4-phenylene) [RO-PPP], poly(2, 5-dihexoxy-1,4-phenylene); or the like can be used. As the polythiophene based material, a derivative of polythiophene [PT] poly(3-alkylthiophene) [PAT], poly(3-hexylthiophene) [PHT], poly(3-cyclohexylthiophene) [PCHT], poly(3-cyclohexyl-4-methylthiophene) [PCHMT], poly(3,4-dicyclohexylthiophene) [PDCHT], poly[3-(4-octylphenyl)-thiophene]

[POPT], poly[3-(4-octylphenyl)-2,2 bithiophene] [PTOPT], or the like can be used. As the polyfluorene based material, a derivative of polyfluorene [PF]: poly(9,9-dialkylfluorene) [PDAF], poly(9,9-dioctylfluorene) [PDOF], or the like can be given.

The second inorganic compound may be any inorganic compound as long as light emission of the second organic compound is not easily quenched by the second inorganic compound, and various kinds of metal oxide and metal nitride can be used. In particular, oxide of a metal that belongs to Group 13 or 14 of the periodic table is preferable since light emission of the second organic compound is not easily quenched by such an oxide, and specifically, aluminum oxide, gallium oxide, silicon oxide, and germanium oxide are preferable. However, the second inorganic compound is not limited thereto.

Note that the second layer 803 may be formed by stacking a plurality of layers each including a combination of the organic compound and the inorganic compound described above, or may further include another organic compound or another inorganic compound. A layer structure of the light emitting layer can be changed, and an electrode layer for injecting electrons may be provided or a light emitting material may be dispersed, instead of providing a specific electron-injecting region or light-emitting region. Such a change can be permitted unless it departs from the purpose of the present invention.

A light emitting element formed using the above-described material emits light when biased forwardly. A pixel of a display device including the light emitting element can be driven by a simple matrix (passive matrix) mode or an active matrix mode. In either mode, each pixel is made to emit light by being biased forwardly in specific timing, and the pixel is in a non-light-emitting state for a certain period. By applying a backward bias at this non-light-emitting time, reliability of the light emitting element can be improved. In the light emitting element, there is a deterioration mode in which emission intensity is decreased under specific driving conditions or a deterioration mode in which a non-light-emitting region is enlarged in the pixel and luminance is apparently decreased. However, progression of deterioration can be slowed down by alternating driving in which bias is applied forwardly and reversely. Thus, reliability of the light emitting device can be improved. Either a digital drive or an analog drive can be employed.

A color filter (colored layer) may be formed over a sealing substrate. The color filter (colored layer) can be formed by a vapor deposition method or a droplet discharging method. When the color filter (colored layer) is used, high-definition display can also be performed. This is because broad peaks of the emission spectra of R, G, and B can be corrected to sharp peaks by the color filter (colored layer).

Full color display can be achieved by forming a material exhibiting monochromatic light in combination with a color filter or a color conversion layer. For example, the color filter (colored layer) or the color conversion layer may be formed over the second substrate (sealing substrate) and then attached to the substrate.

Needless to say, display may be performed in monochrome. For example, an area color display device using the monochromatic light may be formed. A passive matrix display portion is suitable for the area color display device, and characters and symbols can be mainly displayed.

Figure 12A:
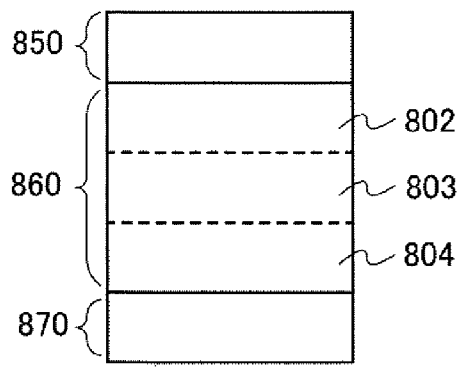
FIGS. 12A to 12D are views each illustrating a structure of a light emitting element which can be applied to the present invention.
Figure 12B:
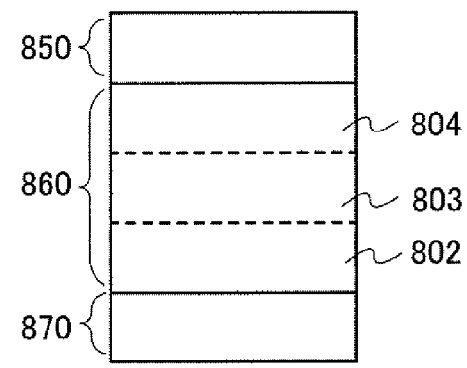

Materials of the first electrode layer 870 and the second electrode layer 850 are required to be selected in consideration of the work function. The first electrode layer 870 and the second electrode layer 850 can be either an anode or a cathode depending on the pixel structure. In the case where polarity of a driving thin film transistor is a p-channel type, the first electrode layer 870 may serve as an anode and the second electrode layer 850 may serve as a cathode as shown in FIG. 12A. In the case where polarity of the driving thin film transistor is an n-channel type, the first electrode layer 870 may serve as a cathode and the second electrode layer 850 may serve as an anode as shown in FIG. 12B. Materials that can be used for the first electrode layer 870 and the second electrode layer 850 are described. It is preferable to use a material having a higher work function (specifically, a material having a work function of 4.5 eV or higher) for one of the first electrode layer 870 and the second electrode layer 850 serving as an anode, and a material having a lower work function (specifically, a material having a work function of 3.5 eV or lower) for the other electrode layer serving as a cathode. However, since the first layer 804 is superior in a hole-injecting property and a hole-transporting property and the third layer 802 is superior in an electron-injecting property and an electron-transporting property, both of the first electrode layer 870 and the second electrode layer 850 are scarcely restricted by the work function, and various materials can be used.

The light emitting elements shown in FIGS. 12A and 12B have a structure in which light is extracted through the first electrode layer 870, and thus, the second electrode layer 850 does not necessarily have a light transmitting property. The second electrode layer 850 may be formed of a film mainly containing an element selected from Ti, titanium nitride, $TiSi_xN_y$, Ni, W, $WSi_x$, tungsten nitride, $WSi_xN_y$, NbN, Cr, Pt, Zn, Sn, In, Ta, Al, Cu, Au, Ag, Mg, Ca, Li, and Mo, or an alloy material or a compound material containing any of the elements as its main component, or a stacked film thereof in a total thickness range of 100 nm to 800 nm.

The second electrode layer 850 can be formed by a vapor deposition method, a sputtering method, a CVD method, a printing method, a droplet discharging method, or the like.

When the second electrode layer 850 is formed by using a light-transmitting conductive material, like the material used for the first electrode layer 870, light is also extracted from the second electrode layer 850, and a dual emission structure can be obtained in which light emitted from the light emitting element is emitted from both of the first electrode layer 870 side and the second electrode layer 850 side.

Note that the light emitting element in the present invention can be variously changed by changing types of the first electrode layer 870 and the second electrode layer 850.

FIG. 12B shows the case where the third layer 802, the second layer 803, and the first layer 804 are provided in this order from the first electrode layer 870 side in the electroluminescent layer 860.

As described above, in the light emitting element of the present invention, layers sandwiched between the first electrode layer 870 and the second electrode layer 850 are formed from the electroluminescent layer 860 including a layer in which an organic compound and an inorganic compound are combined. The light emitting element is an organic-inorganic composite light emitting element provided with layers (that is, the first layer 804 and the third layer 802) having functions by mixing an organic compound and an inorganic compound, a high carrier-injecting property and a carrier-transporting property, which can not be obtained with either the organic compound or the inorganic compound. The first layer 804 and the third layer 802 need to be layers in which an organic compound and an inorganic compound are combined, particularly when provided on the first electrode layer 870 side, whereas the layers may contain only one of an organic compound and an inorganic compound when provided on the second electrode layer 850 side.

Note that various methods can be used as a method for forming the electroluminescent layer 860, which is a layer in which an organic compound and an inorganic compound are mixed. For example, a co-evaporation method of evaporating both an organic compound and an inorganic compound by resistance heating. Alternatively, an inorganic compound may be evaporated by an electron beam (EB) while evaporating an organic compound by resistance heating so that they are co-evaporated. Further alternatively, a method of sputtering an inorganic compound while evaporating an organic compound by resistance heating to deposit the both at the same time may be employed. The electroluminescent layer may alternatively be formed by a wet process.

Similarly, for the first electrode layer 870 and the second electrode layer 850, a vapor deposition method by resistance heating, an EB evaporation method, sputtering, a wet process, and the like can be used.

Figure 12C:
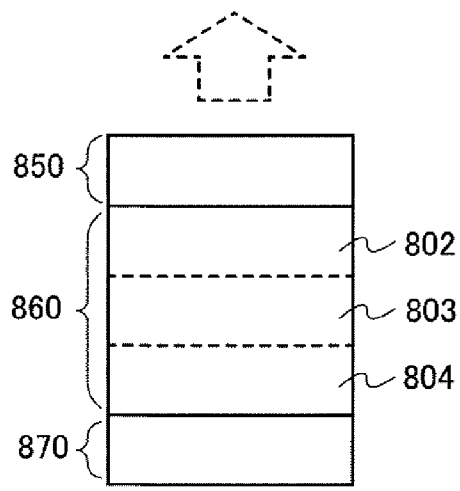
Figure 12D:
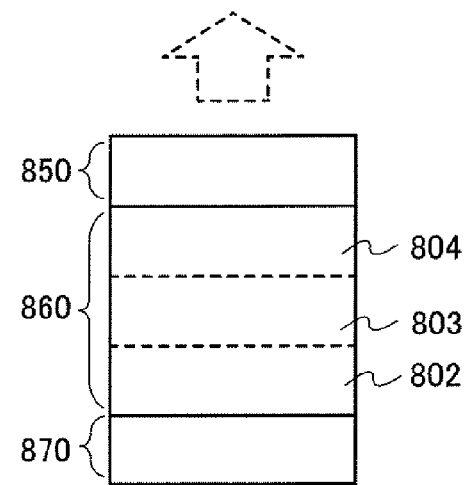

A structure in FIG. 12C is obtained when a reflective electrode layer is used for the first electrode layer 870, and a light-transmitting electrode layer is used for the second electrode layer 850 in the structure of FIG. 12A. Light emitted from the light emitting element is reflected by the first electrode layer 870, transmitted through the second electrode layer 850, and is emitted to outside. Similarly, a structure in FIG. 12D is obtained when a reflective electrode layer is used for the first electrode layer 870, and a light transmitting electrode layer is used for the second electrode layer 850 in the structure of FIG. 12B. Light emitted from the light emitting element is reflected by the first electrode layer 870, transmitted through the second electrode layer 850, and is emitted to outside. This embodiment mode can be appropriately combined with Embodiment Mode 1 or 3.

Embodiment Mode 5

In this embodiment mode, a structure which can be applied to a light emitting element included in a display device of the present invention is described with reference to FIGS. 13A to 14C.

Light emitting elements which utilize electroluminescence are classified according to whether their light emitting material is an organic compound or an inorganic compound. In general, light emitting elements having light emitting material which is an organic compound are referred to as organic EL elements, while light emitting elements having light emitting material which is an inorganic compound are referred to as inorganic EL elements.

An inorganic EL element is classified as either a dispersion type inorganic EL element or a thin-film type inorganic EL element, depending on its structure. Although these differ in that the former has an electroluminescent layer in which particles of a light emitting material are dispersed in a binder, whereas the latter has an electroluminescent layer formed of a thin film of a light emitting material, both need electrons accelerated by a high electric field. Mechanisms for obtaining light emission include donor-acceptor recombination light emission, which utilizes a donor level and an acceptor level, and localized light emission, which utilizes inner-shell electron transition of a metal ion. In general, donor-acceptor recombination light emission is employed in dispersion type inorganic EL elements and localized light emission is employed in thin-film type inorganic EL elements in many cases.

A light emitting material that can be used in the present invention includes a base material and an impurity element that serves as a light emission center. Light emission of various colors can be obtained by changing the impurity element which is included. The light emitting material can be manufactured using various methods, such as a solid phase method or a liquid phase method (e.g., a coprecipitation method). Further, a liquid phase method, such as a spray pyrolysis method, a double decomposition method, a method which employs a pyrolytic reaction of a precursor, a reverse micelle method, a method in which one or more of the above methods are combined with high-temperature baking, a freeze-drying method, or the like can be used.

A solid phase method is a method in which a base material and an impurity element or a compound containing the impurity element are weighed, mixed in a mortar, and reacted by being heated and baked in an electric furnace, so that the impurity element is included in the base material. The baking temperature is preferably 700 to 1500° C. This is because a solid-phase reaction does not proceed when the temperature is too low, and the base material decomposes when the temperature is too high. The materials may be baked in powdered form; however, it is preferable to bake the materials in pellet form. Although a comparatively high temperature compared with another method is needed, a solid phase method is a simple method; therefore, the solid phase method has high productivity and is suitable for mass production.

A liquid phase method (e.g., a coprecipitation method) is a method in which a base material or a compound containing the base material, and an impurity element or a compound containing the impurity element are reacted in a solution, dried, and then baked. Particles of the light emitting material are distributed uniformly, and the reaction can proceed even when the particles are small and a baking temperature is low.

As the base material to be used for the light emitting material, a sulfide material, an oxide material, or a nitride material can be used. As a sulfide material, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used, for example. As an oxide material, zinc oxide (ZnO), yttrium oxide ($Y_2O_3$), or the like can be used, for example. As a nitride material, aluminum nitride (AlN), gallium nitride (GaN), indium nitride (InN), or the like can be used, for example. Alternatively, zinc selenide (ZnSe), zinc telluride (ZnTe), or the like, or a ternary mixed crystal such as calcium gallium sulfide ($CaGa_2S_4$), strontium gallium sulfide ($SrGa_2S_4$), or barium gallium sulfide ($BaGa_2S_4$) may be used.

As a light emission center for localized light emission, manganese (Mn), copper (Cu), samarium (Sm), terbium (Tb), erbium (Er), thulium (Tm), europium (Eu), cerium (Ce), praseodymium (Pr), or the like can be used. Note that, a halogen element, such as fluorine (F) or chlorine (Cl) may be added. The halogen element can be used as a charge compensation.

On the other hand, as a light emission center for donor-acceptor recombination light emission, a light emitting material containing a first impurity element for forming a donor level and a second impurity element forming an acceptor level can be used. As the first impurity element, fluorine (F), chlorine (Cl), aluminum (Al), or the like can be used, for example. As the second impurity element, copper (Cu), silver (Ag), or the like can be used, for example.

In the case where the light emitting material for donor-acceptor recombination light emission is synthesized using a solid phase method, a base material, the first impurity element or a compound containing the first impurity element, and the second impurity element or a compound containing the second impurity element are weighed, mixed in a mortar, heated and baked in an electric-furnace. As the base material, the foregoing base materials can be used. As the first impurity element and the compound containing the first impurity element, fluorine (F), chlorine (Cl), aluminum sulfide ($Al_2S_3$) or the like can be used, for example. As the second impurity element and the compound containing the second impurity element, copper (Cu), silver (Ag), copper sulfide ($Cu_2S$), silver sulfide ($Ag_2S$), or the like can be used, for example. The baking temperature is preferably 700 to 1500° C. This is because a solid-phase reaction does not proceed when the temperature is too low, and the base material decomposes when the temperature is too high. Baking may be conducted with the materials in powdered form; however, it is preferable to conduct baking with the materials in pellet form.

As the impurity element for a solid phase reaction, a compound containing the first impurity element and the second impurity element may also be used. In that case, the impurity elements are easily diffused and the solid phase reaction proceeds readily. Therefore, a uniform light emitting material can be obtained. In addition, a high purity light emitting material can be obtained, since an unnecessary impurity element is not included therein. As the compound containing the first impurity element and the second impurity element, for example, copper chloride (CuCl), silver chloride (AgCl), or the like can be used.

Note that the concentration of these impurity elements may be 0.01 to 10 atomic %, and is preferably 0.05 to 5 atomic %, with respect to the base material.

In the case of a thin-film type inorganic EL element, an electroluminescent layer is a layer containing the foregoing light emitting material, and can be formed using a vacuum vapor deposition method such as a resistive heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like.

Figure 13A:
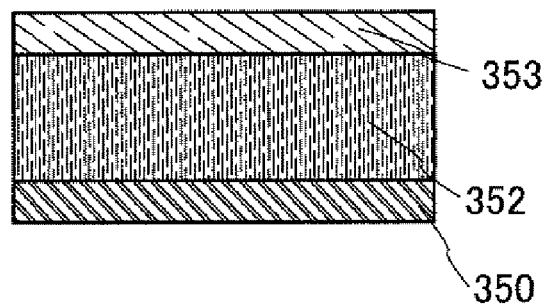
FIGS. 13A to 13C are views each illustrating a structure of a light emitting element which can be applied to the present invention.
Figure 13B:
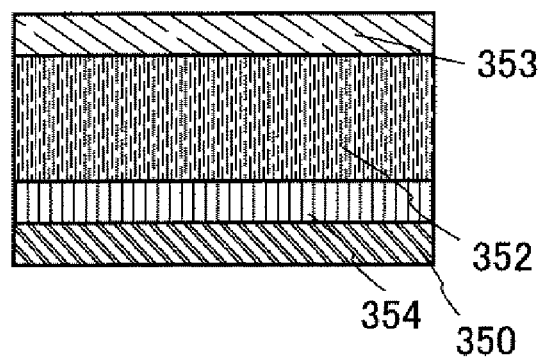
Figure 13C:
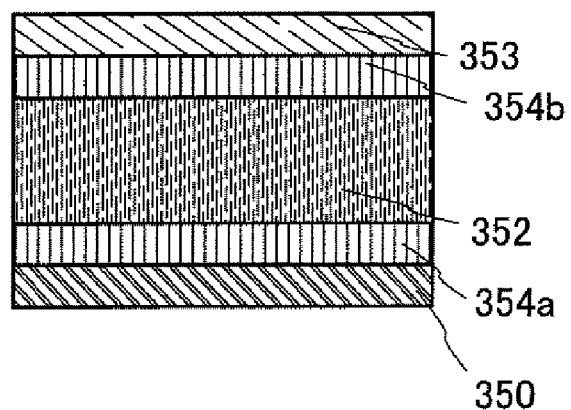

Each of FIGS. 13A to 13C shows an example of a thin-film type inorganic EL element which can be used as the light emitting element. In FIGS. 13A to 13C, the light emitting element includes a first electrode layer 350, an electroluminescent layer 352, and a second electrode layer 353.

Each of FIGS. 13B and 13C shows a structure in which an insulating layer is provided between the electrode layer and the electroluminescent layer in the light emitting element shown in FIG. 13A. The light emitting element shown in FIG. 13B includes an insulating layer 354 between the first electrode layer 350 and the electroluminescent layer 352. The light emitting element shown in FIG. 13C includes an insulating layer 354a between the first electrode layer 350 and the electroluminescent layer 352, and an insulating layer 354b between the second electrode layer 353 and the electroluminescent layer 352. Thus, the insulating layer may be provided between the electroluminescent layer and one of the electrode layers sandwiching the electroluminescent layer, or may be provided between the electroluminescent layer and each of the electrode layers sandwiching the electroluminescent layer. In addition, the insulating layer may be a single layer or a stacked layer including a plurality of layers.

Note that the insulating layer 354 is provided in contact with the first electrode layer 350 in FIG. 13B, but, the insulating layer 354 may be provided in contact with the second electrode layer 353 by reversing the positions of the insulating layer and the electroluminescent layer.

In the case of a dispersion type inorganic EL element, a film-shaped electroluminescent layer is formed by dispersing particles of light emitting material in a binder. In the case in which particles with desired size cannot be sufficiently obtained by a method of manufacturing the light emitting material, the light emitting material may be processed into particles by being crushed in a mortar or the like. The binder is a substance for fixing dispersed particles of light emitting material in place and maintaining the shape of an electroluminescent layer. The light emitting material is dispersed uniformly through the electroluminescent layer and fixed in place by the binder.

In the case of a dispersion type inorganic EL element, a method for forming the electroluminescent layer can be a droplet discharging method by which the electroluminescent layer can be selectively formed, a printing method (screen printing, offset printing, or the like), a coating method such as a spin coat method or the like, a dipping method, a dispenser method, or the like. There is no particular limitation on a film thickness, but preferably it is in a range of 10 to 1000 nm. In addition, in the electroluminescent layer containing the light emitting material and the binder, the weight percent of the light emitting material is preferably greater than or equal to 50 wt % or more and 80 wt % or less.

Figure 14A:
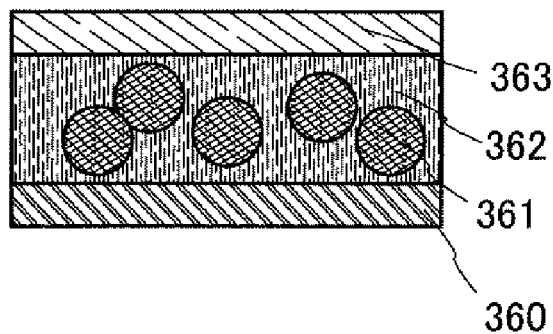
FIGS. 14A to 14C are views each illustrating a structure of a light emitting element which can be applied to the present invention.
Figure 14B:
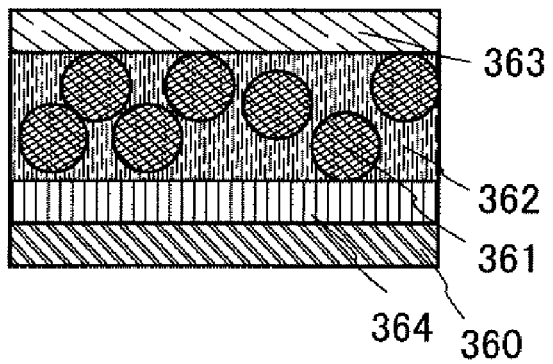
Figure 14C:
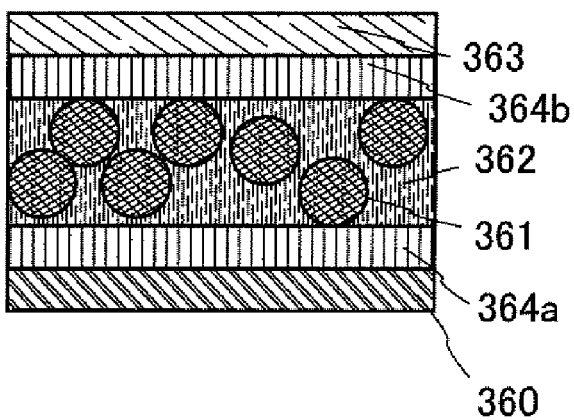
Figure 15A:
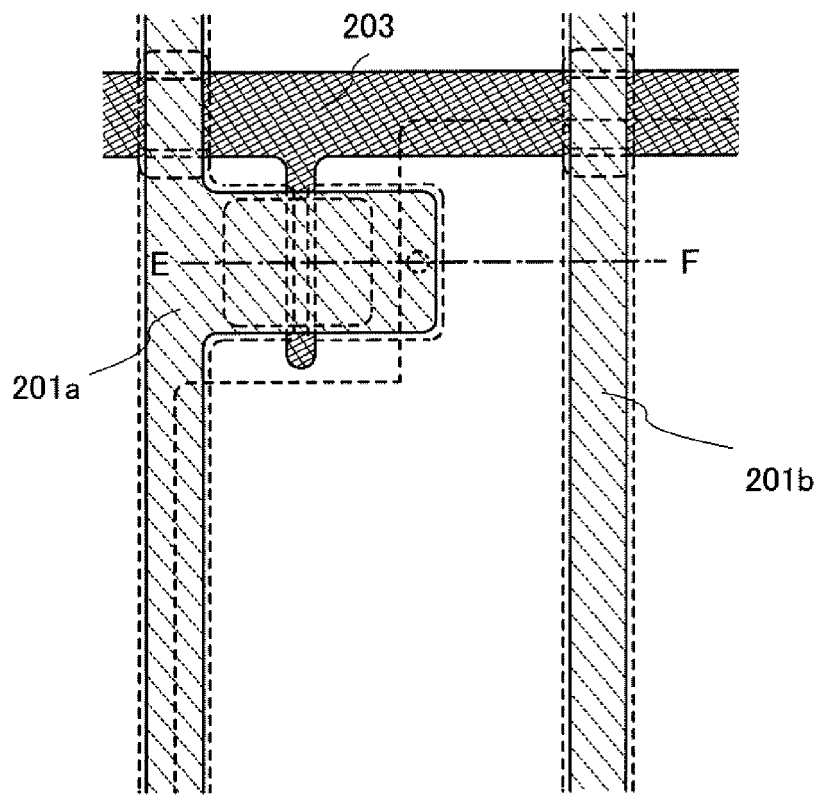
FIGS. 15A and 15B are views illustrating a manufacturing method of a display device of the present invention.
Figure 15B:
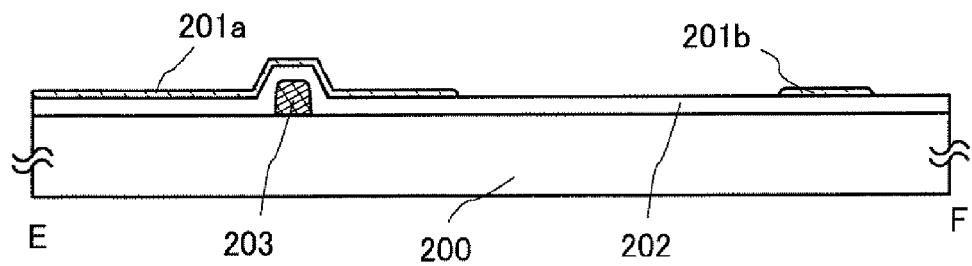

Each of FIGS. 14A to 14C shows an example of a dispersion type inorganic EL element which can be used as the light emitting element. A light emitting element shown in FIG. 14A has a stacked layer structure including a first electrode layer 360, an electroluminescent layer 362, and a second electrode layer 363. The electroluminescent layer 362 contains a light emitting material 361 fixed by a binder.

As a binder that can be used in this embodiment mode, an insulating material can be used and an organic material or an inorganic material or, a mixed material containing an organic material and an inorganic material may be used. As the organic insulating material, a polymer having comparatively high dielectric constant such as a cyanoethyl cellulose based resin or the like, or a resin such as polyethylene, polypropylene, a polystyrene based resin, a silicone resin, an epoxy resin, vinylidene fluoride, or the like can be used. Alternatively, a heat resistant high molecular weight material such as aromatic polyamide or polybenzimidazole, or a siloxane resin may be used. Note that a siloxane resin is a resin including a Si—O—Si bond. Siloxane has a skeleton structure having a bond between silicon (Si) and oxygen (O), and as a substituent, an organic group having at least hydrogen (such as an alkyl group or an aromatic hydrocarbon) is used. As the substituent, a fluoro group may be used. Alternatively, an organic group containing at least hydrogen, and a fluoro group may be used as the substituent. Further, a resin material such as a vinyl resin such as polyvinyl alcohol or polyvinylbutyral, a phenol resin, a novolac resin, an acrylic resin, a melamine resin, a urethane resin, an oxazole resin (e.g., polybenzoxazole), may be used. Microparticles having a high dielectric constant, such as particles of barium titanate ($BaTiO_3$) or strontium titanate ($SrTiO_3$) can also be mixed with these resins appropriately to adjust the dielectric constant.

The inorganic insulating material contained in the binder can be formed using a material selected from silicon oxide ($SiO_x$) silicon nitride ($SiN_x$), silicon containing oxygen and nitrogen, aluminum nitride (AlN), aluminum or aluminum oxide ($Al_2O_3$) containing oxygen and nitrogen, titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), ZnS, or another substance containing an inorganic insulating material. When an inorganic material having a high dielectric constant is contained in the organic material (by addition or the like), the dielectric constant of the electroluminescent layer including the light emitting material and the binder can be more effectively controlled and can be made even higher.

In a manufacturing process, the light emitting materials are dispersed in a solution containing the binder. As a solvent for the solution containing the binder which can be used in this embodiment mode, a solvent in which a binder material can be dissolved and which can form a solution having a viscosity suitable for a method for forming the electroluminescent layer (various wet processes) with a desired thickness may be appropriately selected. An organic solvent or the like can be used. In the case of using a siloxane resin as the binder, for example, propylene glycol monomethyl ether, propylene glycol monomethyl ether acetate (also referred to as PGMEA), 3-methoxy-3-methyl-1-butanol (also referred to as MMB), or the like can be used.

Each of FIGS. 14B and 14C shows a structure in which an insulating layer is provided between the electrode layer and the electroluminescent layer in the light emitting element shown in FIG. 14A. The light emitting element shown in FIG. 14B includes an insulating layer 364 between the first electrode layer 360 and the electroluminescent layer 362. The light emitting element shown in FIG. 14C includes an insulating layer 364a between the first electrode layer 360 and the electroluminescent layer 362, and an insulating layer 364b between the second electrode layer 363 and the electroluminescent layer 362. Thus, the insulating layers may be provided between the electroluminescent layer and one of the electrode layers sandwiching the electroluminescent layer, or may be provided between the electroluminescent layer and each of the electrode layers sandwiching the electroluminescent layer. In addition, the insulating layer may be a single layer or a stacked layer including a plurality of layers.

Note that the insulating layer 364 is provided in contact with the first electrode layer 360 in FIG. 14B, but the insulating layer 364 may be provided in contact with the second electrode layer 363 by reversing the positions of the insulating layer and the electroluminescent layer.

There is no particular limitation on the insulating layer 354 in FIGS. 13A to 13C and the insulating layer 364 in FIGS. 14A to 14C, but they preferably have high withstand voltage and are dense films. Further, the insulating layers preferably have high dielectric constant. For example, silicon oxide ($SiO_2$), yttrium oxide ($Y_2O_3$), titanium oxide ($TiO_2$), aluminum oxide ($Al_2O_3$), hafnium oxide ($Hf_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like can be used. Alternatively, a mixed film of any of those materials or a stacked layer film including two or more of those materials can be used. An insulating film of a material selected from the foregoing materials can be formed by sputtering, vapor deposition, CVD, or the like. Alternatively, the insulating layer may be formed by dispersing particles of a material selected from the foregoing insulating materials in a binder. A material for the binder may be the same as the binder contained in the electroluminescent layer and may be formed by the same method. There is no particular limitation on a film thickness, but preferably it is in a range of 10 to 1000 nm.

The light emitting element of this embodiment emits light when voltage is applied between the pair of electrode layers sandwiching the electroluminescent layer. The light emitting element of this embodiment can operate with either direct current driving or alternate current driving.

This embodiment mode can be appropriately combined with Embodiment Mode 1 or 2.

Embodiment Mode 6

Next, description is made of a mode of mounting a driver circuit for driving on a display panel manufactured according to Embodiment Modes 2 to 5. In this embodiment mode, an example of a display device which is manufactured through a simplified manufacturing process and at low cost is described.

First, a display device employing a COG method is described with reference to FIG. 23A. A pixel portion 2701 for displaying information of characters, images, or the like is provided over the substrate 2700. A substrate provided with a plurality of driver circuits is divided into rectangles, and a driver circuit 2751 after the division (also referred to as a driver IC) is mounted on the substrate 2700. FIG. 23A shows a mode of mounting a plurality of driver ICs 2751 and FPCs 2750 on the end of the driver ICs 2751. The size of a single driver IC obtained after the division may be made almost the same as the length of a side of the pixel portion on a signal line side, and a tape may be mounted on the end of the driver IC.

Alternatively, a TAB method may be employed. In that case, a plurality of tapes may be attached and driver ICs may be mounted on the tapes as shown in FIG. 23B. Similarly to the case of a COG method, a single driver IC may be mounted on a single tape. In this case, a metal piece or the like for fixing the driver IC is attached together in terms of intensity.

Such a driver IC to be mounted on the display panel is preferably formed over a rectangular substrate having a side of 300 mm to 1000 mm, or a side longer than 1000 mm, in plural number in order to improve productivity.

In other words, a plurality of circuit patterns each including a driver circuit portion and an input-output terminal as a unit may be formed over a substrate and may be lastly divided to be taken out. In consideration of the side length of the pixel portion or the pixel pitch, the driver IC may be formed to be a rectangle having a long side of 15 to 80 mm and a short side of 1 to 6 mm. Alternatively, the driver IC may be formed to have the same side length as that of the pixel region, or the length obtained by adding a side length of the pixel portion and a side length of a driver circuit.

An advantage of the external dimension of the driver IC over an IC chip is the length of the long side. When a driver IC having a long side length of 15 to 80 mm is used, the number of driver ICs necessary for being mounted in accordance with the pixel portion is less than that in the case of using an IC chip. Therefore, yield in manufacturing can be improved. In addition, when a driver IC is formed over a glass substrate, productivity is not decreased because there is no limitation on the shape of a substrate used as a mother body. This is a great advantage compared with the case of taking an IC chip out of a circular silicon wafer.

When a scanning line side driver circuit 3702 is formed to be integrated over the same substrate as shown in FIG. 22B, a driver IC provided with a signal line driver circuit is mounted on a region outside a pixel portion 3701. The driver IC is a signal line driver circuit. In order to form a pixel region corresponding to RGB full color, 3072 signal lines are required for an XGA class and 4800 signal lines are required for a UXGA class. The signal lines formed in such a number are divided into several blocks at the end of the pixel portion 3701, and lead lines are formed. The signal lines are gathered corresponding to the pitches of output terminals of the driver ICs.

The driver IC is preferably formed of a crystalline semiconductor formed over a substrate. The crystalline semiconductor is preferably formed by being irradiated with continuous wave laser light. Therefore, a continuous wave solid-state or gas laser is used for an oscillator for generating the laser light. There are few crystal defects when a continuous wave laser is used, so that a transistor can be manufactured using a polycrystalline semiconductor layer having a large grain size. In addition, high-speed driving is possible since mobility and response speed are favorable, and an operating frequency of an element can be improved compared with the conventional element. Moreover, high reliability can be obtained because of little variation in characteristics. Note that the channel-length direction of the transistor and a moving direction of laser light over the substrate may be the same direction to further improve the operating frequency. This is because the highest mobility can be obtained when a channel-length direction of a transistor and a moving direction of laser light over the substrate are almost parallel to each other preferably, −30° or more and 30° or less) in a step of laser crystallization with a continuous wave laser. Note that the channel length direction corresponds to a current flowing direction, in other words, a direction in which an electric charge moves in a channel formation region. The thus manufactured transistor has an active layer including a polycrystalline semiconductor layer in which a crystal grain is extended in the channel direction, which means that a crystal grain boundary is formed almost along the channel direction.

In order to perform laser crystallization, it is preferable to significantly narrow the laser light, and the shape of the laser light (beam spot) preferably has the same width as that of a short side of the driver ICs, about 1 mm or more and 3 mm or less. In addition, in order to secure an enough and effective energy density for an object to be irradiated, an irradiated region with the laser light preferably has a linear shape. Note that the term "linear" used herein refers to not a line in a strict sense but a rectangle or an oblong with a large aspect ratio, for example, the linear shape refers to a rectangle or an oblong with an aspect ratio of 2 or more (preferably 10 or more and 10000 or less). Thus, by making a width of the laser light shape (beam spot) the same length as a short side of the driver ICs, a method for manufacturing a display device, of which productivity is improved, can be provided.

As shown in FIGS. 23A and 23B, driver ICs may be mounted as the scanning line side driver circuit and the signal line side driver circuit. In this case, the driver ICs having different specifications are preferably used for the scanning line side driver circuit and the signal line side driver circuit.

In the pixel region, the signal line and the scanning line intersect to form a matrix, and transistors are arranged corresponding to each intersection. One feature of the present invention is that a TFT having an amorphous semiconductor or a semiamorphous semiconductor as a channel portion is used as the transistor provided in the pixel region. The amorphous semiconductor is formed by a method such as a plasma CVD method or a sputtering method. The semiamorphous semiconductor can be formed by a plasma CVD method at a temperature of 300° C. or less, and a film thickness necessary to form the transistor is formed in a short time even in the case of using, for example, an alkaline-free glass substrate having an external size of 550×650 mm. The feature of such a manufacturing technique is effective in manufacturing a display device having a large screen. In addition, a semiamorphous TFT can obtain an electron field effect mobility of 2 to 10 cm$^2$/V·sec when its channel formation region is formed using an SAS. According to the present invention, a pattern can be formed into a desired shape with good controllability; therefore, a minute wiring can be stably formed without a defect such as short circuit. Thus, a TFT having electric characteristics needed to operate pixels sufficiently can be formed. This TFT can be used as a switching element of the pixel or as an element included in the scanning line side driver circuit. Thus, a display panel in which system-on-panel is realized can be manufactured.

The scanning line side driver circuit can also formed to be integrated over the substrate by using a TFT having a semiconductor layer formed of an SAS. When a TFT having a semiconductor layer formed of an AS is used, the driver ICs may be mounted as both the scanning line side driver circuit and the signal line side driver circuit.

In this case, the driver ICs used for the scanning line side and the signal line side preferably have different specifications. For example, a transistor included in the scanning line driver IC needs to withstand a voltage of about 30 V; however, a drive frequency is 100 kHz or less, and high-speed operation is not comparatively needed. Accordingly, it is preferable to make a channel length (L) of the transistor included in the scanning line driver IC sufficiently long. On the other hand, a transistor of the signal line driver IC needs to withstand a voltage of only about 12 V; however, drive frequency is around 65 MHz at 3 V, and high-speed operation is needed. Accordingly, it is preferable to make a channel length or the like of the transistor included in a driver IC on a micron rule. By using the present invention, a minute pattern can be formed with good controllability. Therefore, the present invention can handle such a micron rule sufficiently.

A method for mounting the driver IC is not particularly limited, and a COG method, a wiring bonding method, or a TAB method can be employed.

When the thicknesses of the driver IC and the counter substrate are set equal to each other, the heights thereof are almost same, which contributes to thinning of a display device as a whole. When substrates which are used are formed of the same material, thermal stress is not generated and characteristics of a circuit including a TFT are not damaged even when a temperature of the display device change. Further, as described in this embodiment mode, the number of driver ICs to be mounted on one pixel region can be reduced by mounting driver ICs longer than IC chips as driver circuits.

As described above, a driver circuit can be incorporated in a display panel.

This embodiment mode can be combined with any of Embodiment Modes 2 to 5.

Embodiment Mode 7

Figure 10:
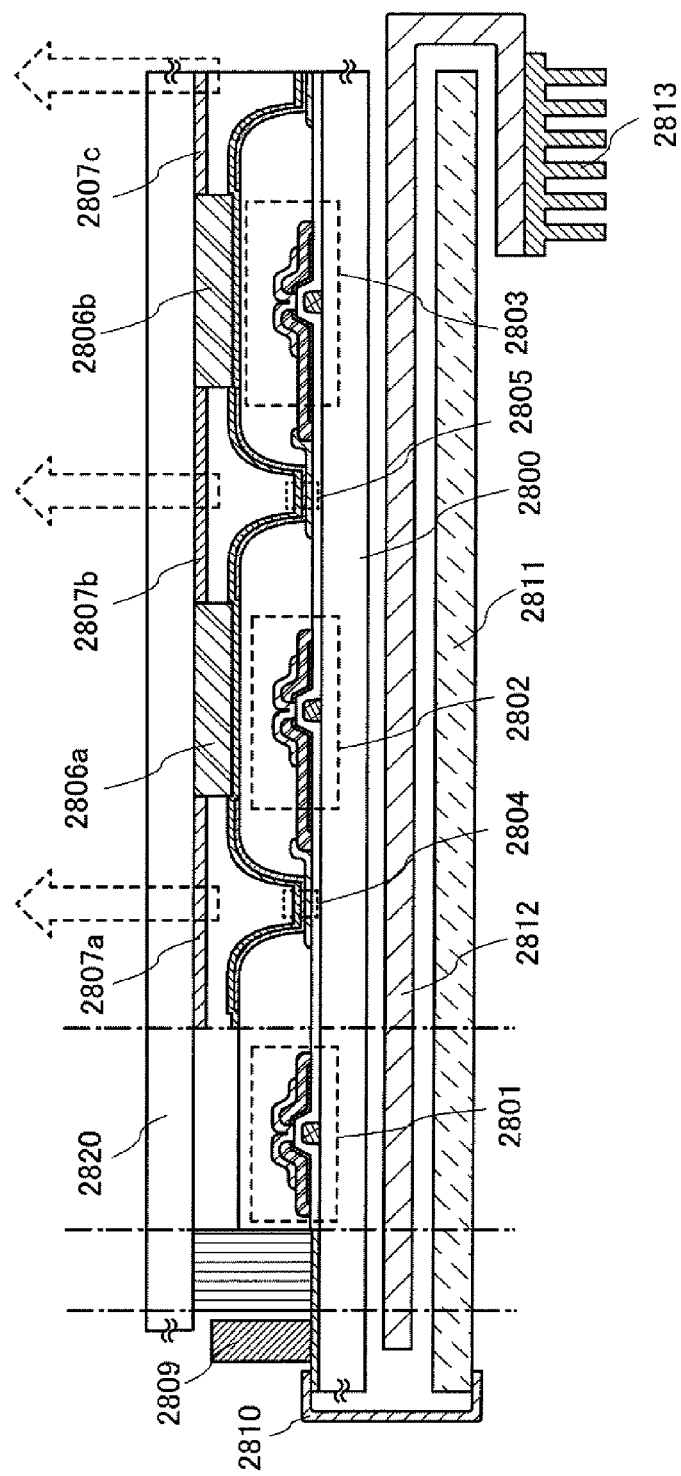
FIG. 10 is a cross-sectional view illustrating a structural example of an EL display module of the present invention.

This embodiment mode is described with reference to FIG. 10. FIG. 10 shows an example in which an EL display module is formed using a TFT substrate 2800 manufactured according to the present invention. In this embodiment mode, an example of a display device which is manufactured through a simplified manufacturing process and at low cost is described. In FIG. 10, a pixel portion including pixels is formed over the TFT substrate 2800.

In FIG. 10, a protective circuit portion 2801 using a TFT which is similar to that formed in the pixel or the TFT having its gate and one of its source and drain is connected so that the TFT operates similarly to a diode is provided between a driver circuit and the pixel and outside the pixel portion. A driver IC formed using a single crystalline semiconductor, a stick driver IC formed using a polycrystalline semiconductor film over a glass substrate, a driver circuit formed using an SAS, or the like is applied to a driver circuit 2809.

The TFT substrate 2800 is fixed to a sealing substrate 2820 with a spacer 2806*a* and a spacer 2806*b* formed by a droplet discharging method sandwiched therebetween. The spacer is preferably provided in order to keep the distance between two substrates constant even when the substrate is thin or an area of the pixel portion is enlarged. A space between the TFT substrate 2800 and the sealing substrate 2820, and over light emitting elements 2804 and 2805 connected to TFTs 2802 and 2803 respectively may be filled with a resin material which transmits at least light in the visible region and the resin material may be solidified, or the space may be filled with anhydrous nitrogen or an inert gas.

FIG. 10 shows the case where each of the light emitting elements 2804 and 2805 has a structure of top emission type, which emit light in the direction of the arrows shown in the drawing. Multicolor display can be performed by making the pixels emit light of different colors of red, green, and blue. At this time, color purity of the light emitted outside can be improved by forming colored layers 2807*a* to 2807*c* corresponding to respective colors on the sealing substrate 2820 side. Alternatively, pixels which emit white light may be used and may be combined with the colored layers 2807*a* to 2807*c*.

The driver circuit 2809, which is an external circuit, is connected to a scanning line or signal line connection terminal which is provided at one end of the TFT substrate 2800 with a wiring board 2810. In addition, a heat pipe 2813 which is a highly efficient thermal conductive device with a pipe shape and a heat radiation plate 2812, which are used for radiating heat to the outside of the device, may be provided in contact with or adjacent to the TFT substrate 2800 to increase a heat radiation effect.

Note that FIG. 10 shows the top emission EL module; however, a bottom emission structure may be employed by changing the structure of the light emitting element or a position of the external circuit board. Needless to say, a dual emission structure in which light is emitted from both the top and bottom surfaces may be employed. In the case of the top emission structure, an insulating layer serving as a partition wall may be colored and used as a black matrix. This partition wall can be formed by a droplet discharging method and may be formed by mixing a black pigment resin, carbon black, or the like into a resin material such as polyimide. A lamination thereof may alternatively be used.

In addition, reflected light of light entering from outside may be blocked by using a retardation plate or a polarizing plate in the EL display module. In the case of a top emission display device, an insulating layer serving as a partition wall may be colored and used as a black matrix. This partition wall can be formed by a droplet discharging method and may be formed by mixing a black pigment resin, carbon black, or the like into a resin material such as polyimide. A lamination thereof may alternatively be used. Different materials may be discharged to the same region plural times by a droplet discharging method to form the partition wall. A quarter wave plate and a half wave plate may be used as the retardation plate and may be designed to be able to control light. As for the structure, the light emitting element, the sealing substrate (sealant), the retardation plate (the quarter wave plate and the half wave plate), and the polarizing plate are sequentially stacked over a TFT element substrate in which light emitted from the light emitting element passes therethrough and emitted outside from the polarizing plate side. The retardation plates or polarizing plate may be provided on a side from which light is emitted or may be provided on both sides in the case of a dual emission display device, in which light is emitted from the both surfaces. In addition, an anti-reflection film may be provided on the outer side of the polarizing plate. Accordingly, a higher-definition and precision image can be displayed.

As for the TFT substrate 2800, a sealing structure may be formed by attaching a resin film to the side where the pixel portion is formed using a sealant or an adhesive resin. In this embodiment mode, glass sealing using a glass substrate is described, but various sealing methods, such as resin sealing using a resin, plastic sealing using plastic, and film sealing using a film can be used. A gas barrier film which prevents moisture from penetrating the resin film is preferably provided over the surface of the resin film. By employing a film sealing structure, further reduction in thickness and weight can be achieved.

In this embodiment mode, the manufacturing process can be simplified as described above. By forming various components (parts) directly over a substrate by a droplet discharging method, a display panel can be easily manufactured even in the case of using a glass substrate of the fifth generation or later having a side of more than 1000 mm.

According to the present invention, a conductive layer in a display device (a source electrode layer and a drain electrode layer in FIG. 10) can be manufactured in a self-aligned manner. In this embodiment mode, a source electrode layer and a drain electrode layer of a transistor are formed in a self-aligned manner by forming an organic polymer layer which is formed by selective polymerization of an organic layer containing a photopolymerizable reactive group and performing liquid-repellent treatment. In addition, the organic polymer layer is formed by selectively polymerizing an organic layer containing a photopolymerizable reactive group by rear light-exposure. Difference in adsorption property for a liquid repellent between a gate insulating layer containing an inorganic material and an organic polymer layer is utilized to make wettability of the gate insulating layer and that of the organic polymer layer be different from each other. When a composition containing a conductive material is discharged in regions with thus controlled wettability, a source electrode layer or a drain electrode layer can be formed only over the organic polymer layer. In this manner, a thin film transistor can be manufactured in a self-aligned manner. Therefore, according to the present invention, a display device and the like can be manufactured at low cost and with high productivity.

This embodiment mode can be combined with any of Embodiment Modes 1, 2, and 4 to 7.

Embodiment Mode 8

This embodiment mode is described with reference to FIGS. 20A and 20B. FIGS. 20A and 20B show an example in which a display module (a liquid crystal module) is formed using a TFT substrate 2600 manufactured according to the present invention. In this embodiment mode, an example of a display device which is manufactured through a simplified manufacturing process and at low cost is described.

FIG. 20A shows an example of a liquid crystal display module in which the TFT substrate 2600 and an counter substrate 2601 are fixed to each other with a sealant 2602, and a pixel portion 2603 including a TFT and a liquid crystal layer 2604 are provided between the substrates to form a display region. A colored layer 2605 is necessary to perform color display. In the case of the RGB system, colored layers corresponding to colors of red, green, and blue are provided for pixels. The outer sides of the TFT substrate 2600 and the counter substrate 2601 are provided with polarizing plates 2606 and 2607, and a diffusing plate 2613. A light source includes a cold cathode fluorescent lamp 2610 and a reflecting plate 2611. A circuit board 2612 is connected to the TFT substrate 2600 through a flexible wiring board 2609. External circuits such as a control circuit and a power supply circuit are incorporated in the circuit board 2612.

In addition, the liquid crystal display module includes a backlight. The backlight can be formed from a light emitting member, typically, a cold cathode fluorescent lamp, an LED, an EL light emitting device or the like can be used. The backlight used in this embodiment mode preferably has flexibility. Further, the backlight may be provided with a reflector plate and an optical film.

The polarizing plates 2606 and 2607 are attached to the TFT substrate 2600 and the counter substrate 2601, respectively. A stacked structure may be employed in which a retardation plate is included between the substrate and the polarizing plate. If necessary, an antireflection treatment may be performed on the polarizing plate 2606 on the viewer's side.

For the liquid crystal display module can employ, but not exclusively, a TN (twisted nematic) mode, an IPS (in-plane-switching) mode, an FFS (fringe field switching) mode, an MVA (multi-domain vertical alignment) mode, an PVA (patterned vertical alignment) mode, an ASM (axially symmetric aligned micro-cell) mode, an OCB (optical compensated birefringence) mode, an FLC (ferroelectric liquid crystal) mode, or an AFLC (antiferroelectric liquid crystal) mode.

FIG. 20B shows an example of an FS-LCD (field sequential-LCD) in which an OCB mode is applied to the liquid crystal display module of FIG. 20A. The FS-LCD performs red, green, and blue light emissions in one frame period. Color display can be performed by composing an image by a time division method. In addition, emission of respective colors is performed using a light emitting diode, a cold cathode fluorescent lamp, or the like; therefore, a color filter is not needed. Accordingly, it is not necessary to arrange color filters of three primary colors and restrict the display region of each color, and color display of all three colors can be performed in any regions. Meanwhile, since light of three colors is emitted in one frame period, high-speed response is needed for liquid crystal. By employing an FLC mode or an OCB mode using an FS method to a display device of the present invention, a display device or a liquid crystal television device with high performance and high image quality can be completed.

A liquid crystal layer of an OCB mode has a so-called π-cell structure. In the π-cell structure, liquid crystal molecules are aligned so that their pretilt angles are plane-symmetric with respect to a center plane between an active matrix substrate and a counter substrate. An orientation state of a liquid crystal of a π-cell structure is splay-orientation when voltage is not applied between the substrates, and then the orientation state shifts to bend-orientation when voltage is applied between the substrates. In this bend orientation state, white display is obtained. When voltage is applied further, liquid crystal molecules of bend-orientation get orientated perpendicular to the both substrates so as not to transmit light. With the OCB mode, response with about 10-times-higher speed than a conventional TN mode can be achieved.

As a mode for the FS method, an HV (half-V)-FLC (ferroelectric liquid crystal) or an SS (surface stabilized)-FLC using a ferroelectric liquid crystal (FLC) capable of high-speed operation, or the like can also be used. The OCB mode uses a nematic liquid crystal having relatively low viscosity, whereas the HV-FLC or the SS-FLC uses a smectic liquid crystal having a ferroelectric phase.

Optical response speed of a liquid crystal display module gets higher when the cell gap of the liquid crystal display module is narrowed. In addition the optical response speed can get higher by reducing the viscosity of the liquid crystal material. The increase in response speed is particularly advantageous when a pixel pitch in a pixel portion of a TN mode liquid crystal display module is 30 μm or less. Also, further increase in response speed is possible by an overdrive method in which applied voltage is increased (or decreased) for a moment.

FIG. 20B shows a transmissive liquid crystal display module including a red light source 2910*a*, a green light source 2910*b*, and a blue light source 2910*c* as light sources. A control portion 2912 is provided in order to switch on or off the red light source 2910*a*, the green light source 2910*b*, and the blue light source 2910*c*. The control portion 2912 controls light emission of each color, light enters the liquid crystal, and images are composed with time division, thus color display is performed.

In this embodiment mode, the manufacturing process can be simplified as described above. By forming various components (parts) directly over a substrate by a droplet discharging method, a display panel can be easily manufactured even in the case of using a glass substrate of the fifth generation or later having a side of more than 1000 mm.

In this embodiment mode, a source electrode layer and a drain electrode layer are formed in a self-aligned manner. Accordingly, a defective shape or the like due to misalignment of a mask does not occur and wirings can be formed with good controllability. Therefore, a highly-reliable semiconductor device, display device, and the like can be manufactured with high yield according to the present invention.

This embodiment mode can be combined with any of Embodiment Modes 1, 3, and 6.

Embodiment Mode 9

In this embodiment mode, an example of a display device which is manufactured through a simplified manufacturing process and at low cost is described.

Figure 21:
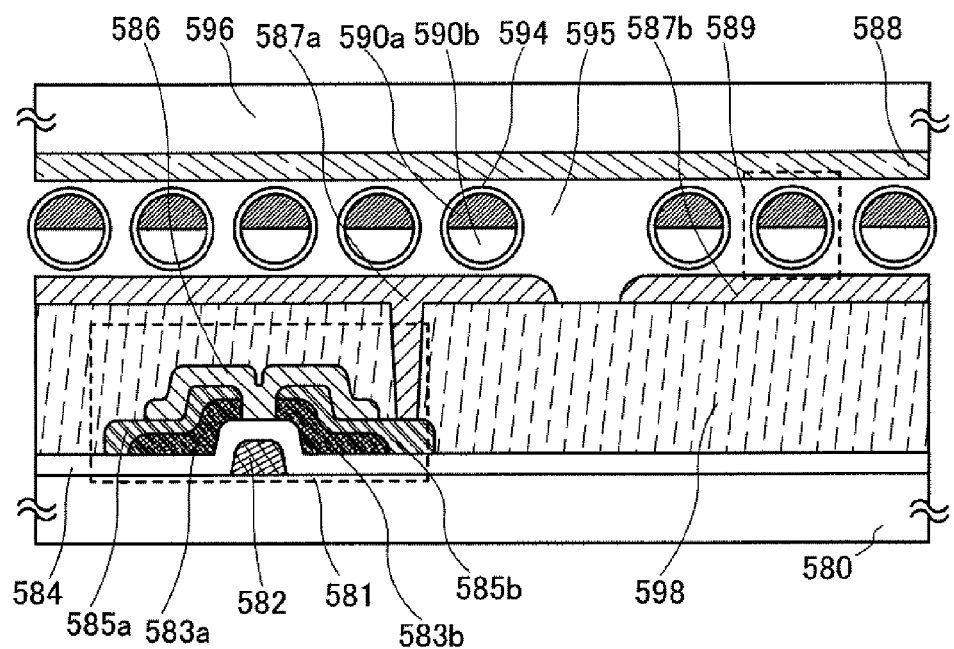
FIG. 21 is a view illustrating a display device of the present invention.

FIG. 21 shows an active matrix electronic paper to which the present invention is applied. Although FIG. 21 shows an active matrix electronic paper, the present invention can also be applied to a passive matrix electronic paper.

A twist ball display method may be used for the electronic paper. A twist ball display method refers to a method in which spherical particles each colored in black and white are arranged between a first electrode layer and a second electrode layer, and a potential difference is generated between the first electrode layer and the second electrode layer so as to control orientation of the spherical particles, so that display is performed.

A transistor 581 is an inverted coplanar thin film transistor and includes a gate electrode layer 582, a gate insulating layer 584, wiring layers 585*a* and 585*b*, and a semiconductor layer 586. In addition, the wiring layer 585*b* is in contact with and electrically connected to first electrode layer 587*a* through an opening formed in an insulating layer 598. The gate insulating layer 584 contains an inorganic material. Spherical particles 589 each including a black region 590*a*, a white region 590*b*, and a cavity 594 around the regions which is filled with liquid are provided between the first electrode layers 587*a* and 587*b*, and a second electrode layer 588. A space around the spherical particles 589 is filled with a filler 595, such as a resin (see FIG. 21).

In this embodiment mode, the wiring layers 585*a* and 585*b* of the transistor 581 are formed in a self-aligned manner by forming organic polymer layers 583*a* and 583*b* and performing liquid-repellent treatment. In addition, the organic polymer layer is formed by selectively polymerizing an organic layer containing a photopolymerizable reactive group by rear light-exposure. Difference in adsorption property for a liquid repellent between a gate insulating layer containing an inorganic material and the organic polymer layer is utilized to make wettability of the gate insulating layer and that of the organic polymer layer be different from each other. When a composition containing a conductive material is discharged in regions with thus controlled wettability, a wiring layer can be formed only over the organic polymer layer. In this manner, a thin film transistor can be manufactured in a self-aligned manner. Therefore, according to the present invention, a display device and the like can be manufactured at low cost and with high productivity.

Further, instead of the twist bail, an electrophoretic element can be used. A microcapsule having a diameter of about 10 μm to 20 μm which is filled with transparent liquid, positively charged white microparticles, and negatively charged black microparticles and sealed, is used. In the microcapsule provided between the first electrode layer and the second electrode layer, when an electric field is applied by the first electrode layer and the second electrode layer, the white microparticles and black microparticles move to opposite sides from each other, so that white or black can be displayed. A display element using this principle is an electrophoretic display element, and is generally called an electronic paper. The electrophoretic display element has higher reflectivity than a liquid crystal display element, and thus, an assistant light is unnecessary. In addition, power consumption of the electrophoretic display element is low, and a display portion can be recognized also in a dusky place. Even when electric power is not supplied to the display portion, an image which has been displayed once can be maintained. Thus, a displayed image can be maintained even if a display device having a display function is distanced from an electronic wave source.

A semiconductor layer of a TFT can use various semiconductors, such as an amorphous semiconductor, a crystalline semiconductor, a polycrystalline semiconductor, and a microcrystal semiconductor. In this embodiment mode, an organic transistor is formed using an organic compound.

This embodiment mode can be appropriately combined with any of Embodiment Modes 1, and 6.

According to the present invention, a component such as a wiring included in a display device can be formed into a desired shape. In addition, complicated photolithography steps can be reduced and a display device can be manufactured through a simplified process, so that less material is wasted and the cost can be reduced. Therefore, a highly-reliable and high performance display device can be manufactured with a high yield.

Embodiment Mode 10

Figure 24:
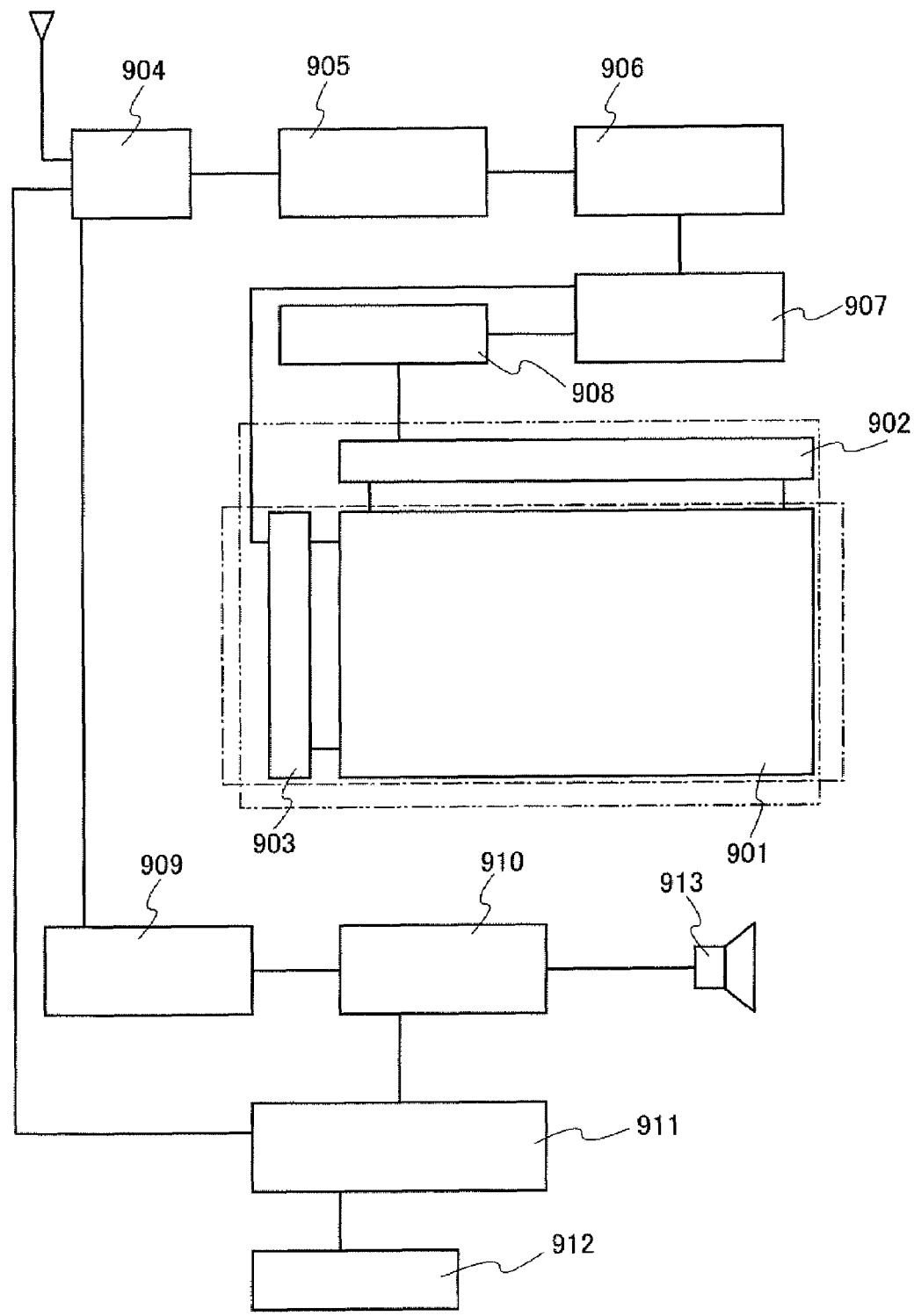
FIG. 24 is a block diagram illustrating a main structure of an electronic appliance to which the present invention is applied.

A television device can be completed using a display device formed according to the present invention. FIG. 24 is a block diagram showing a main structure of such a television device. A display panel can employ any one of the following structure: a structure shown in FIG. 22A in which only a pixel portion 901 is formed and a scanning line side driver circuit 903 and a signal line side driver circuit 902 are mounted by a TAB method shown in FIG. 23B or by a COG method shown in FIG. 23A; a structure shown in FIG. 22B in which a TFT is formed, and a pixel portion 901 and a scanning line side driver circuit 903 are formed over a substrate, and the signal line side driver circuit 902 is separately mounted as a driver IC; and a structure shown in FIG. 22C in which a pixel portion 901, the signal line side driver circuit 902, and the scanning line side driver circuit 903 are formed to be integrated over the substrate.

As another structure of an external circuit, a video signal amplifier circuit 905 which amplifies a video signal included in signals received by a tuner 904, a video signal processing circuit 906 which converts the signals outputted from the video signal amplifier circuit 905 into chrominance signals corresponding to colors of red, green, and blue, a control circuit 907 which converts the video signal into an input specification for a driver IC, and the like are provided on an input side of the image signal. The control circuit 907 outputs signals to both a scanning line side and a signal line side. In the case of digital driving, a structure may be employed in which a signal line dividing circuit 908 may be provided on the signal line side and an input digital signal may be divided into m pieces to be supplied.

An audio signal in signals received by the tuner 904 is transmitted to an audio signal amplifier circuit 909 and an output therefrom is supplied to a speaker 913 through an audio signal processing circuit 910. A controlling circuit 911 receives control information such as a receiving station (reception frequency) or sound volume from an input portion 912 and transmits signals to the tuner 904 or the audio signal processing circuit 910.

Figure 25A:
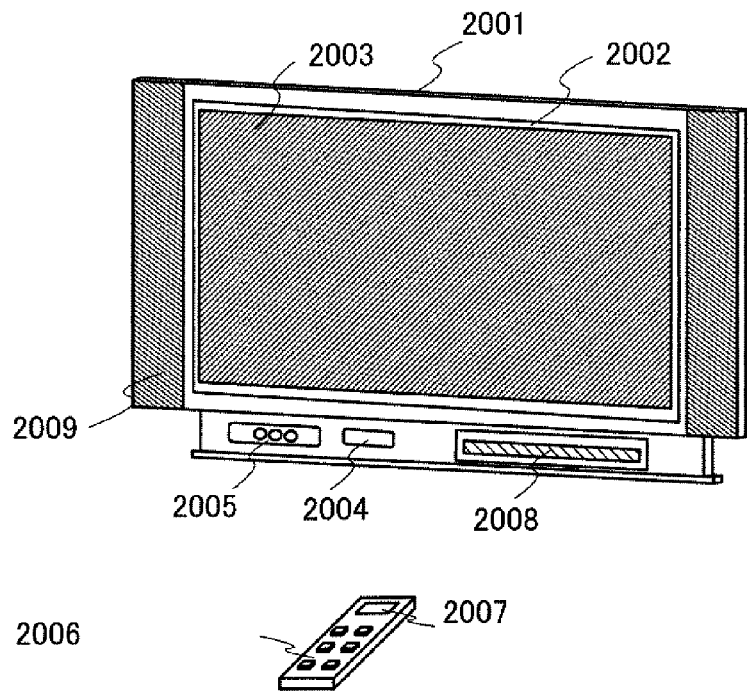
FIGS. 25A and 25B are views each illustrating an electronic appliance to which the present invention is applied.
Figure 25B:
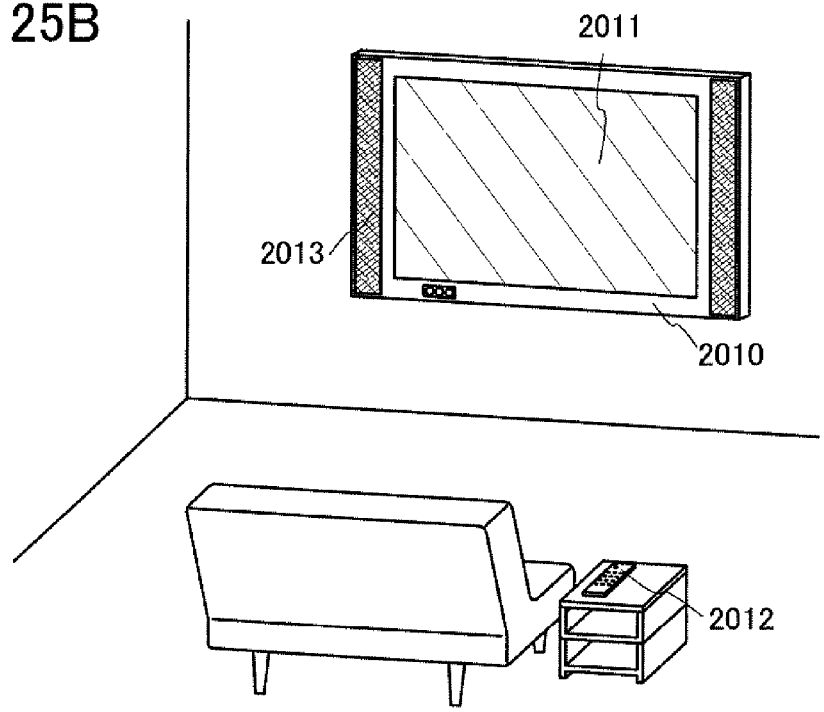

A television device can be completed by incorporating the liquid crystal display panel module or the EL display module as shown in FIGS. 25A and 25B. When an EL display module as shown in FIG. 10 is used, an EL television device can be completed. When a liquid crystal display module as shown in FIG. 20A or 20B is used, a liquid crystal television device can be completed. A main screen 2003 is formed using a display module and accessories, such as a speaker portion 2009 or an operation switch are provided. In this manner, a television device can be completed according to the present invention.

A display panel 2002 is incorporated in a chassis 2001. The television device can receive general TV broadcast by a receiver 2005 and further can be connected to a wired or wireless communication network via a modem 2004 so that one-way (from a sender to a receiver) or two-way (between a sender and a receiver or between receivers) information communication can be carried out. The television device can be operated by a switch of the chassis or a separate remote control unit 2006, which may have a display portion 2007 for displaying information to be outputted.

The television device may include a sub screen 2008 formed using a second display panel for displaying channels, sound volume, and the like, in addition to the main screen 2003. In this structure the main screen 2003 may be formed using an EL display panel superior in viewing angle, and the sub screen may be formed using a liquid crystal display panel which can display an image with low power consumption. Alternatively, a structure in which the main screen 2003 is formed of a liquid crystal display panel, the sub screen is formed of an EL display panel, and the sub screen can blink may be employed, when reduction in power consumption is prioritized. According to the present invention, a highly-reliable display device can be manufactured even if a large substrate and a number of TFTs and electronic parts are used.

FIG. 25B shows a television device having a large display portion of, for example, 20 to 80 inches. The television device includes a chassis 2010, a display portion 2011, a remote control unit 2012, which is an operation portion, a speaker portion 2013, and the like. The present invention is applied to manufacturing of the display portion 2011. The television device shown in FIG. 25B is a wall-hanging type, and does not require a wide space.

Needles to say, the present invention is not limited to a television device. The present invention can be applied to various applications, such as a monitor of a personal computer, and particularly, a large display media typified by an information board at train stations, airports, or the like, and an advertising display screen on the street.

Embodiment Mode 11

As electronic appliances relating to the present invention, a television device (also simply referred to as a television or a television receiver), a camera such as a digital camera and a digital video camera, a mobile phone device (also simply referred to as a mobile telephone or a mobile phone), a portable information terminal such as a PDA, a portable game machine, a monitor for a computer, a computer, an audio player device such as a car audio set, an image player provided with a recording medium such as a home game machine, and the like can be given. Specific examples are described with reference to FIG. 26A to 26E.

Figure 26A:
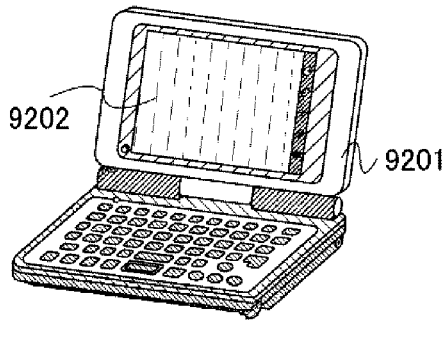
FIGS. 26A to 26E are views each illustrating an electronic appliance to which the present invention is applied.

A portable information terminal shown in FIG. 26A includes a main body 9201, a display portion 9202, and the like. The display device of the present invention can be applied to the display portion 9202. Thus, a highly-reliable information terminal can be provided at low cost.

Figure 26B:
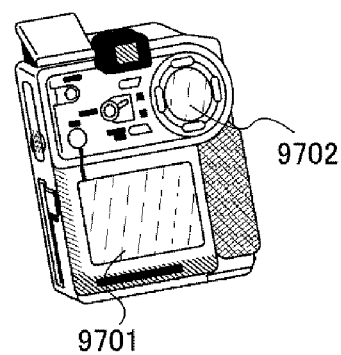

A digital video camera shown in FIG. 26B includes a display portion 9701, a display portion 9702, and the like. The display device of the present invention can be applied to the display portion 9701. Thus, a highly-reliable digital video camera can be provided at low cost.

Figure 26C:
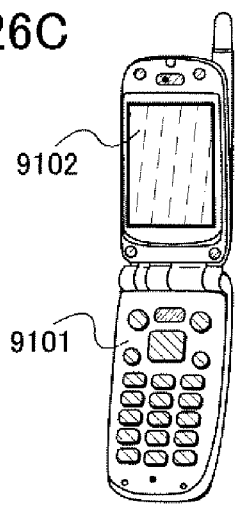

A mobile phone shown in FIG. 26C includes a main body 9101, a display portion 9102, and the like. The display device of the present invention can be applied to the display portion 9102. Thus, a highly-reliable mobile phone can be provided at low cost.

Figure 26D:
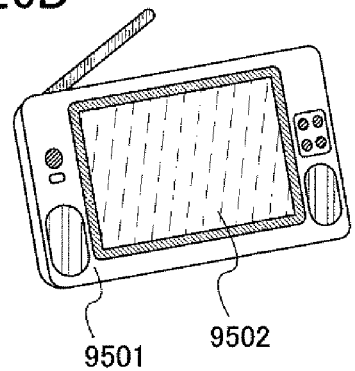

A portable television device shown in FIG. 26D includes a main body 9501, a display portion 9502, and the like. The display device of the present invention can be applied to the display portion 9502. Thus, a highly-reliable portable television device can be provided at low cost. In addition, a display device of the present invention can be widely applied, as a television device, to a small television device mounted on a portable terminal such as a mobile phone, a medium one which can be carried, and a large one (for example, 40 inches or more).

Figure 26E:
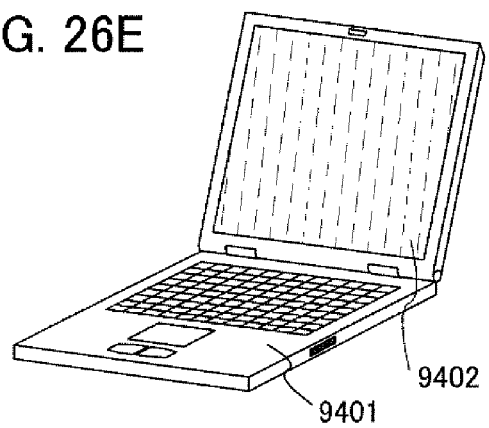

A portable computer shown in FIG. 26E includes a main body 9401, a display portion 9402, and the like. The display device of the present invention can be applied to the display portion 9402. Thus, a highly-reliable portable computer can be provided at low cost.

As described above, with a display device of the present invention, a highly-reliable electronic appliance can be provided at low cost.

Embodiment Mode 12

Figure 28A:
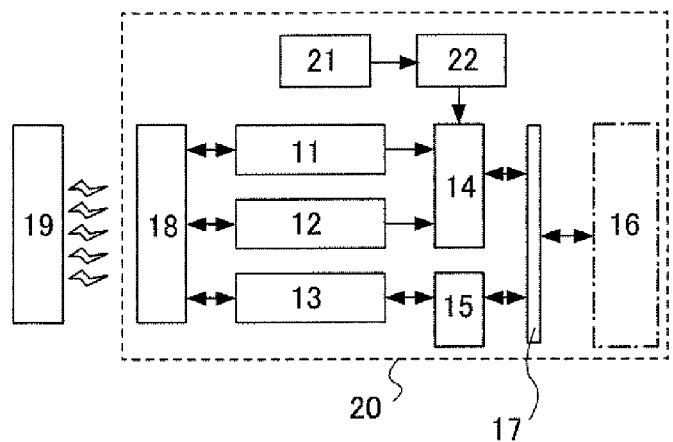
FIGS. 28A and 28B are views illustrating a main structure of an electronic appliance to which the present invention is applied.
Figure 28B:
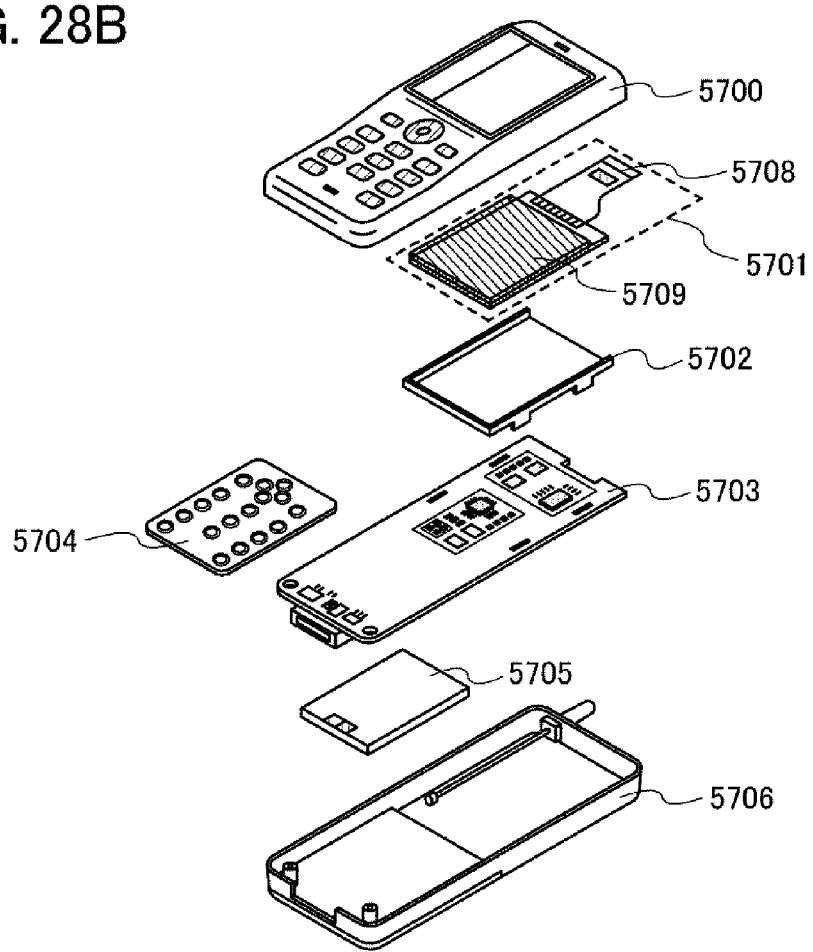

A structure of a semiconductor device of this embodiment mode is described with reference to FIGS. 28A and 28B. As shown in FIGS. 28A and 28B, a semiconductor device 20 of the present invention has a function of communicating data without contact. The semiconductor device 20 includes a power supply circuit 11, a clock generation circuit 12, a data modulation/demodulation circuit 13, a controlling circuit 14 for controlling another circuit, an interface circuit 15, a memory circuit 16, a data bus 17, and an antenna (an antenna coil) 18, a sensor 21, and a sensor circuit 22.

The power supply circuit 11 is a circuit which generates various power supplies to be supplied to the respective circuits in the semiconductor device 20, based on an alternating signal inputted from the antenna 18. The clock generating circuit 12 is a circuit generating various clock signals which are supplied to circuits in the semiconductor device 20, based on an alternating signal inputted from the antenna 18. The data modulation/demodulation circuit 13 has a function of demodulating/modulating data which is exchanged with a reader/writer 19. The controlling circuit 14 has a function of controlling the memory circuit 16. The antenna 18 has a function of sending/receiving an electromagnetic field or a radio wave. The reader/writer 19 has a function of communicating with the semiconductor device, controlling the semiconductor device, and processing data thereof. Note that the structure of the semiconductor device is not limited to the foregoing structure and may have an additional element such as a limiter circuit of a power source voltage or a hardware for processing a code.

The memory circuit 16 includes a memory element in which an organic compound layer or a phase-change layer is sandwiched between a pair of conductive layers. Note that the memory circuit 16 may include only the memory element in which an organic compound layer or a phase-change layer is sandwiched between a pair of conductive layers, or additionally include a memory circuit having another structure. The memory circuit having another structure corresponds to, for example, one or a plurality of the following: a DRAM, an SRAM, an FeRAM, a mask ROM, a PROM, an EPROM, an EEPROM, and a flash memory.

The sensor 21 includes a semiconductor element, such as a resistor element, a capacitive coupling element, an inductive coupling element, a photovoltaic element, a photoelectric conversion element, a thermo-electromotive force element, a transistor, a thermistor, or a diode. The sensor circuit 22 detects change of impedance, reactance, inductance, voltage, or current and analog/digital converts them (A/D conversion), then, outputs a signal to the controlling circuit 14.

Next, one mode of an electronic appliance to which the semiconductor device of the present invention is mounted is described with reference to a drawing. The electronic appliance exemplified here is a mobile phone which includes chassis 5700 and 5706, a panel 5701, a housing 5702, a printed-wiring board 5703, an operation button 5704, and a battery 5705 (see FIG. 28B). The panel 5701 is detachably incorporated in the housing 5702 and the housing 5702 is fitted into the printed-wiring board 5703. The shape and size of the housing 5702 is changed appropriately in accordance with the electronic appliance into which the panel 5701 is incorporated. On the printed-wiring board 5703, a plurality of packaged semiconductor devices are mounted, and the semiconductor device of the present invention can be used as one of the packaged semiconductor devices. The plurality of semiconductor devices mounted on the printed-wiring board 5703 have any function selected from a controller, a central processing unit (CPU), a memory, a power supply circuit, an audio processing circuit, a sending/receiving circuit, and the like.

The panel 5701 is connected to the printed-wiring board 5703 via a connection film 5708. The panel 5701, the housing 5702, and the printed-wiring board 5703 are stored together with the operation buttons 5704 and the battery 5705, inside the chassis 5700 and 5706. A pixel region 5709 in the panel 5701 is provided so as to be viewed through a window provided in the chassis 5700.

As described above, a semiconductor device of the present invention has characteristics of being small and thin in size, and light-weight, which makes it possible to efficiently use the limited space inside the chassis 5700 and 5706 of the electronic appliance.

Note that the chassis 5700 and 5706 show an example of an external appearance shape of a mobile phone, and an electronic appliance relating to this embodiment mode can be modified variously in accordance with its function and intended purpose.

Embodiment Mode 13

According to the present invention, a semiconductor device serving as a chip having a processor circuit (hereinafter also referred to as a processor chip, a wireless chip, a wireless processor, a wireless memory, or a wireless tag) can be formed. The application range of the semiconductor device of the present invention is wide. For example, the semiconductor device of the present invention can be used by being mounted on bills, coins, securities, certificates, bearer bonds, packing containers, documents, recording media, personal belongings, vehicles, food, clothing, health products, commodities, medicine, electronic appliances, or the like.

Figure 29A:
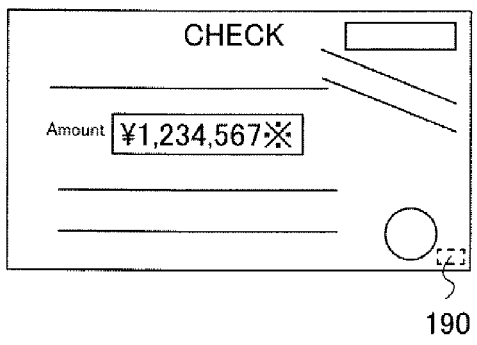
FIGS. 29A to 29G are views each illustrating a semiconductor device to which the present invention is applied.
Figure 29B:
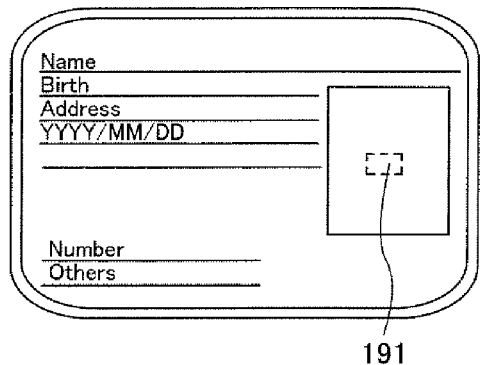
Figure 29C:
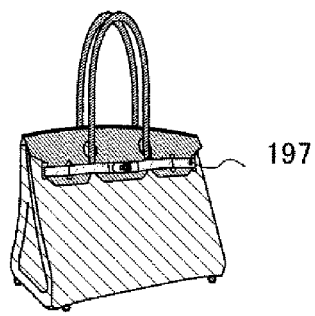
Figure 29D:
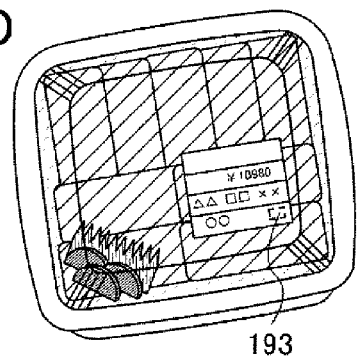
Figure 29E:
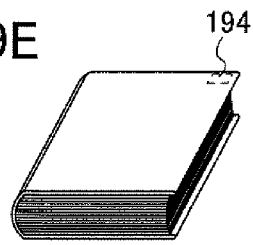
Figure 29F:
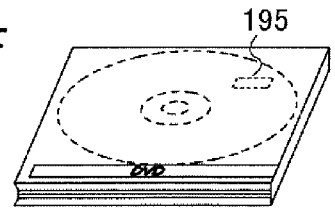
Figure 29G:
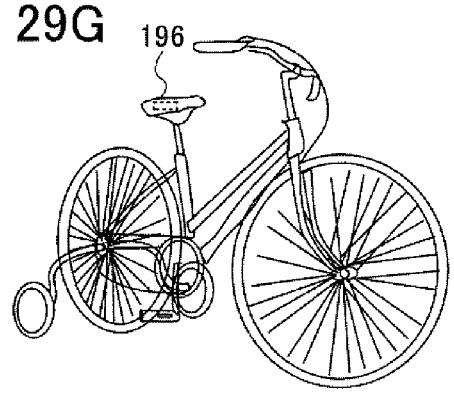

Paper money and coins are money circulating in the market and include ones valid in a certain area similarly to currency (cash vouchers), commemorative coins, and the like. Securities refer to checks, certificates, promissory notes, and the like, and can be provided with a chip 190 having a processor circuit (FIG. 29A). Certificates refer to driver's licenses, certificates of residence, and the like, and can be provided with a chip 191 having a processor circuit (FIG. 29B). Personal belongings refer to bags, glasses, and the like, and can be provided with a chip 197 having a processor circuit (FIG. 29C). Bearer bonds refer to stamps, rice coupons, various gift certificates, and the like. Packing containers refer to wrapping paper for box lunches and the like, plastic bottles, and the like, and can be provided with a chip 193 having a processor circuit (FIG. 29D). Documents refer to books and the like, and can be provided with a chip 194 having a processor circuit (FIG. 29E). Recording media refer to DVD software, video tapes, and the like, and can be provided with a chip 195 having a processor circuit (FIG. 29F). Vehicles refer to wheeled vehicles such as bicycles, ships, and the like, and can be provided with a chip 196 having a processor circuit (FIG. 29G). Food refers to food articles, drink, and the like. Clothing refers to clothes, footwear, and the like. Health products refer to medical instruments, health instruments, and the like. Commodities refer to furniture, lighting equipment, and the like. Medicine refers to medical products, pesticides, and the like. Electronic appliances refer to liquid crystal display devices, EL display devices, television devices (TV sets or thin TV sets), mobile phones, and the like.

Forgery can be prevented by providing a chip having a processor circuit in bills, coins, securities, certificates, bearer bonds, or the like. The efficiency of an inspection system or a system used in a rental shop can be improved by providing a chip having a processor circuit in packing containers, books, recording media, personal belonging, food, commodities, electronic devices, or the like. By providing a chip having a processor circuit in vehicles, health products, medicine, or the like, forgery or theft can be prevented; further, medicine can be prevented from being taken mistakenly. The chip having a processor circuit is provided in an article by being attached to the surface or being embedded therein. For example, in the case of a book, the chip having a processor circuit may be embedded in a piece of paper; in the case of a package made from an organic resin, the chip having a processor circuit may be embedded in the organic resin.

When the chip having a processor circuit formed according to the present invention is applied to a management system or a distribution system of articles, the system can be sophisticated. For example, information that is recorded in a chip having a processor circuit provided in a tag is read by a reader/writer provided beside a conveyor belt, information about a distribution process or a delivery destination is read out, and inspection of merchandise or distribution of goods can be easily performed.

Figure 27:
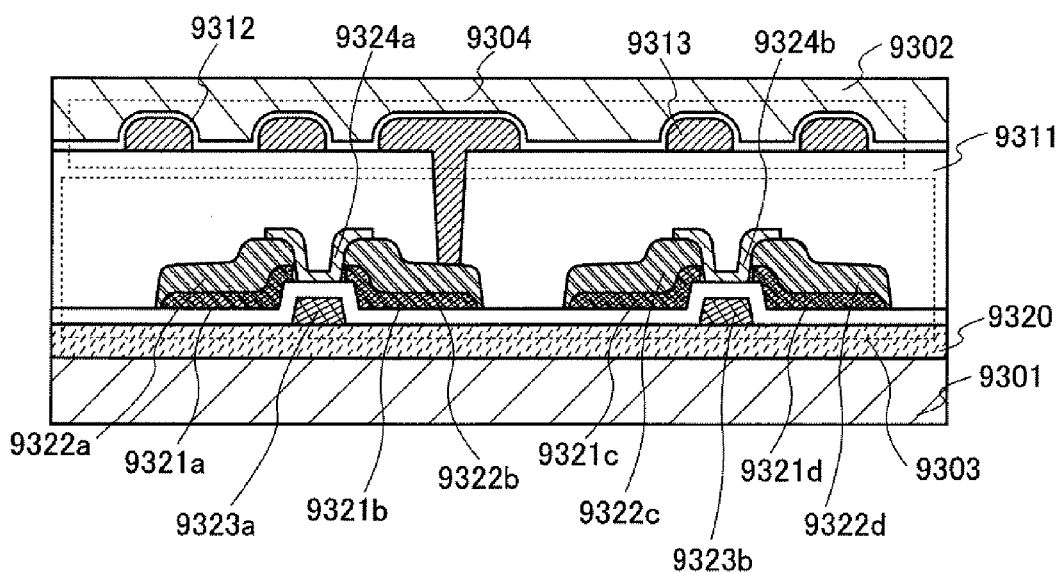
FIG. 27 is a view illustrating a semiconductor device to which the present invention is applied.

A structure of a chip having a processor circuit which can be formed through a simplified process at low cost according to the present invention is described with reference to FIG. 27. The chip having a processor circuit is formed using a thin film integrated circuit 9303 and an antenna 9304 connected thereto. The thin film integrated circuit 9303 and the antenna 9304 are sandwiched between cover materials 9301 and 9302. The thin film integrated circuit 9303 may be attached to the cover material 9301 using an adhesive. In FIG. 27, one side of the thin film integrated circuit 9303 is attached to the cover material 9301 with an adhesive 9320 therebetween.

The thin film integrated circuit 9303 is peeled through a peeling step and provided on the cover material. A thin film transistor in this embodiment mode is an inverted coplanar thin film transistor. In this embodiment mode, source electrode layers and drain electrode layers 9322a, 9322b, 9322c, and 9322d of transistors are formed in a self-aligned manner by forming organic polymer layers 9321a, 9321b, 9321c, and 9321d and performing liquid-repellent treatment. In addition, the organic polymer layer is formed by selectively polymerizing an organic layer containing a photopolymerizable reactive group by rear light-exposure. Difference in adsorption property for a liquid repellent between a gate insulating layer containing an inorganic material and an organic polymer layer are utilized to make wettability of the gate insulating layer and that of the organic polymer layer be different from each other. When a composition containing a conductive material is discharged in regions with thus controlled wettability, a wiring layer can be formed only over the organic polymer layer. In this manner, a thin film transistor can be manufactured in a self-aligned manner. Therefore, according to the present invention, a display device and the like can be manufactured at low cost and with high productivity. A semiconductor element used in the thin film integrated circuit 9303 is not limited to the foregoing-described element, and for example, a memory element, a diode, a photoelectric conversion element, a resistor element, a coil, a capacitor element, an inductor, or the like can be used as well as the TFT.

As shown in FIG. 27, an interlayer insulating film 9311 is formed over the TFT of the thin film integrated circuit 9303, and an antenna 9304 connected to the TFT through the interlayer insulating film 9311 is formed. Further, a barrier film 9312 of a silicon nitride film or the like is formed over the interlayer insulating film 9311 and the antenna 9304.

The antenna 9304 is formed by discharging a droplet containing a conductor, such as gold, silver, or copper by a droplet discharging method, and drying and baking the droplet. By forming the antenna by a droplet discharging method, the number of steps can be reduced, and accordingly, cost can also be reduced.

For the cover materials 9301 and 9302, it is preferable to use, for example, a film (made of polypropylene, polyester, vinyl, polyvinyl fluoride, vinyl chloride, or the like), paper made from a fibrous material, or a base material film (polyester, polyamide, an inorganic evaporation film, paper, or the like), and an adhesive synthetic resin film (an acrylic-based synthetic resin, an epoxy-based synthetic resin, or the like). The film and an object to be treated are treated to be attached to each other by thermocompression. An adhesion layer or a layer (not the adhesion layer) provided in the outmost surface of the film is melted by heat treatment and attached by pressure.

By using an incinerable pollution-free material such as paper, a fiber, carbon graphite, or the like for the cover material, a used chip having a processor circuit can be incinerated or cut. The chip having a processor circuit using the foregoing material is pollution-free because it does not generate a poisonous gas even when incinerated.

In FIG. 27, the chip having a processor circuit is provided over the cover material 9301 with the adhesive 9320 therebetween; however, the chip having a processor circuit may be attached to an article instead of to the cover material 9301.

Embodiment 1

In this embodiment, an example in which a thin film transistor is manufactured according to the present invention is described.

First, a molybdenum film was formed over a substrate as a gate electrode layer by a sputtering method. Then, a stacked layer including a mixed resin film of a novolac resin and a melamine resin and a siloxane resin film was formed over the molybdenum film as a gate insulating layer by a spin coating method.

Next, an organic layer containing a photopolymerizable reactive group was formed over the gate insulating layer. In this embodiment, a solution in which polyvinylcinnamate was dissolved in dimethylformamide was discharged by a droplet discharging method to form the organic layer containing a photopolymerizable reactive group.

Light irradiation (a wavelength of 300 to 350 nm) was carried out from a rear surface of the substrate, so that the organic layer containing a photopolymerizable reactive group was selectively exposed to light and photocross-linked. The organic layer containing a photopolymerizable reactive group was immersed in dimethylformamide used as an organic solvent to selectively remove a region other than a light irradiation region in the organic layer containing a photopolymerizable reactive group, and then, an organic polymer layer was formed.

An organosilane film having a hydrolytic group was formed over the organic polymer layer and the gate insulating layer. In this embodiment, HMDS was used as organosilane having a hydrolytic group with a liquid-repellent property. HMDS has a liquid-repellent property (low wettability) against a liquid composition containing silver as a conductive material for forming source and drain electrode layers. Organosilane having a hydrolytic group was formed over the gate insulating layer more densely than over the organic polymer layer; therefore, the surface of the gate insulating layer had low wettability with respect to a material for forming the source and drain electrode layers than the surface of the organic polymer layer.

The composition containing a conductive material was discharged over the gate insulating layer and the organic polymer layer, of which surfaces had wettability controlled as described above. The liquid composition remained over the organic polymer layer with high wettability. The source electrode layer and the drain electrode layer were formed over the organic polymer layer by drying and baking.

The organosilane having a hydrolytic group (HMDS) used in liquid-repellent treatment was removed. Octadecyltrimethoxysilane was formed as organosilane having a hydrolytic group, then, an organic semiconductor layer was formed as a semiconductor layer. In this embodiment, the organic semiconductor layer was formed using pentacene by a vapor deposition method. In this manner, a thin film transistor was formed in a self-aligned manner.

Figure 31B:
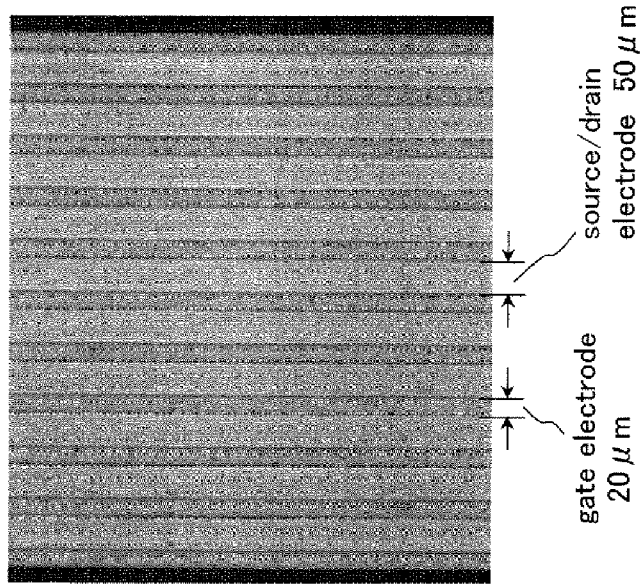
FIGS. 31A and 31B are views illustrating an experimental data of Embodiment 1.
Figure 31A:
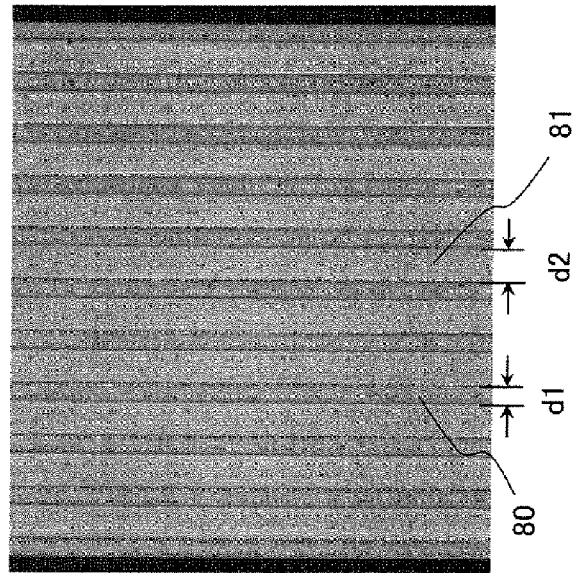

FIGS. 31A and 31B show optical micrographs of the gate electrode layer and the source electrode layer or drain electrode layer, which were formed. In FIGS. 31A and 31B, a gate conductive layer 80 and a source or drain electrode layer 81 are formed over a substrate. In FIGS. 31A and 31B, the source or drain electrode layer 81 is formed into a shape which is the same as a pattern of the selectively formed organic polymer layer. Accordingly, the source or drain electrode layer 81 is formed selectively in a self-aligned manner and little part thereof overlaps with the gate conductive layer 80 with the gate insulating layer therebetween.

Figure 32A:
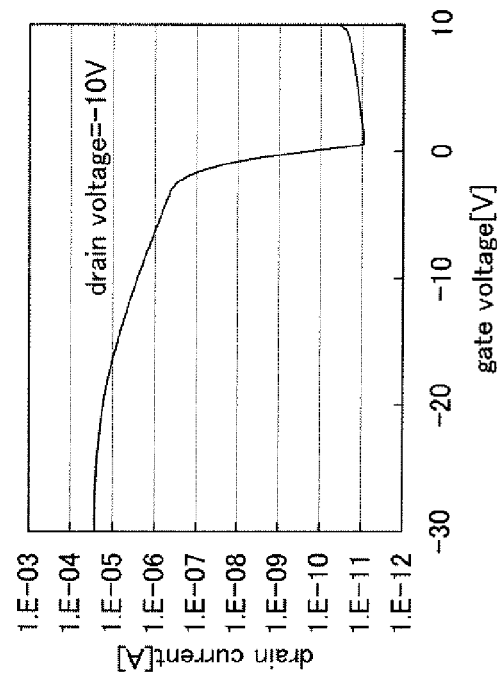
FIGS. 32A and 32B are graphs illustrating an experimental data of Embodiment 1.
Figure 32B:
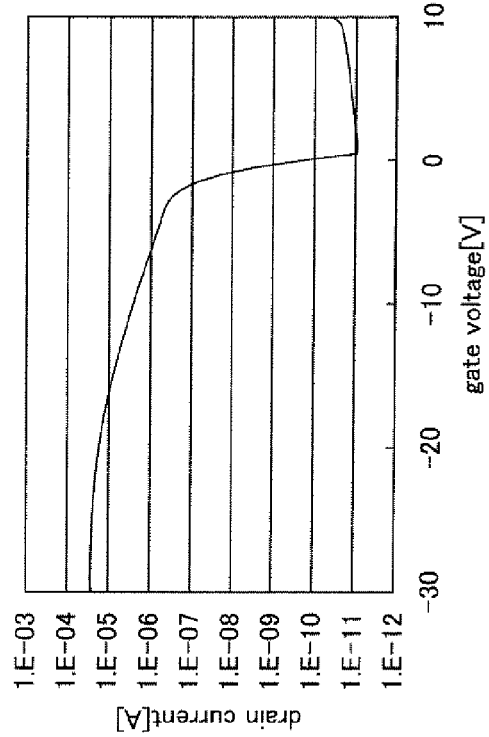

FIGS. 32A and 32B show electrical characteristics of an inverted coplanar thin film transistor which was formed. A gate voltage-drain current characteristic is shown in FIGS. 32A and 32B. According to FIGS. 32A and 32B, it can be confirmed that the thin film transistor manufactured according to the present invention operates and functions as a transistor.

In this embodiment, the organic polymer layer is formed by selectively polymerizing an organic layer containing a photopolymerizable reactive group by rear light-exposure. Difference in adsorption property for a liquid repellent between a gate insulating layer and the organic polymer layer is utilized to make wettability of the gate insulating layer and that of the organic polymer layer be different from each other. When a composition containing a conductive material is discharged in regions with thus controlled wettability, a source electrode layer or a drain electrode layer can be formed only over the organic polymer layer. In this manner, a thin film transistor can be manufactured in a self-aligned manner. Therefore, according to the present invention, a semiconductor device, a display device, and the like can be manufactured at low cost and with high productivity.

This application is based on Japanese Patent Application serial no. 2006-295423 filed in Japan Patent Office on Oct. 31, 2006, the entire contents of which are hereby incorporated by reference.

What is claimed is:

1. A method of manufacturing a semiconductor device comprising the steps of:
    forming a gate electrode layer over a light-transmitting substrate;
    forming a gate insulating layer containing an inorganic material over the gate electrode layer and the substrate;
    forming an organic layer containing a photopolymerizable reactive group over the gate insulating layer;
    polymerizing selectively the organic layer by irradiating the organic layer with light from back side of the substrate, using the gate electrode layer as a mask;
    forming an organic polymer layer by removing a residue of the organic layer, which is other than polymerized;
    forming an organosilane film including a hydrolytic group over the gate insulating layer in a region other than a region in which the organic polymer layer is formed;
    forming a source electrode layer and a drain electrode layer by applying a composition containing a conductive material over the organic polymer layer; and
    forming a semiconductor layer over the gate electrode layer, the source electrode layer, and the drain electrode layer.

2. A method of manufacturing a semiconductor device comprising the steps of:
    forming a gate electrode layer over a light-transmitting substrate;
    forming a gate insulating layer containing an inorganic material over the gate electrode layer and the substrate;
    forming an organic layer containing a photopolymerizable reactive group over the gate insulating layer;
    polymerizing selectively the organic layer by irradiating the organic layer with light from back side of the substrate, using the gate electrode layer as a mask;

forming an organic polymer layer by removing a residue of the organic layer, which is other than polymerized;

forming a first organosilane film including a first hydrolytic group over the gate insulating layer in a region other than a region in which the organic polymer layer is formed;

forming a source electrode layer and a drain electrode layer by applying a composition containing a conductive material over the organic polymer layer;

removing the first organosilane film;

forming a second organosilane film having a second hydrolytic group over the gate electrode layer, the source electrode layer, and the drain electrode layer; and forming a semiconductor layer over the second organosilane film.

3. The method of manufacturing a semiconductor device according to claim 2, wherein the second organosilane film is formed using octadecyltrimethoxysilane.

4. The method of manufacturing a semiconductor device according to claim 1, further comprising forming a display element electrically connected to the source electrode layer or the drain electrode layer.

5. The method of manufacturing a semiconductor device according to claim 2, further comprising forming a display element electrically connected to the source electrode layer or the drain electrode layer.

6. The method of manufacturing a semiconductor device according to claim 1, wherein the semiconductor layer is formed using an organic semiconductor material.

7. The method of manufacturing a semiconductor device according to claim 2, wherein the semiconductor layer is formed using an organic semiconductor material.

* * * * *